(12) United States Patent
Chang et al.

(10) Patent No.: US 11,502,034 B2
(45) Date of Patent: Nov. 15, 2022

(54) SEMICONDUCTOR DEVICES WITH BACKSIDE POWER RAIL AND METHODS OF FABRICATION THEREOF

(71) Applicant: TAIWAN SEMICONDUCTOR MANUFACTURING CO., LTD., Hsinchu (TW)

(72) Inventors: Lo-Heng Chang, Hsinchu (TW); Kuo-Cheng Chiang, Hsinchu County (TW); Zhi-Chang Lin, Hsinchu County (TW); Jung-Hung Chang, Changhua County (TW); Shih-Cheng Chen, New Taipei (TW); Shi-Ning Ju, Hsinchu (TW); Chih-Hao Wang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 64 days.

(21) Appl. No.: 17/027,344

(22) Filed: Sep. 21, 2020

(65) Prior Publication Data

US 2022/0093512 A1 Mar. 24, 2022

(51) Int. Cl.
| | | |
|---|---|---|
| H01L 23/528 | (2006.01) | |
| H01L 29/66 | (2006.01) | |
| H01L 29/78 | (2006.01) | |
| H01L 29/417 | (2006.01) | |
| H01L 21/8234 | (2006.01) | |
| H01L 21/8238 | (2006.01) | |

(52) U.S. Cl.
CPC .. *H01L 23/5286* (2013.01); *H01L 21/823431* (2013.01); *H01L 21/823814* (2013.01); *H01L 21/823871* (2013.01); *H01L 23/5283* (2013.01); *H01L 29/41791* (2013.01); *H01L 29/66545* (2013.01); *H01L 29/66795* (2013.01); *H01L 29/785* (2013.01)

(58) Field of Classification Search
CPC .................... H01L 21/823814; H01L 23/5286
See application file for complete search history.

(56) References Cited

U.S. PATENT DOCUMENTS

| | | | |
|---|---|---|---|
| 9,209,247 B2 | 12/2015 | Colinge et al. | |
| 9,236,267 B2 | 1/2016 | De et al. | |
| 9,412,817 B2 | 8/2016 | Yang et al. | |
| 9,412,828 B2 | 8/2016 | Ching et al. | |
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 9,985,134 B1* | 5/2018 | Lin ...................... | H01L 23/5283 |
| 2021/0035975 A1* | 2/2021 | Kim ...................... | H01L 27/092 |

* cited by examiner

*Primary Examiner* — Farun Lu
(74) *Attorney, Agent, or Firm* — NZ Carr Law Office

(57) ABSTRACT

Corner portions of a semiconductor fin are kept on the device while removing a semiconductor fin prior to forming a backside contact. The corner portions of the semiconductor fin protect source/drain regions from etchant during backside processing. The corner portions allow the source/drain features to be formed with a convex profile on the backside. The convex profile increases volume of the source/drain features, thus, improving device performance. The convex profile also increases processing window of backside contact recess formation.

20 Claims, 64 Drawing Sheets

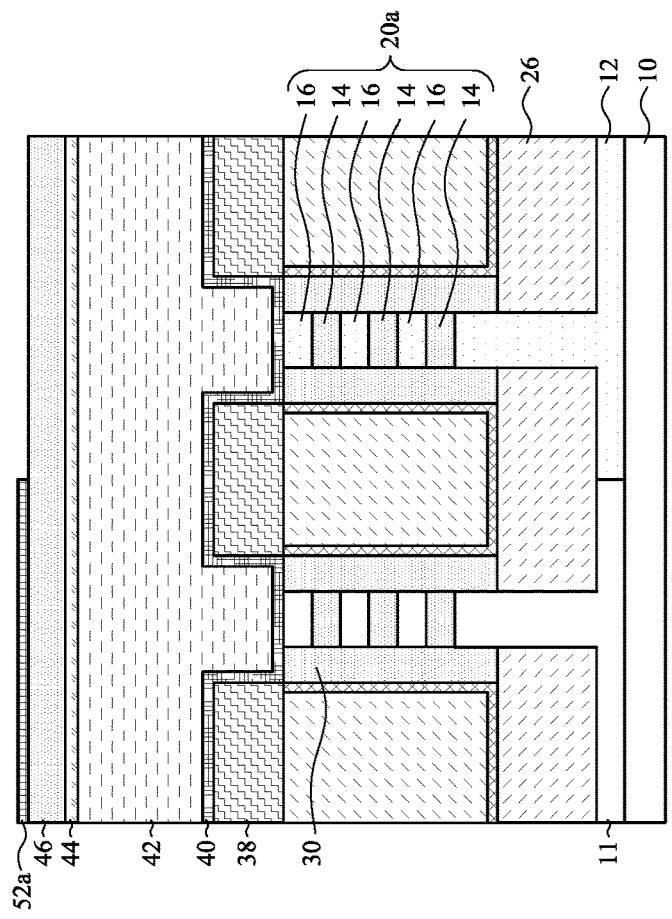
Fig. 12D
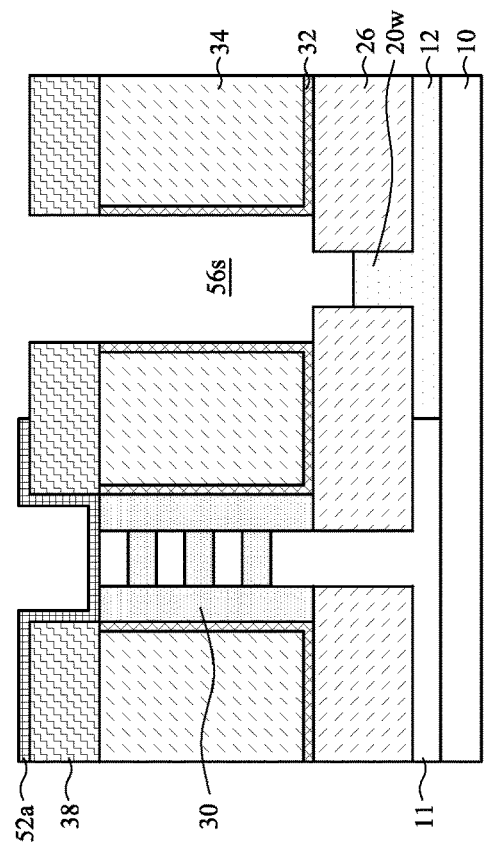
Fig. 12C
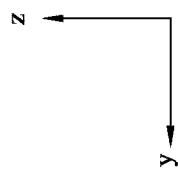

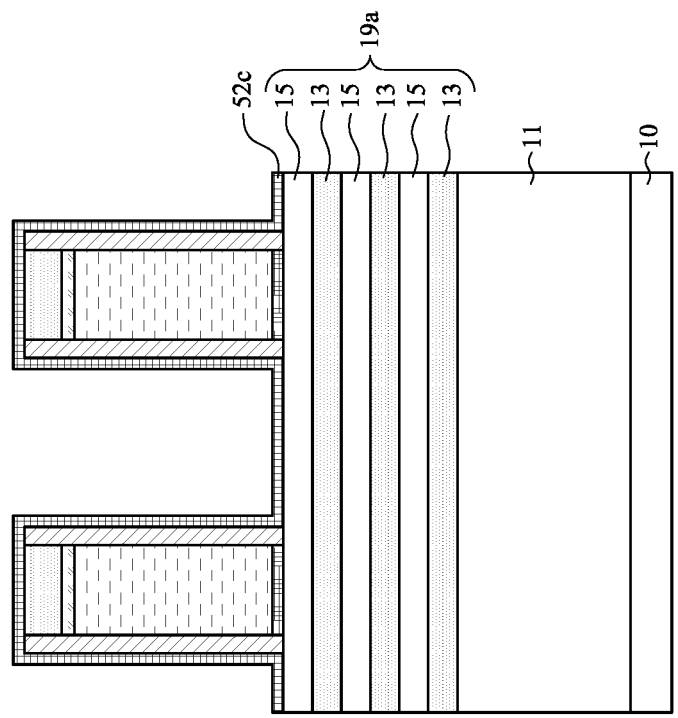
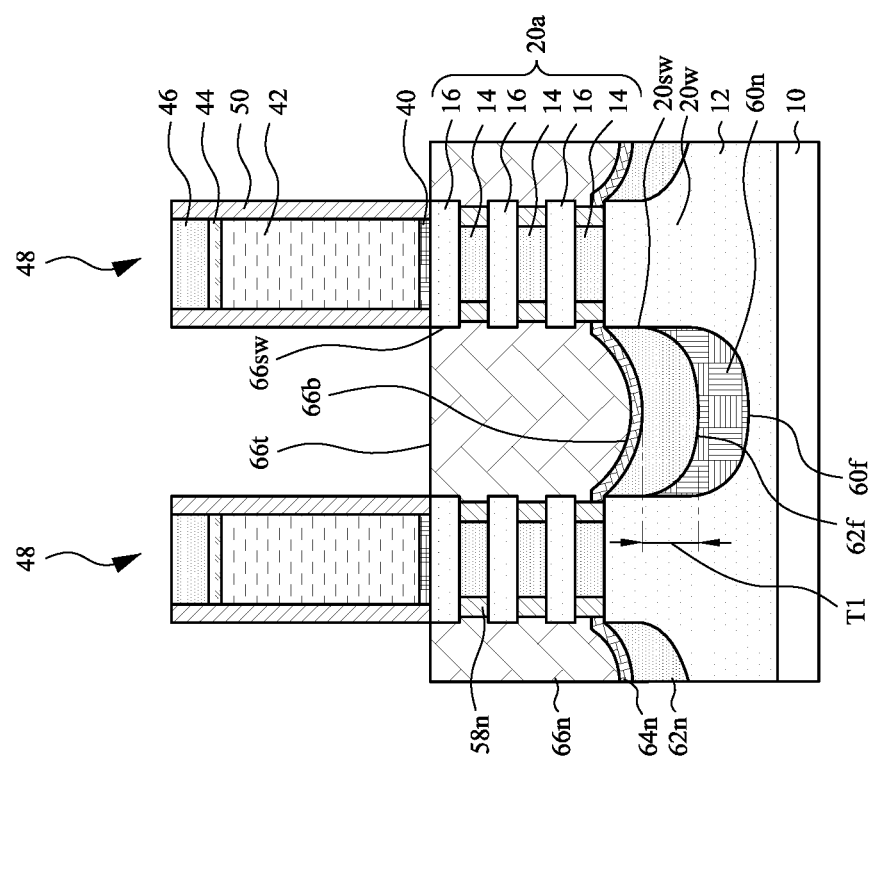
Fig. 15B
Fig. 15A

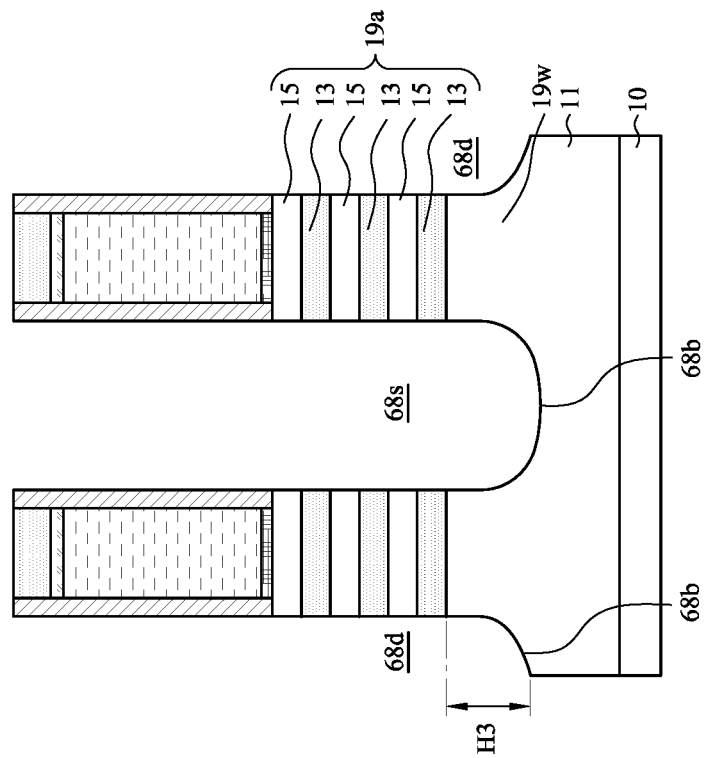
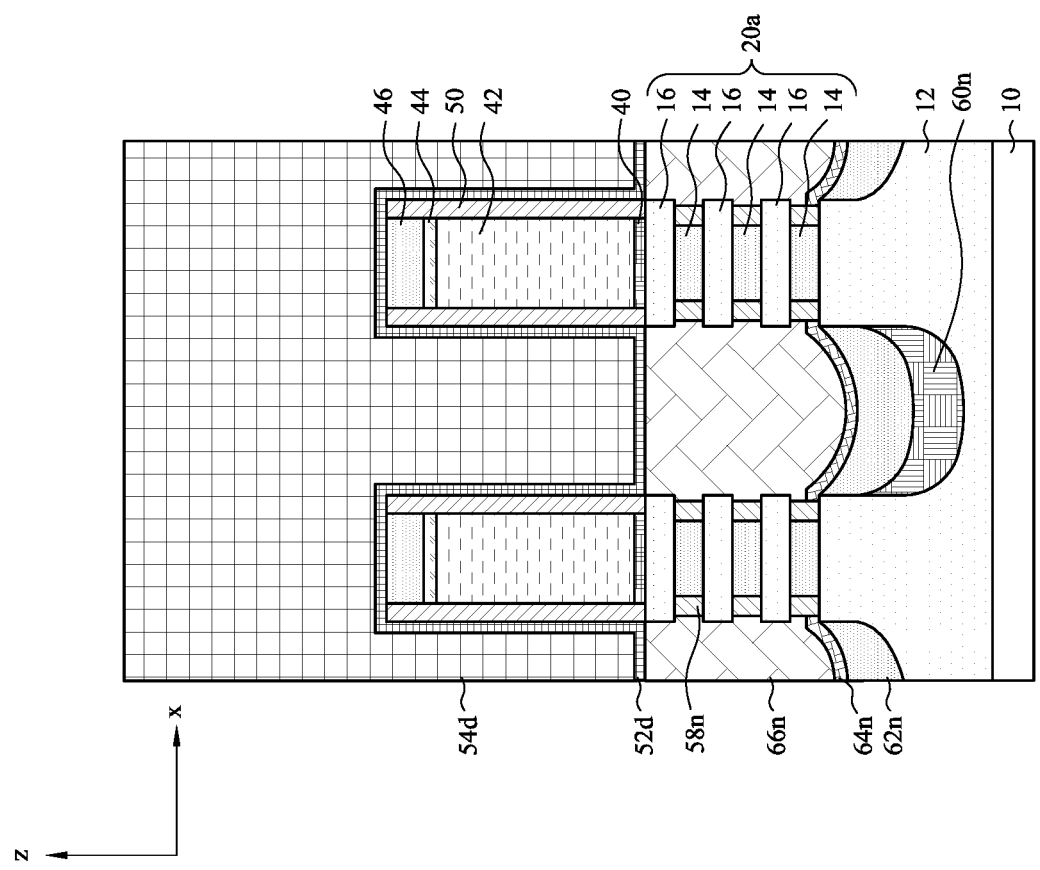
Fig. 16B
Fig. 16A

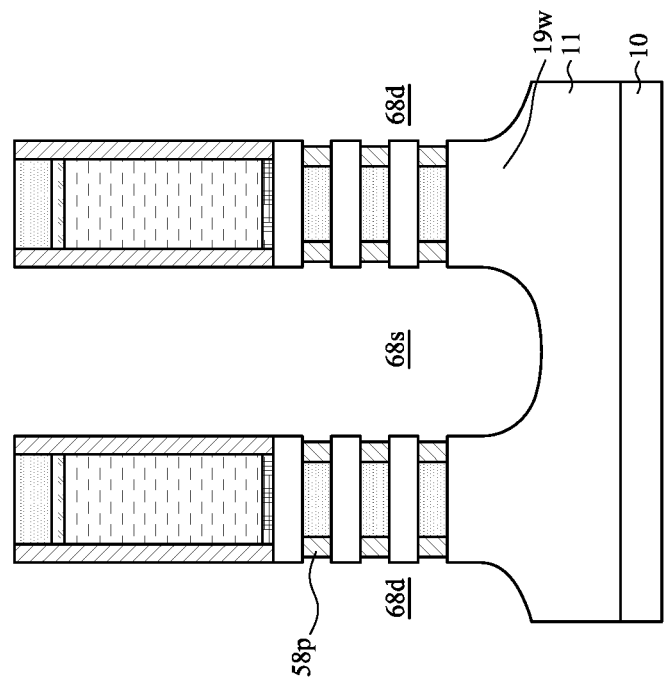
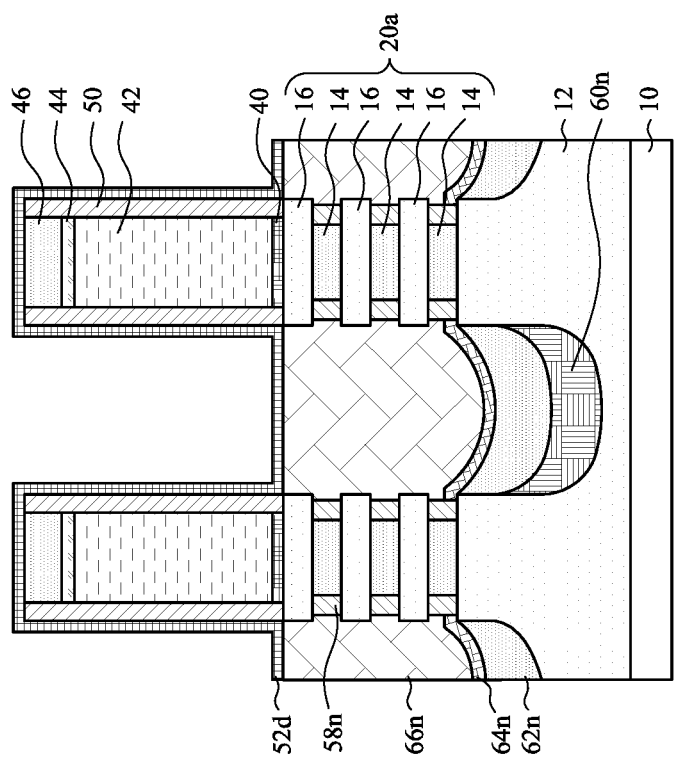
Fig. 17A
Fig. 17B

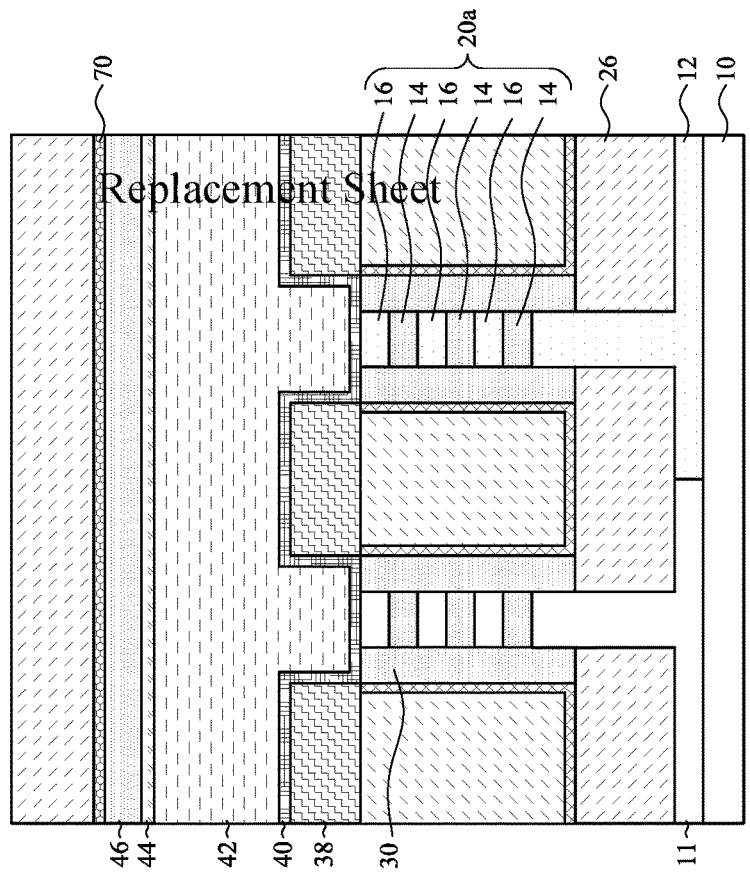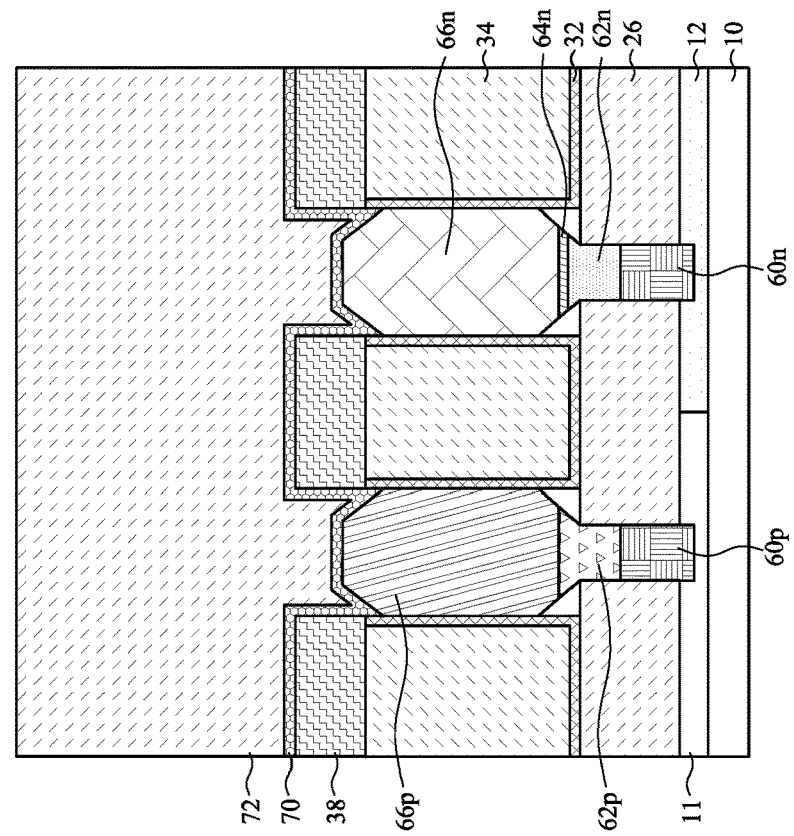
Fig. 21D
Fig. 21C

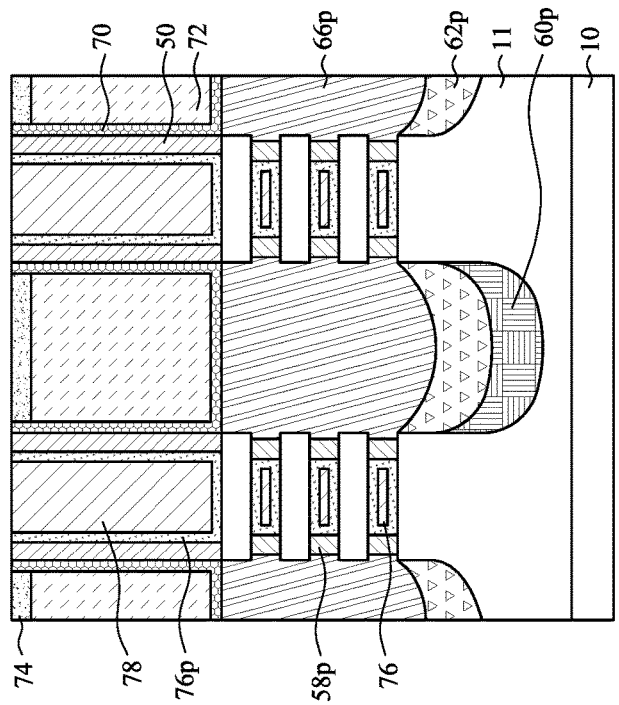
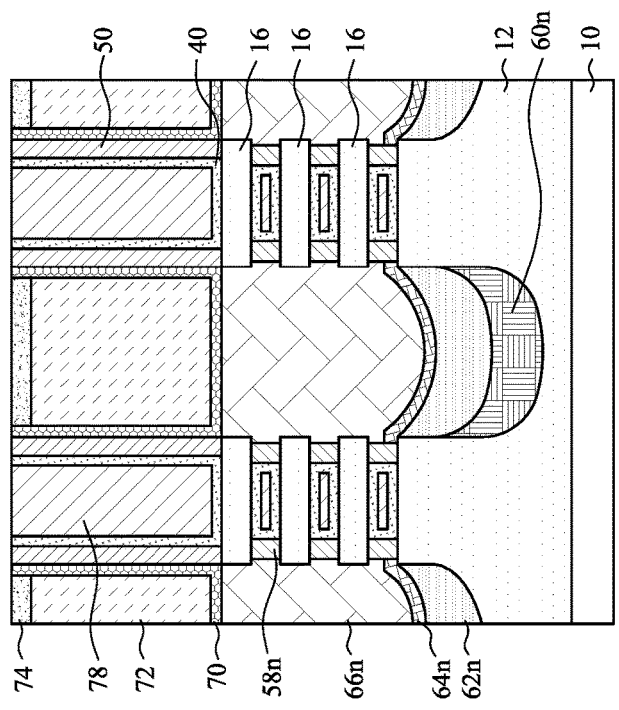
Fig. 24B
Fig. 24A

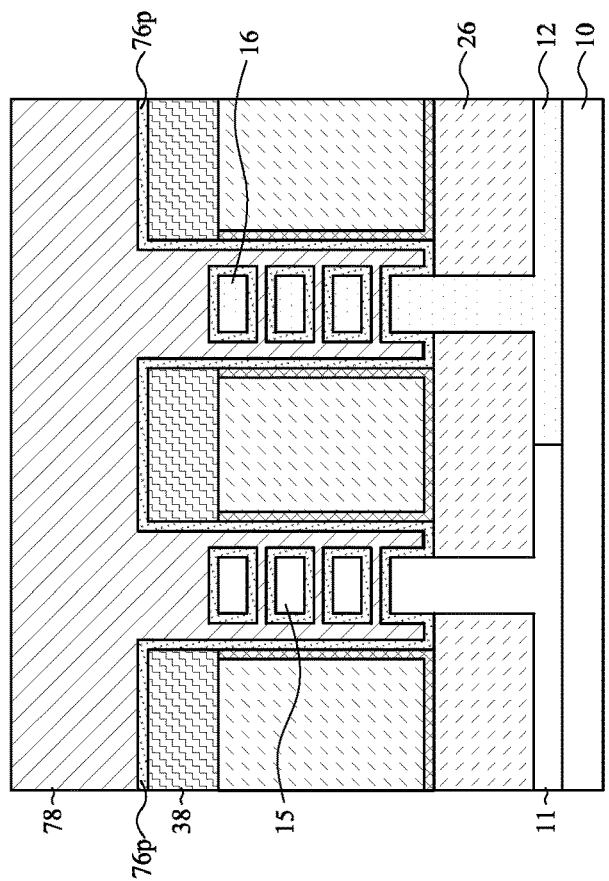
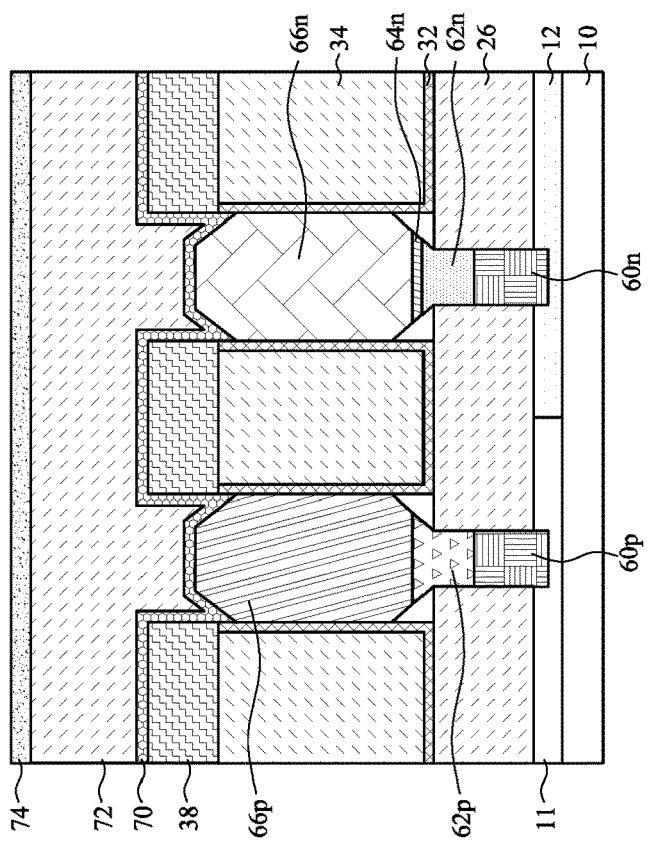
Fig. 24C
Fig. 24D

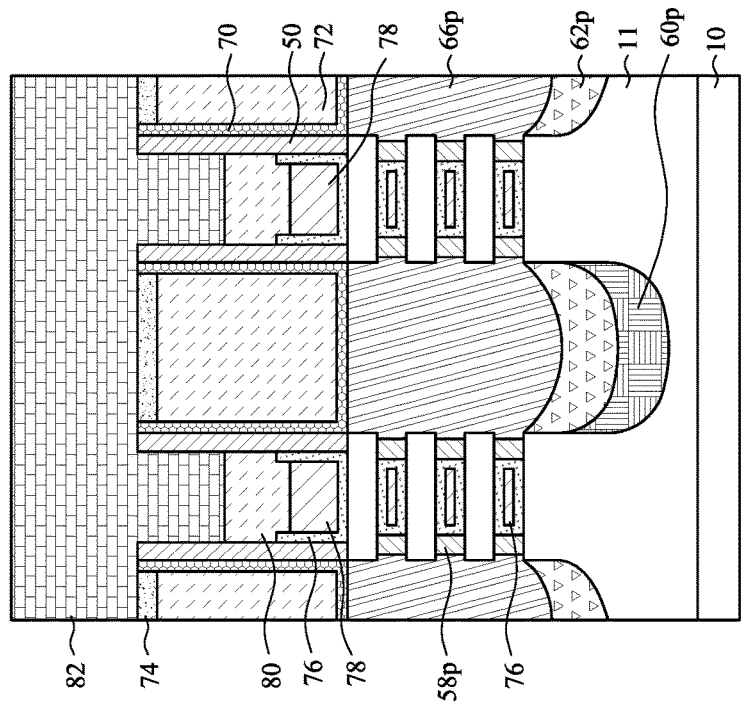
Fig. 25B
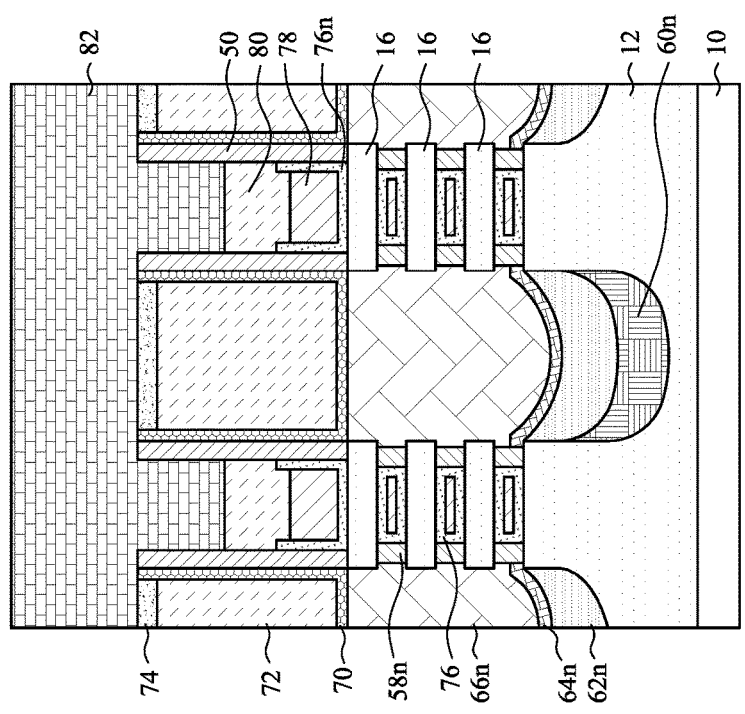
Fig. 25A
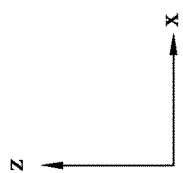

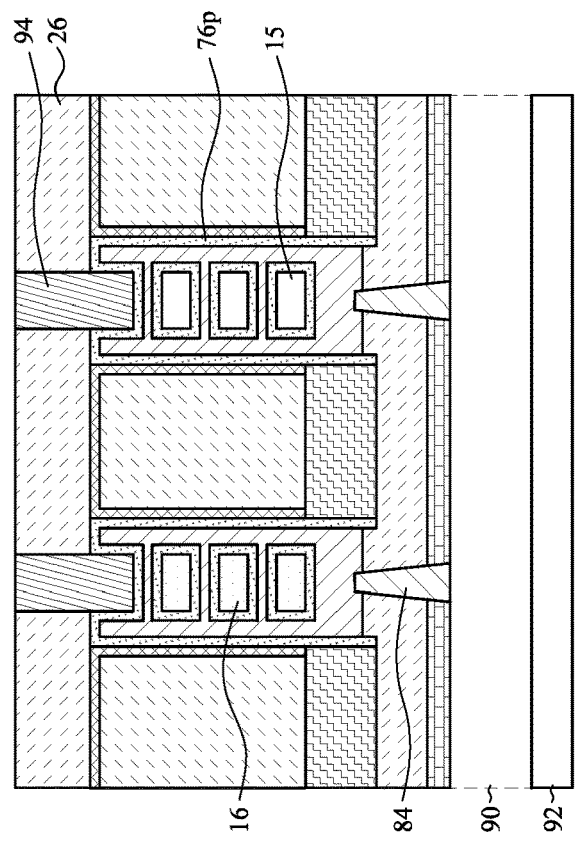
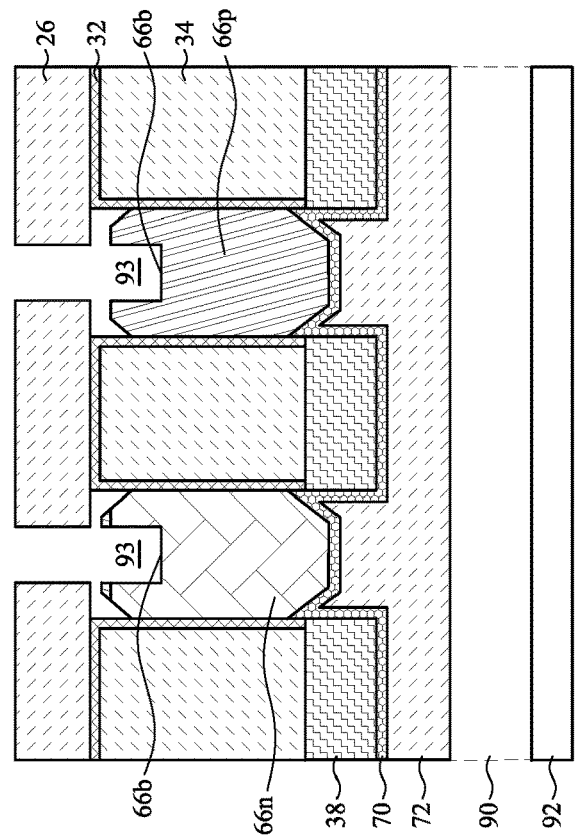
Fig. 33C
Fig. 33D

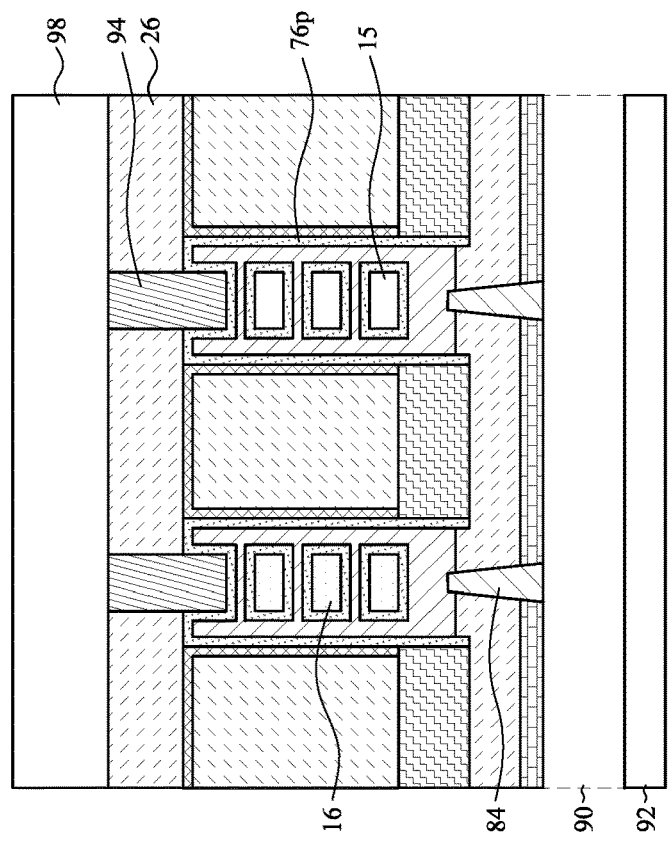
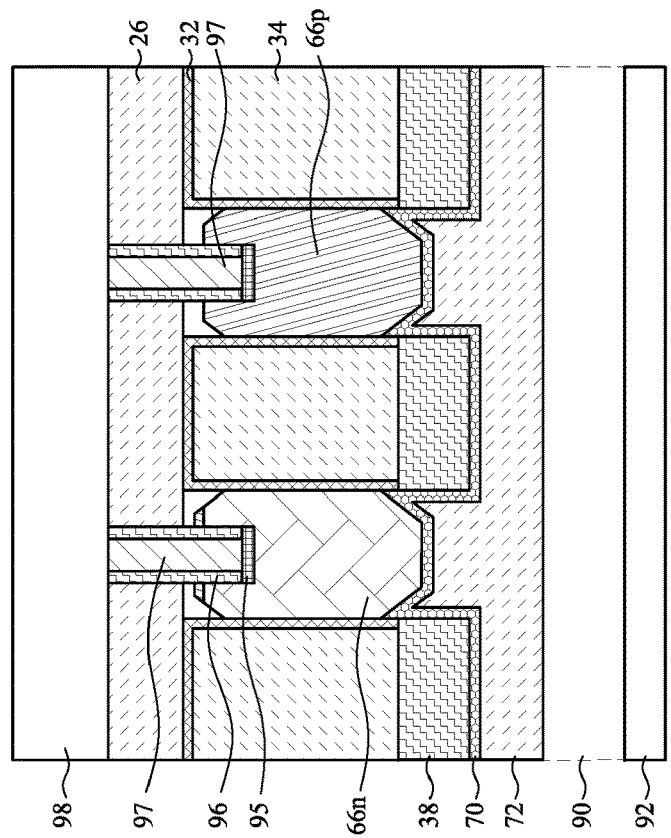
Fig. 34C
Fig. 34D

SEMICONDUCTOR DEVICES WITH BACKSIDE POWER RAIL AND METHODS OF FABRICATION THEREOF

BACKGROUND

The semiconductor industry has experienced continuous rapid growth due to constant improvements in the integration density of various electronic components. For the most part, this improvement in integration density has come from repeated reductions in minimum feature size, allowing more components to be integrated into a given chip area. As minimum feature size reduces, metal layer routing in the intermetal connection layers also becomes more complex. Therefore, there is a need to solve the above problems.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2 to 10, FIGS. 11A-D to FIGS. 27A-D, FIGS. 28A-E to FIGS. 29A-E, FIGS. 30A-F to FIGS. 31A-F, FIGS. 32A-D to FIGS. 33A-D, and FIGS. 34A-F schematically illustrate various stages of manufacturing a semiconductor device according to embodiments of the present disclosure.

DETAILED DESCRIPTION

Figure 1:
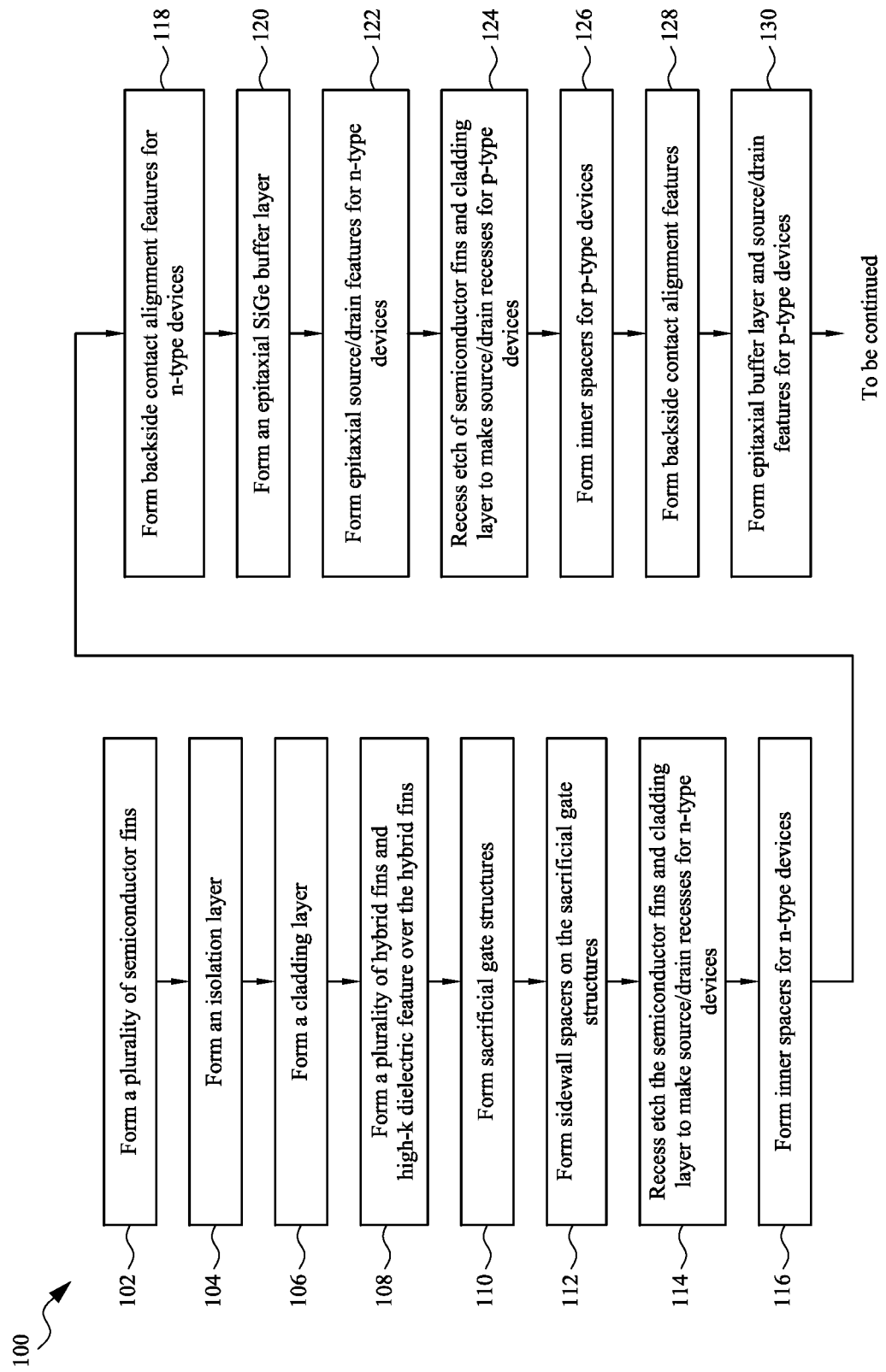
FIG. 1 is a flow chart of a method for manufacturing of a semiconductor device according to embodiments of the present disclosure.
Figure 1:
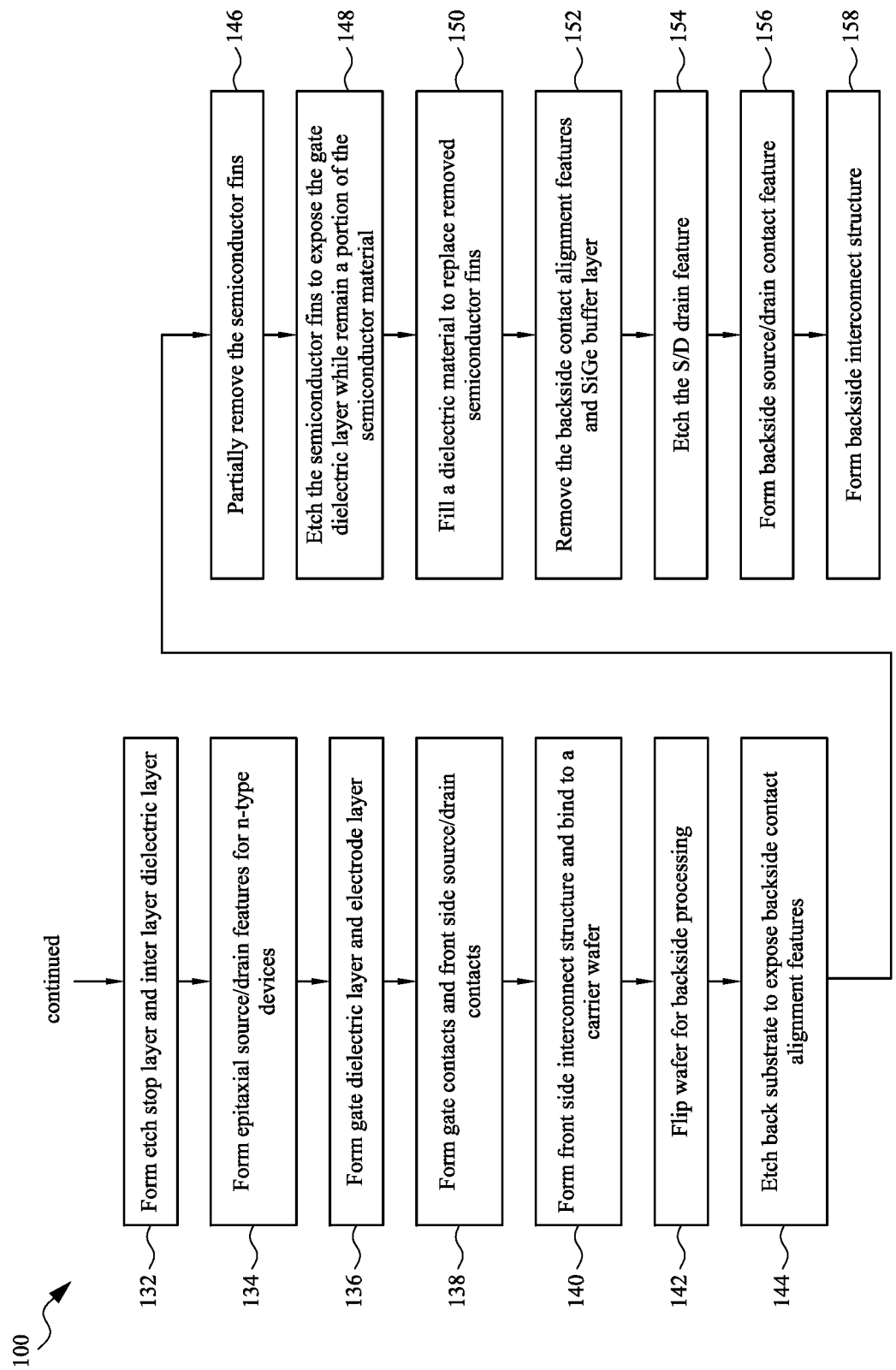

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 64 degrees or at other orientations) and the spatially relative descriptors used herein may likewise be interpreted accordingly.

The foregoing broadly outlines some aspects of embodiments described in this disclosure. While some embodiments described herein are described in the context of nanosheet channel FETs, implementations of some aspects of the present disclosure may be used in other processes and/or in other devices, such as planar FETs, Fin-FETs, Horizontal Gate All Around (HGAA) FETs, Vertical Gate All Around (VGAA) FETs, and other suitable devices. A person having ordinary skill in the art will readily understand other modifications that may be made are contemplated within the scope of this disclosure. In addition, although method embodiments may be described in a particular order, various other method embodiments may be performed in any logical order and may include fewer or more steps than what is described herein. In the present disclosure, a source/drain refers to a source and/or a drain. A source and a drain are interchangeably used.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

An integrated circuit (IC) typically includes a plurality of semiconductor devices, such as field-effect transistors and metal interconnection layers formed on a semiconductor substrate. The interconnection layers, designed to connect the semiconductor devices to power supplies, input/output signals, and to each other, may include signal lines and power rails, such as a positive voltage rail (VDD) and a ground rail (GND). As semiconductor device size shrinks, space for metal power rails and signal lines decreases.

Embodiments of the present disclosure provide semiconductor devices having metal contacts for connecting to power rails formed on a backside of a substrate, and methods for fabricating such semiconductor devices. Metal contacts on the backside and the backside power rail are formed by backside processes which are performed after completing BEOL processes and flipping the substrate over. When forming metal contacts on the backside of a FinFET, Nanosheet FET, or other multi-channel FET device, the semiconductor material on the backside of the device of the FET device is removed to expose the source and drain region so that the metal contact can be formed and dielectric materials can be filled around the metal contract. Because material in the source/drain features, particularly source/drain features for n-type devices, has a low etch selectivity to the semiconductor material to be removed from the backside, there is a high risk to etch the source/drain features during backside semiconductor removal. As a result, a relative thick buffer layer is formed under the source/drain features, and a high precision is needed during formation recesses for the backside contact.

According to embodiments of the present disclosure, a corner portion of the semiconductor material is kept during the backside semiconductor removal process. The corner portion protects the source/drain features from the etchant. In some embodiments, the corner portion may be created using a low etching rate etch process. The corner portion may have a substantially triangular profile with a diagonal surface formed from a crystal facet generated during etch.

The corner portion allows the source/drain features to be formed with a convex surface on the backside. The convex surface increases volume of the source/drain features, thus, improving device performance and increasing processing window of backside contact recess formation.

FIG. 1 is a flow chart of a method 100 for manufacturing of a semiconductor substrate according to embodiments of the present disclosure. FIGS. 2 to 10, FIGS. 11A-D to FIGS. 27A-D, FIGS. 28A-E to FIGS. 29A-E, FIGS. 30A-F to FIGS. 31A-F, FIGS. 32A-D to FIGS. 33A-D, and FIGS. 34A-F schematically illustrate various stages of manufacturing a semiconductor device according to embodiments of the present disclosure. Additional operations can be provided before, during, and after operations/processes in the method 100, and some of the operations described below can be replaced or eliminated, for additional embodiments of the method. The order of the operations/processes may be interchangeable.

Figure 2:
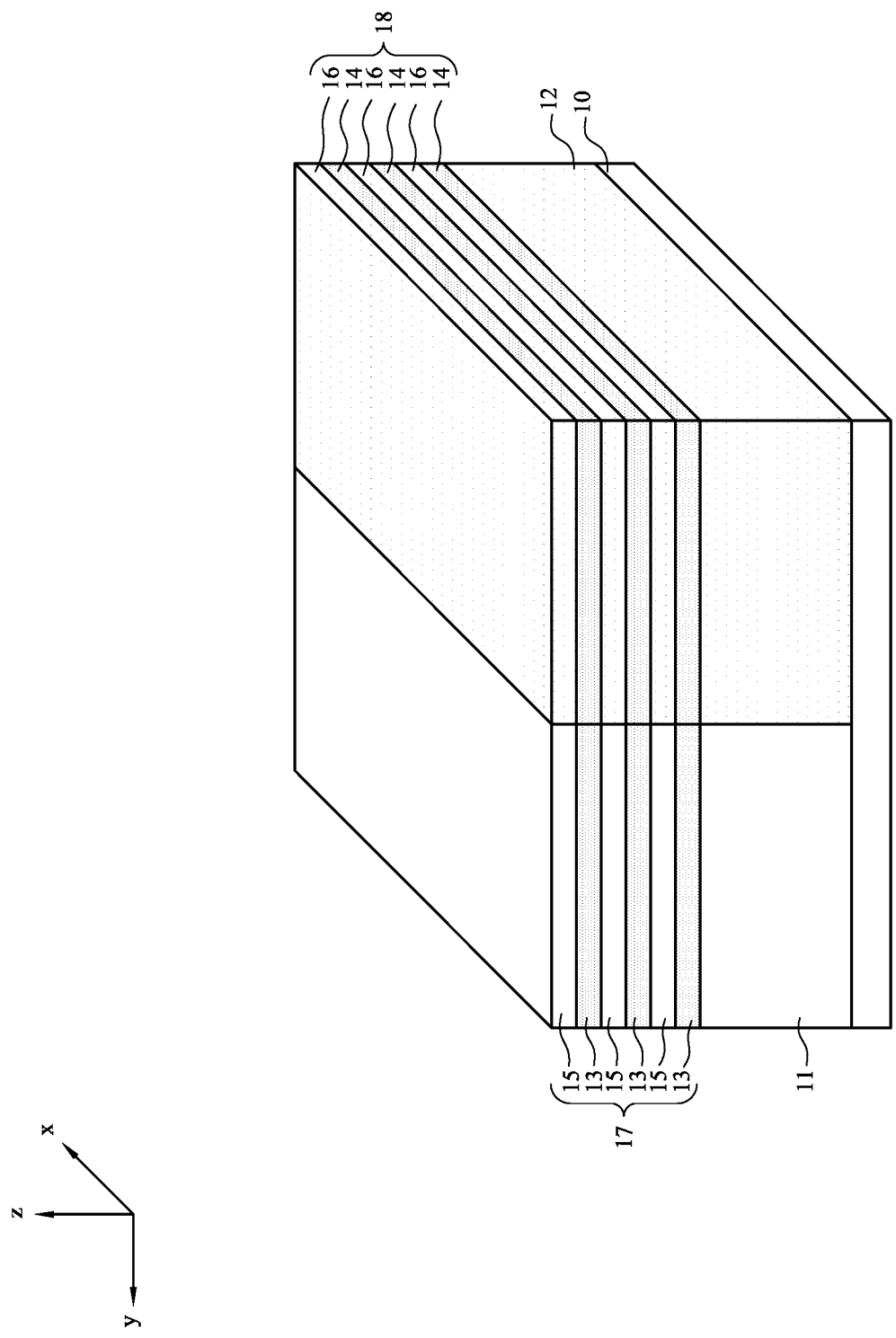
Figure 3:
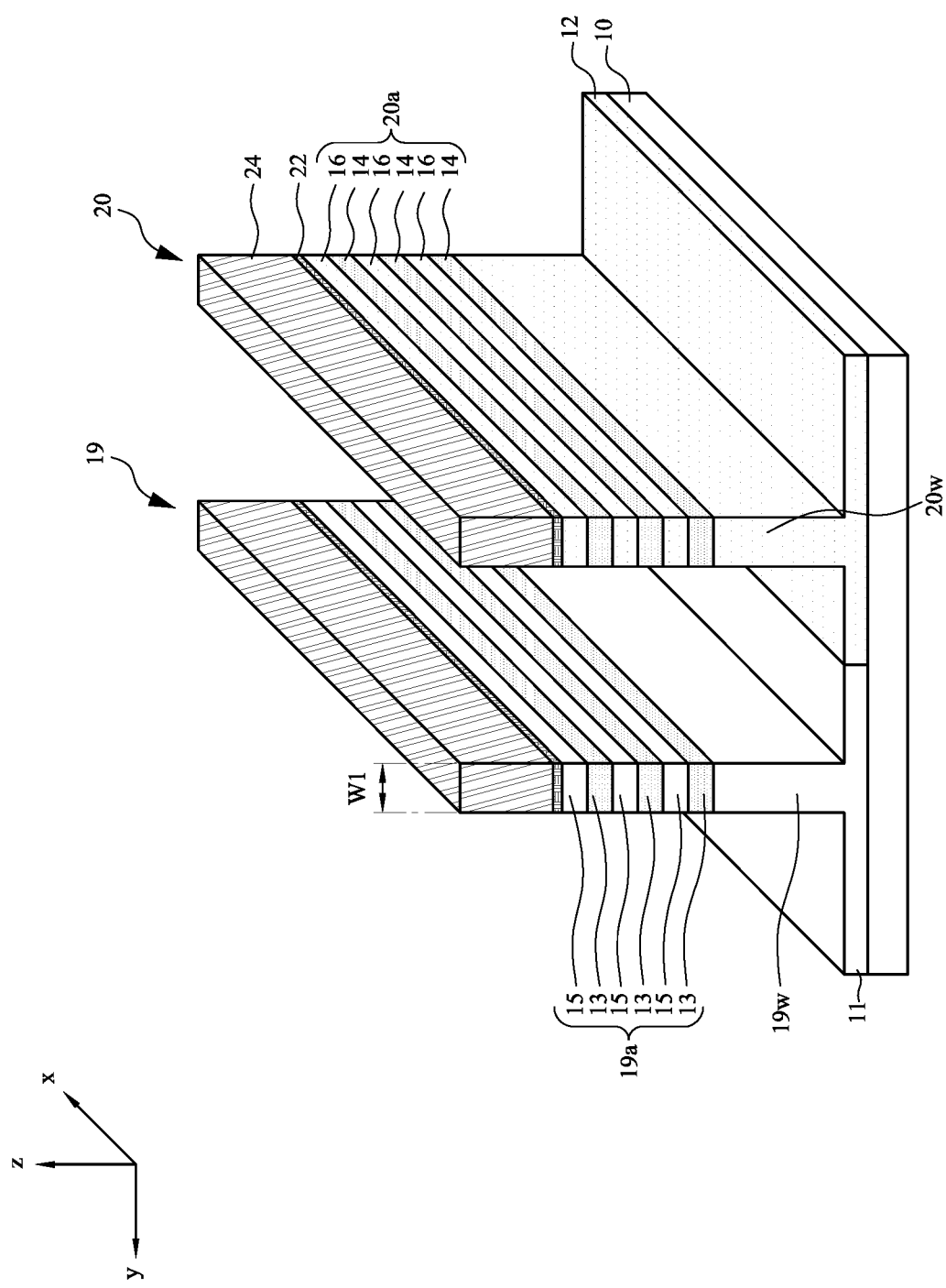

The method 100 begins at operation 102 where a plurality of semiconductor fins 20 are formed over a substrate 10, as shown in FIGS. 2 and 3, which are schematic perspective views of the substrate 10 during operation 102.

In FIG. 2, the substrate 10 is provided to form a semiconductor device thereon. The substrate 10 may include a single crystalline semiconductor material such as, but not limited to Si, Ge, SiGe, GaAs, InSb, GaP, GaSb, InAlAs, InGaAs, GaSbP, GaAsSb, and InP. The substrate 10 may include various doping configurations depending on circuit design. For example, different doping profiles, e.g., n-wells, p-wells, may be formed in the substrate 10 in regions designed for different device types, such as n-type field effect transistors (nFET), and p-type field effect transistors (pFET). In some embodiments, the substrate 10 may be a silicon-on-insulator (SOI) substrate including an insulator structure (not shown) for enhancement.

In the embodiment shown in FIG. 2, the substrate 10 includes a p-doped region or p-well 12 and an n-doped region or n-well 11. In some embodiments, when multi-channel FETs with backside power rails are to be formed from the substrate 10, the p-well 12 and n-well 11 may be eventually removed, the same semiconductor materials, such as undoped semiconductor material, may be used in place of the n-well 12 and n-well 11. One or more n-type devices, such as nFETs, are to be formed over and/or within p-well 12. One or more p-type devices, such as pFETs, are to be formed over and/or within n-well 11. FIG. 2 shows that the n-well 11 and the p-well 12 are formed adjacent to one another, which is not limiting. In other embodiments, the p-well 12 and the n-well 11 may be separated by one or more insulation bodies, e.g., shallow trench insulation ("STI"). The p-well 12 and n-well 11 in FIG. 2 are formed using a dual-tub process, in which both p-well 12 and n-well 11 are formed in the substrate 10. Other processes, like a p-well process in an n-type substrate or an n-well process in a p-type substrate are also possible and included in the disclosure. That is the p-well 12 is a local region doped with p-type dopants on a n-type doped substrate and the n-well 11 is the n-type doped substrate, or vice versa. It is also possible that both p-well 12 and n-well 11 are intrinsic or intrinsically doped, e.g., unintentionally doped. The p-well 12 includes one or more p-type dopants, such as boron (B). The n-well 11 includes one more n-type dopants, such as phosphorus (P), arsenic (As), etc.

A semiconductor stack 18 is formed over the p-well 12. The semiconductor stack 18 includes alternating semiconductor layers made of different materials to facilitate formation of nanosheet channels in a multi-gate n-type device, such as nanosheet channel nFETs. In some embodiments, the semiconductor stack 18 includes first semiconductor layers 14 interposed by second semiconductor layers 16. The first semiconductor layers 14 and second semiconductor layers 16 have different compositions. In some embodiments, the two semiconductor layers 14 and 16 provide for different oxidation rates and/or different etch selectivity. In later fabrication stages, portions of the second semiconductor layers 16 form nanosheet channels in a multi-gate device. Three first semiconductor layers 14 and three second semiconductor layers 16 are alternately arranged as illustrated in FIG. 2 as an example. More or less semiconductor layers 14 and 16 may be included in the semiconductor stack 18 depending on the desired number of channels in the semiconductor device to be formed. In some embodiments, the number of semiconductor layers 14 and 16 is between 1 and 10.

In some embodiments, the first semiconductor layer 14 may include silicon germanium (SiGe). The first semiconductor layer 14 may be a SiGe layer including more than 25% Ge in molar ratio. For example, the first semiconductor layer 14 may be a SiGe layer including Ge in a molar ration in a range between 25% and 50%.

The second semiconductor layer 16 may include silicon (Si). In some embodiments, the second semiconductor layer 16 may include n-type dopants, such as phosphorus (P), arsenic (As), etc. In some embodiments, the second semiconductor layer 16 has a dopant concentration in a range from about 5E16 atoms/$cm^3$ to about 5E17 atoms/$cm^3$. In other embodiments, the second semiconductor layer 16 is a undoped or substantially dopant-free (i.e., having an extrinsic dopant concentration from about 0 atoms/$cm^3$ to about 1E17 atoms/$cm^3$) silicon layer.

A semiconductor stack 17 is formed over the n-well 11. The semiconductor stack 17 includes alternating semiconductor layers made of different materials to facilitate formation of nanosheet channels in a multi-gate p-type device, such as nanosheet channel pFETs. In some embodiments, the semiconductor stack 17 includes third semiconductor layers 13 interposed by fourth semiconductor layers 15. The third semiconductor layers 13 and fourth semiconductor layers 15 have different compositions. In some embodiments, the two semiconductor layers 13 and 15 provide for different oxidation rates and/or different etch selectivity. In later fabrication stages, portions of the fourth semiconductor layers 15 form nanosheet channels in a multi-gate device. Three third semiconductor layers 13 and three fourth semiconductor layers 15 are alternately arranged as illustrated in FIG. 2 as an example. More or less semiconductor layers 13 and 15 may be included in the semiconductor stack 17 depending on the desired number of channels in the semiconductor device to be formed. In some embodiments, the number of semiconductor layers 13 and 15 is between 1 and 10.

In some embodiments, the third semiconductor layer 13 may include silicon germanium (SiGe). The third semiconductor layer 13 may be a SiGe layer including more than 25% Ge in molar ratio. For example, the third semiconductor layer 13 may be a SiGe layer including Ge in a molar ration in a range between 25% and 50%. In some embodiments, the third semiconductor layer 13 and the first semiconductor layer 14 have substantially the same composition.

The fourth semiconductor layer 15 may include silicon, Ge, a compound semiconductor such as SiC, GeAs, GaP, InP, InAs, and/or InSb, an alloy semiconductor such as SiGe, GaAsP, AlInAs, AlGaAs, InGaAs, GaInP, and/or GaInAsP, or combinations thereof. In some embodiments, the fourth semiconductor layer 15 may be a Ge layer. The fourth semiconductor layer 15 may include p-type dopants, boron etc.

The semiconductor layers 13, 15, 14, 16 may be formed by a molecular beam epitaxy (MBE) process, a metalorganic chemical vapor deposition (MOCVD) process, and/or other suitable epitaxial growth processes.

In some embodiments, each semiconductor layer 15, 16 has a thickness in a range between about 5 nm and about 30 nm. In other embodiments, each semiconductor layer 15, 16 has a thickness in a range between about 10 nm and about 20 nm. In some embodiments, each semiconductor layer 15, 16 has a thickness in a range between about 6 nm and about 12 nm. In some embodiments, the semiconductor layers 15 in the semiconductor stack 17 and the semiconductor layers 16 in the semiconductor stack 18 are uniform in thickness.

The semiconductor layers 13, 14 may eventually be removed and serve to define a vertical distance between adjacent channel regions for a subsequently formed multi-gate device. In some embodiments, the thickness of the semiconductor layer 13, 14 is equal to or greater than the thickness of the semiconductor layer 15, 16. In some embodiments, each semiconductor layer 13, 14 has a thickness in a range between about 5 nm and about 50 nm. In other embodiments, each semiconductor layer 13, 14 has a thickness in a range between about 10 nm and about 30 nm.

The semiconductor stacks 17, 18 may be formed separately. For example, the semiconductor stack 18 is first formed over the entire substrate, i.e. over both the n-well 11 and the p-well 12 then recesses are formed in the semiconductor stacks 18 in areas over the n-well 11 to expose the n-well 11, and the semiconductor stack 17 is then formed in the recesses over the n-well 11 while the semiconductor stack 18 is covered by a mask layer.

In FIG. 3, the semiconductor fins 19, 20 are formed from the semiconductor stacks 17, 18, and a portion of the n-well 11, the p-well 12 underneath respectively. The semiconductor fin 19 may be formed by patterning a pad layer 22 and a hard mask 24 formed on the semiconductor stacks 17, 18 and one or more etching processes. Each semiconductor fin 19, 20 has an active portion 19a, 20a formed from the semiconductor layers 13/15, 14/16, and a well portion 19w, 20w formed in the n-well 11 and the p-well 12, respectively. In FIG. 3, the semiconductor fins 19, 20 are formed along the X direction. A width W1 of the semiconductor fins 19, 20 along the Y direction is in a range between about 3 nm and about 44 nm. In some embodiments, the width W1 of the semiconductor fins 19, 20 along the Y direction is in a range between about 20 nm and about 30 nm.

Figure 4:
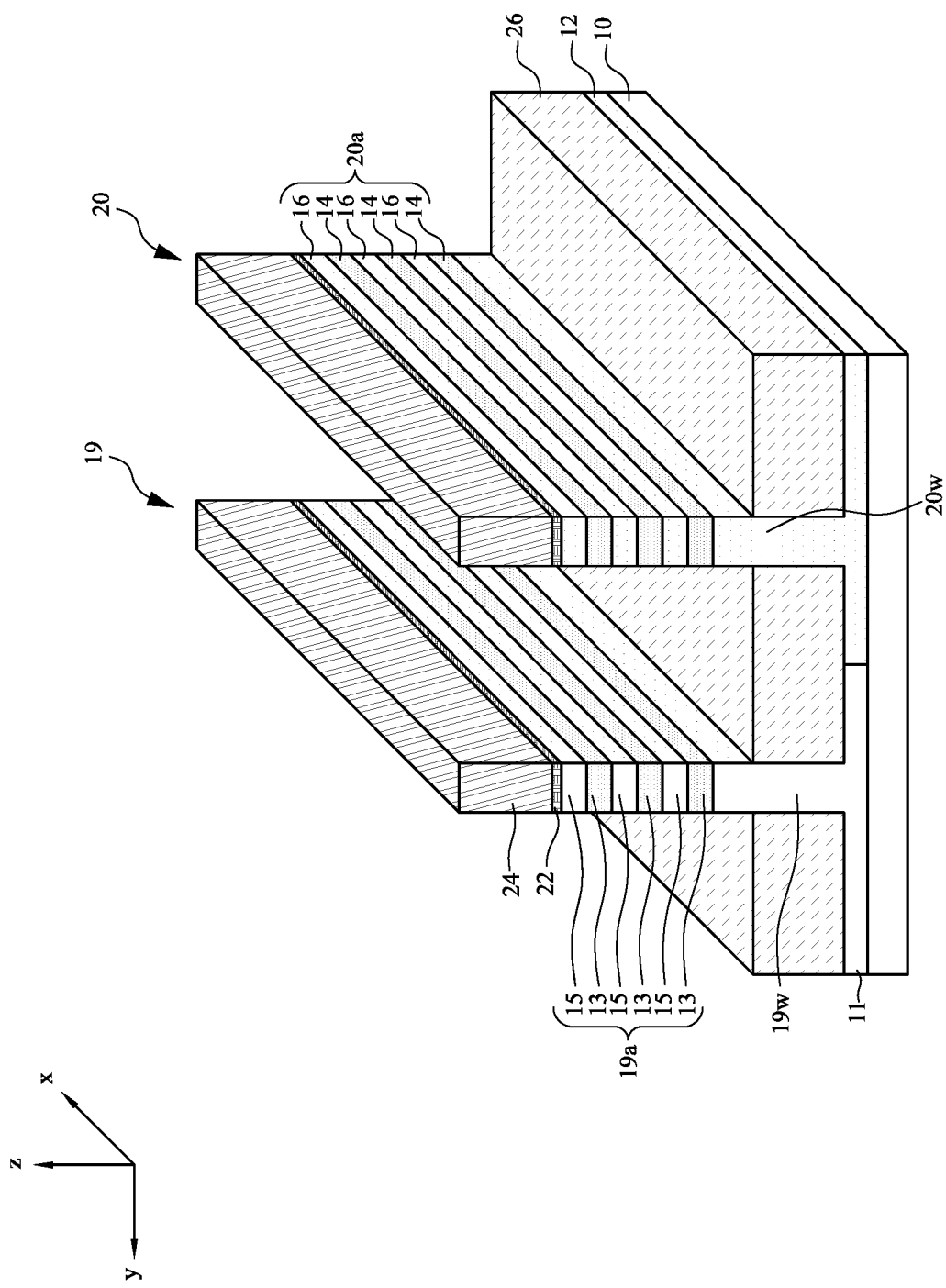
Figure 5:
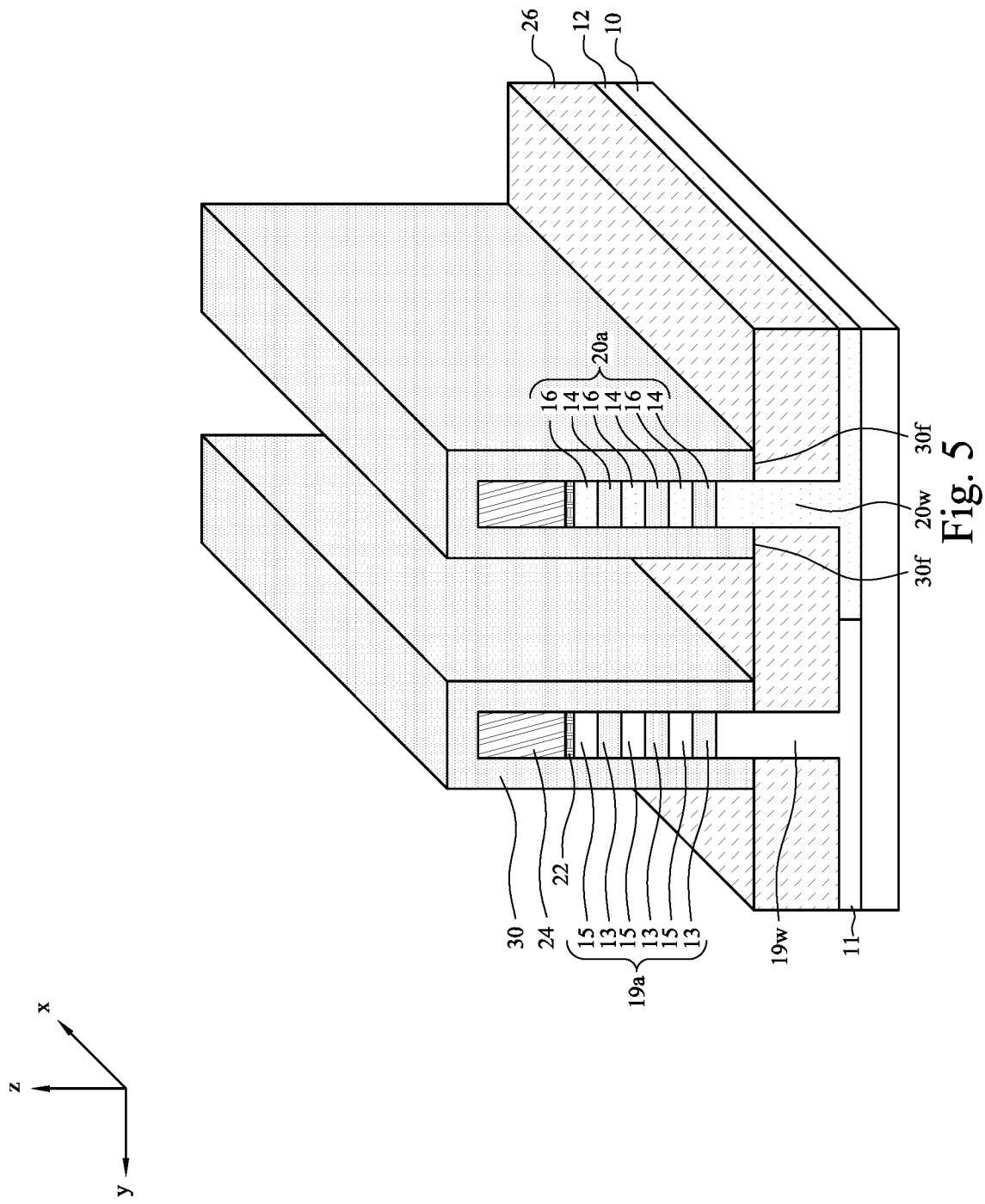

In operation 104, an isolation layer 26 is formed in the trenches between the semiconductor fins 19, 20, as shown in FIG. 4. The isolation layer 26 is formed over the substrate 10 to cover at least a part of the well portions 19w, 20w of the semiconductor fins 19, 20. The isolation layer 26 may be formed by a high density plasma chemical vapor deposition (HDP-CVD), a flowable CVD (FCVD), or other suitable deposition process. In some embodiments, the isolation layer 26 may include silicon oxide, silicon nitride, silicon oxynitride, fluorine-doped silicate glass (FSG), a low-k dielectric, combinations thereof. In some embodiments, the isolation layer 26 is formed to cover the semiconductor fins 19, 20 by a suitable deposition process to fill the trenches between the semiconductor fins 19, 20, and then recess etched using a suitable anisotropic etching process to expose the active portions 19a, 20a of the semiconductor fins 19, 20. In some embodiments, the isolation layer 26 is etched to expose a portion of the well portions 19w, 20w in the semiconductor fins 19, 20.

In operation 106, a cladding layer 30 is formed by an epitaxial process over exposed portion of the semiconductor fins 19, 20 as shown in FIG. 4. In some embodiments, a semiconductor liner (not shown) may be first formed over the semiconductor fins 19, 20, and the cladding layer 30 is then formed over the semiconductor liner by an epitaxial process. In some embodiments, the cladding layer 30 includes a semiconductor material, for example SiGe. In some embodiments, the cladding layer 30 may have a composition similar to the composition of the first semiconductor layer 14 and the third semiconductor layer 13, thus may be selectively removed from the second semiconductor layer 16 and the fourth semiconductor layer 15. In an alternative embodiment, the semiconductor liner may be omitted and the cladding layer 30 be epitaxially grown from the exposed surfaces of the semiconductor layers 13, 14, 15, and 16.

Figure 6:
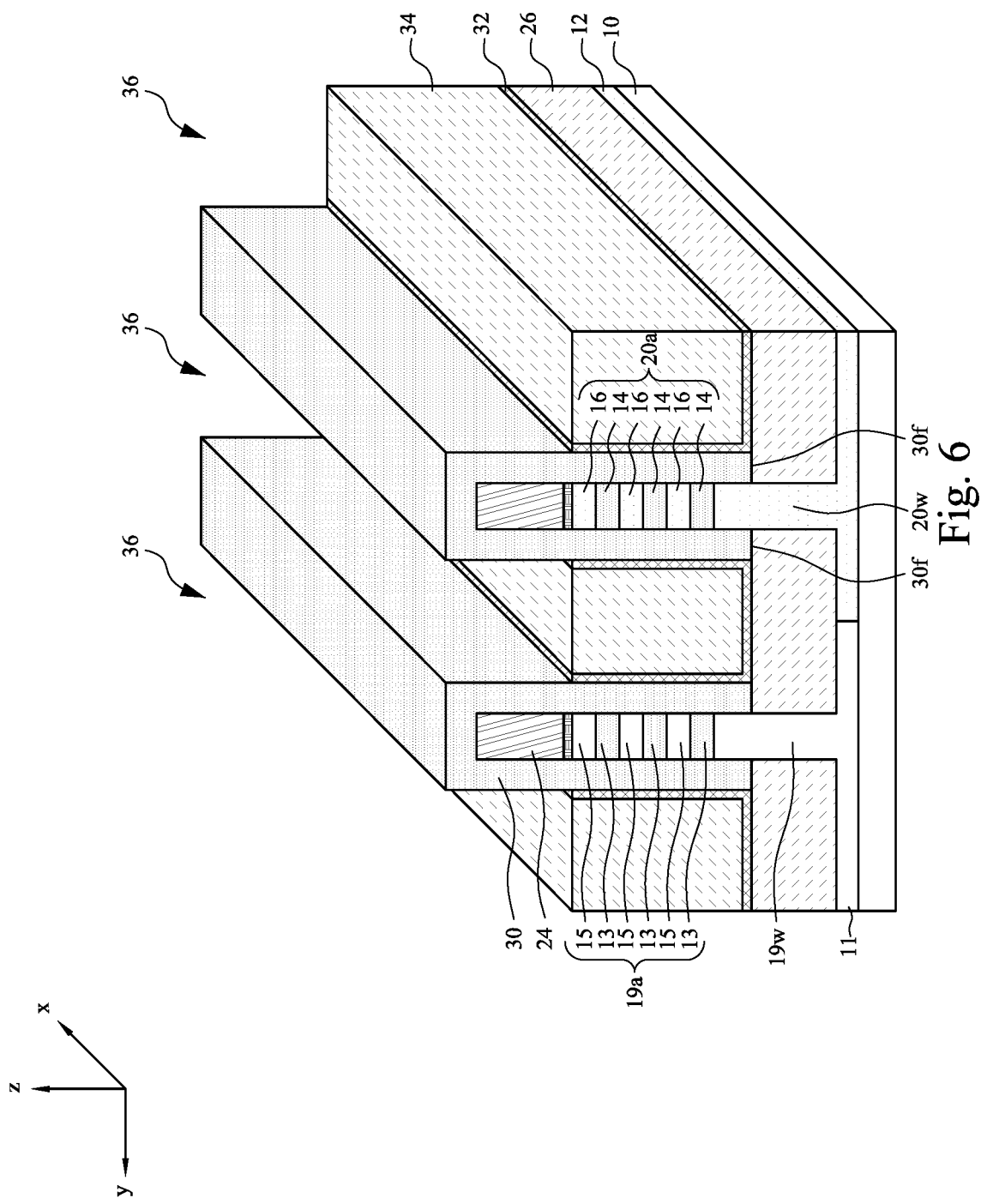
Figure 7:
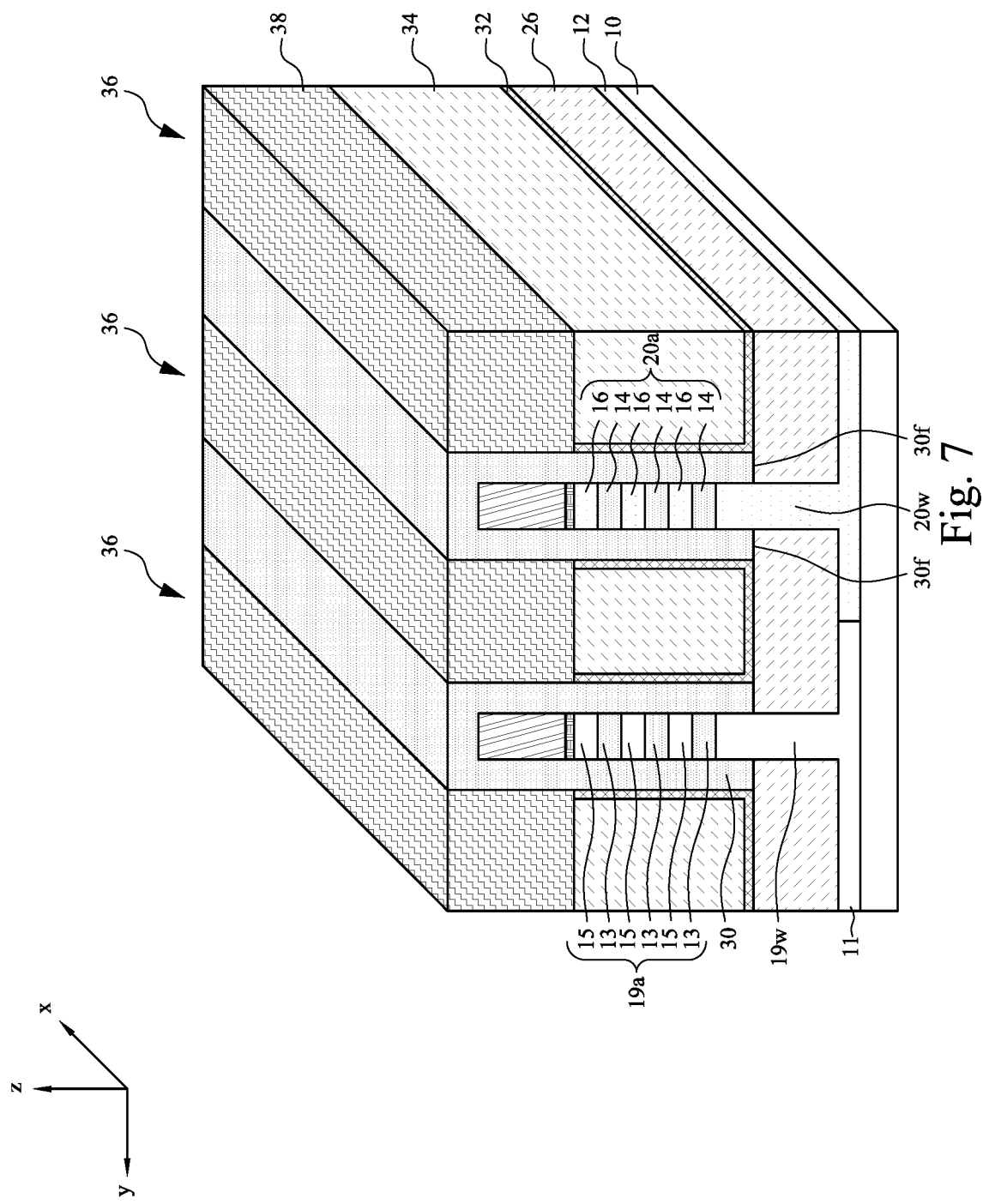
Figure 8:
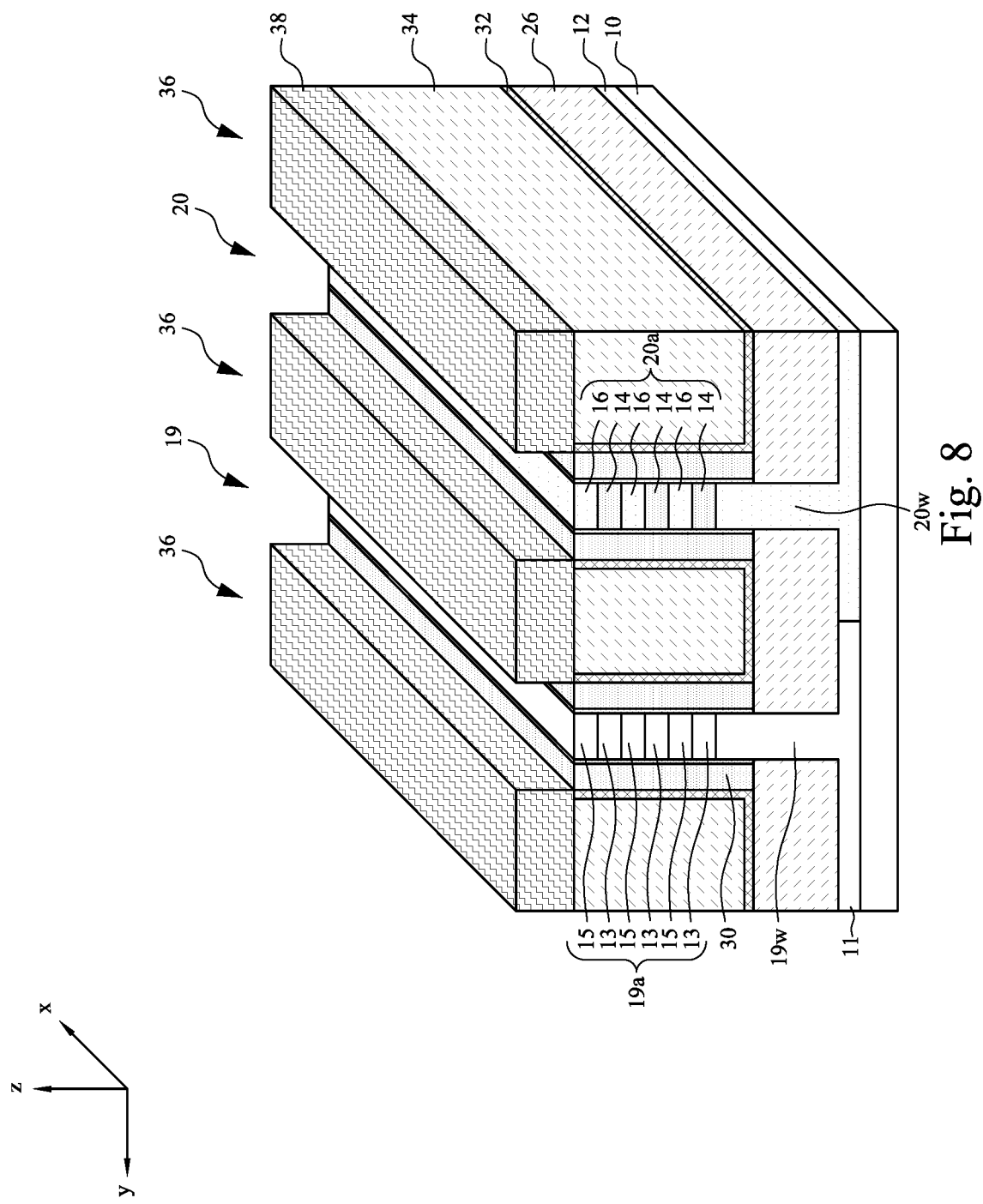

In operation 108, hybrid fins 36 are formed in the trenches between the neighboring semiconductor fins 19, 20 after formation of the cladding layer 30, and high-k dielectric features 38 are formed over the hybrid fins 36, as shown in FIGS. 6-8. The hybrid fins 36, also referred to as dummy fins or dielectric fins, include a high-k dielectric material layer, a low-k dielectric material layer, or a bi-layer dielectric material including high-k upper part and a low-k lower part. In some embodiments, the hybrid fins 36 include a high-k metal oxide, such as $HfO_2$, $ZrO_2$, HfAlOx, HfSiOx, $Al_2O_3$, and the like, a low-k material such as SiONC, SiCN, SiOC, or other dielectric material. In the example of FIG. 6, the hybrid fin 36 is a bi-layer structure including a dielectric liner layer 32 and a dielectric filling layer 34. In some embodiments, the dielectric liner layer 32 may include a low-k material, such as SiONC, SiCN, SiOC, or other dielectric material, that provide etch resistance during replacement gate processes. The dielectric filling layer 34 may be a low-k dielectric material, such as silicon oxide.

The hybrid fins 36 are recess etched as shown in FIG. 6. The recess may be performed by any suitable process, such as dry etch, wet etch, or a combination thereof. The etch process may be a selective etch process that does not remove the semiconductor material of the cladding layer 30. The recess process may be controlled so that the dielectric liner layer 32 and the dielectric filling layer 34 are substantially at the same level as a top surface of the topmost second semiconductor layer 16 and the fourth semiconductor layer 15. As a result of the recess etch, recesses are formed on the hybrid fins 36.

The high-k dielectric features 38 are formed in the recesses over the hybrid fins 36, as shown in FIG. 7. In some embodiments, the high-k dielectric features 38 are formed by a blanket deposition followed by a planarization process. The high-k dielectric features 38 may include a material having a k value greater than 7, such as $HfO_2$, $ZrO_2$, HfAlOx, HfSiOx, or $Al_2O_3$. Any suitable deposition process, such as a CVD, PECVD, FCVD, or ALD process, may be used to deposit the high-k dielectric material. After formation of the high-k dielectric features 38, the cladding layer 30 may be recessed to level with the hybrid fins 36, as shown in FIG. 8. The pad layer 22 and the hard mask 24 are subsequently removed exposing the topmost second semiconductor layer 16 and the fourth semiconductor layer 15. The high-k dielectric features 38 protrude over the semiconductor fins 19, 20 and the hybrid fins 36 and may function to separate gate structures formed over the semiconductor fins 19, 20.

Figure 9:
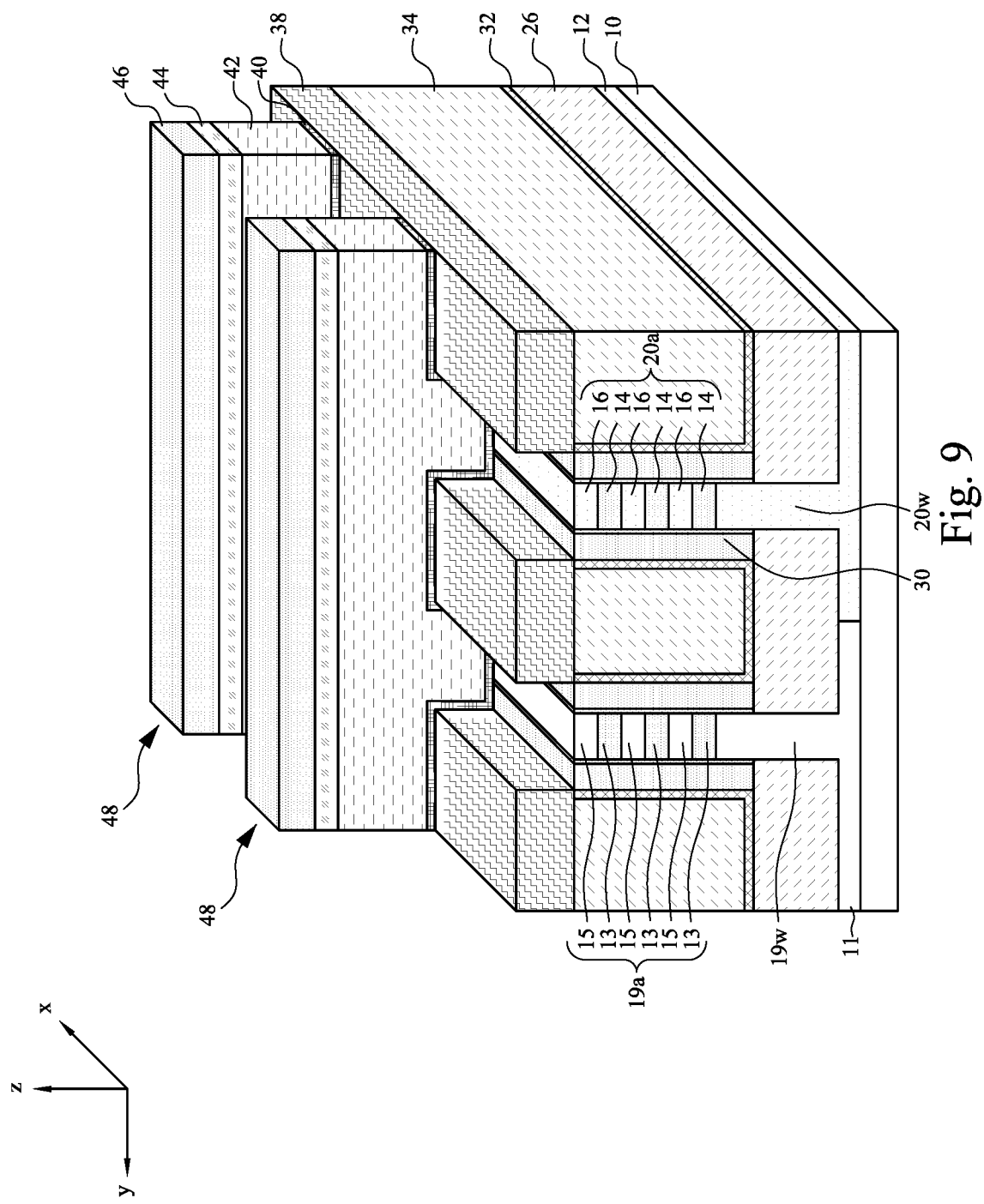

In operation 110, sacrificial gate structures 48 are formed as shown in FIG. 9. The sacrificial gate structures 48 are formed over the semiconductor fins 19, 20 and the hybrid fins 36. The sacrificial gate structure 48 is formed over a portion of the semiconductor fins 19, 20 which is to be a channel region. The sacrificial gate structure 48 may include a sacrificial gate dielectric layer 40, a sacrificial gate electrode layer 42, a pad layer 44, and a mask layer 46.

The sacrificial gate dielectric layer 40 may be formed conformally over the semiconductor fins 19, 20 and the high-k dielectric features 38. In some embodiments, the sacrificial gate dielectric layer 40 may be deposited by a CVD process, a sub-atmospheric CVD (SACVD) process, a FCVD process, an ALD process, a PVD process, or other suitable process. The sacrificial gate dielectric layer 40 may include one or more layers of dielectric material, such as $SiO_2$, SiN, a high-k dielectric material, and/or other suitable dielectric material. In some embodiments, the sacrificial gate dielectric layer 40 includes a material different than that of the high-k dielectric features 38.

The sacrificial gate electrode layer 42 may be blanket deposited over the sacrificial gate dielectric layer 40. The sacrificial gate electrode layer 42 includes silicon such as polycrystalline silicon or amorphous silicon. The thickness of the sacrificial gate electrode layer is in a range between about 70 nm and about 200 nm. In some embodiments, the sacrificial gate electrode layer 42 is subjected to a planarization operation. The sacrificial gate electrode layer 42 may be deposited using CVD, including LPCVD and PECVD, PVD, ALD, or other suitable process.

Subsequently, the pad layer 44 and the mask layer 46 are formed over the sacrificial gate electrode layer 42. The pad layer 44 may include silicon nitride. The mask layer 46 may include silicon oxide. Next, a patterning operation is performed on the mask layer 46, the pad layer 44, the sacrificial gate electrode layer 42 and the sacrificial gate dielectric layer 40 to form the sacrificial gate structure 48.

Figure 10:
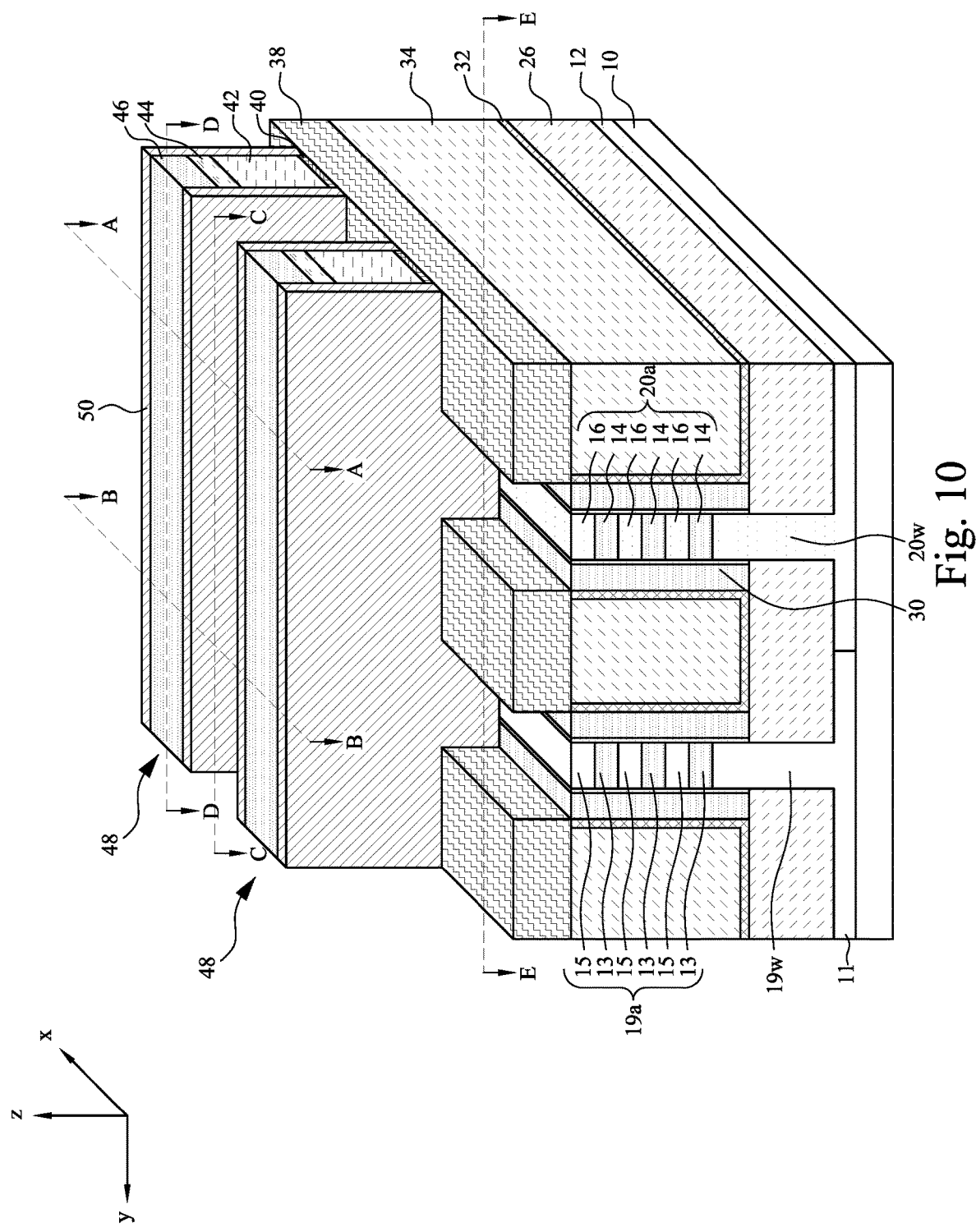

In operation 112, sidewall spacers 50 are formed on sidewalls of each sacrificial gate structure 48, as shown in FIG. 10. After the sacrificial gate structure 48 is formed, the sidewall spacers 50 are formed by a blanket deposition of an insulating material followed by anisotropic etch to remove insulating material from horizontal surfaces. The sidewall spacers 50 may have a thickness in a range between about 4 nm and about 7 nm. In some embodiments, the insulating material of the sidewall spacers 50 is a silicon nitride-based material, such as SiN, SiON, SiOCN or SiCN and combinations thereof.

Lines A-A, B-B, C-C, D-D, and E-E in FIG. 10 indicate cut lines of various views in FIGS. 11A-D to FIGS. 34A-D described below, and FIGS. 28E-31E, and 34E. Particularly, FIGS. 11A-34A are schematic cross-sectional views along lines A-A in FIG. 10, FIGS. 11B-34B are schematic cross-sectional views along lines B-B in FIG. 10, FIGS. 11C-34C are schematic cross-sectional views along lines C-C in FIG. 10, FIGS. 11D-34D are schematic cross-sectional views along lines D-D in FIG. 10, and FIGS. 28E-31E, and 34E are schematic cross-sectional views along lines E-E in FIG. 10.

Figure 11B:
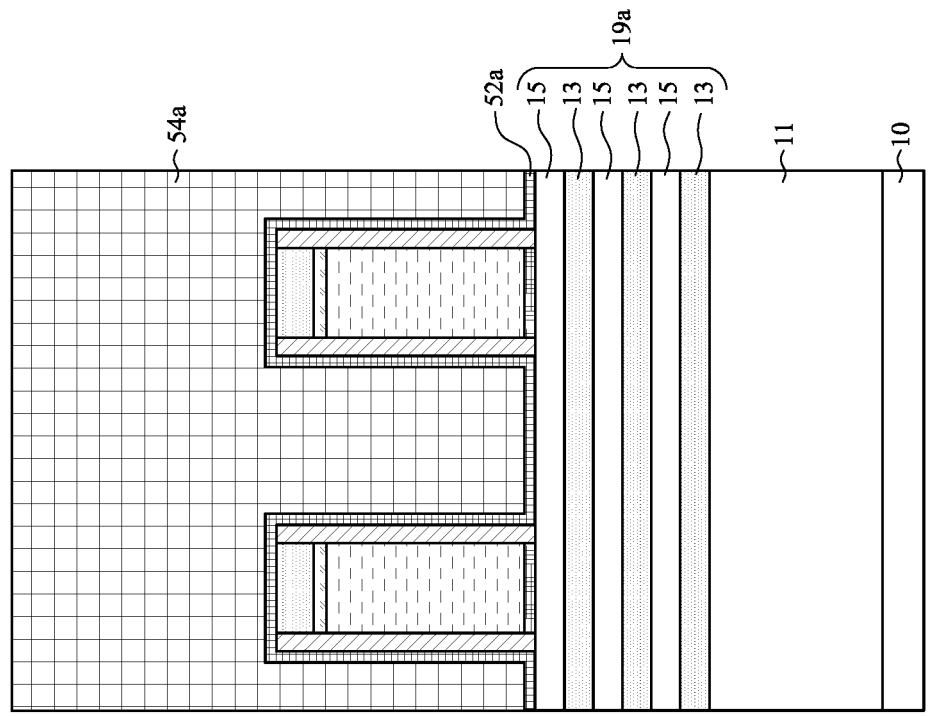
Figure 11A:
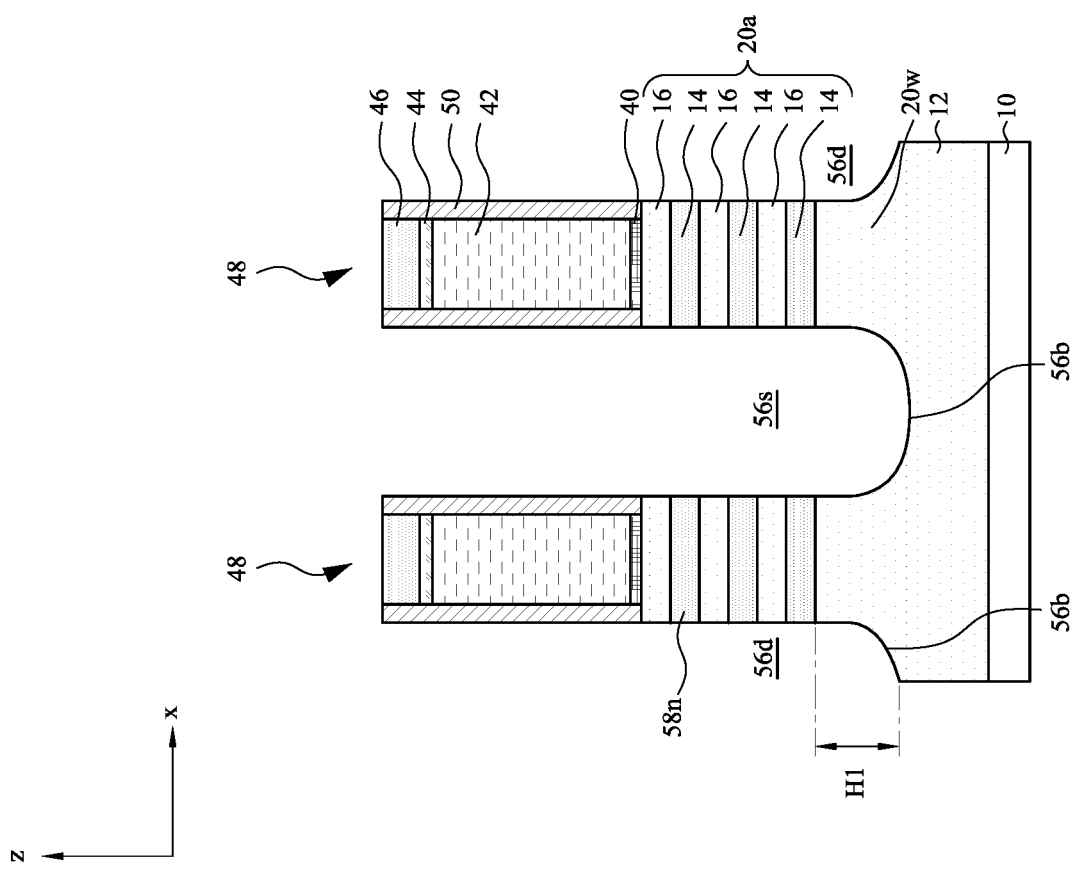
Figure 11D:
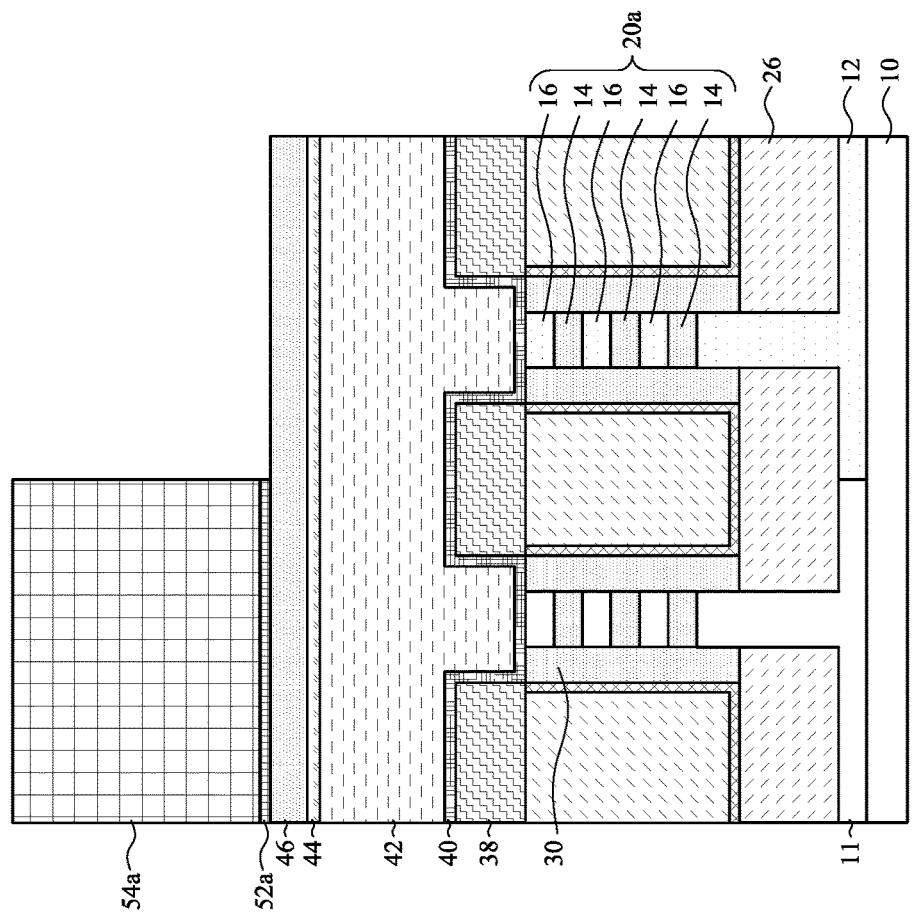
Figure 11C:
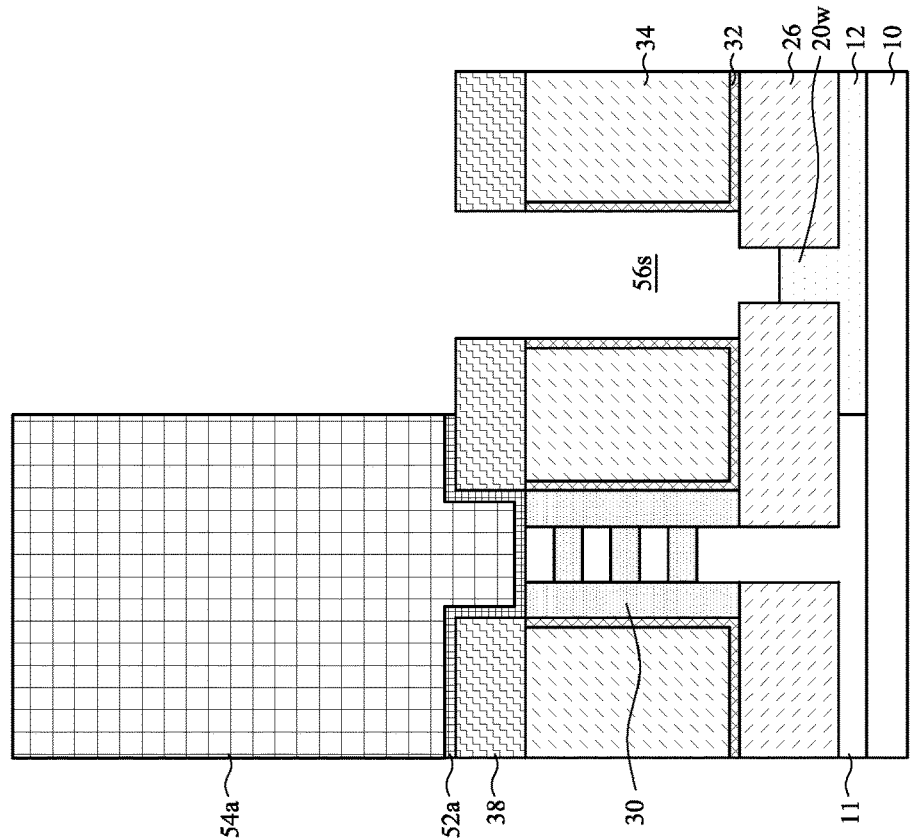
Figure 12B:
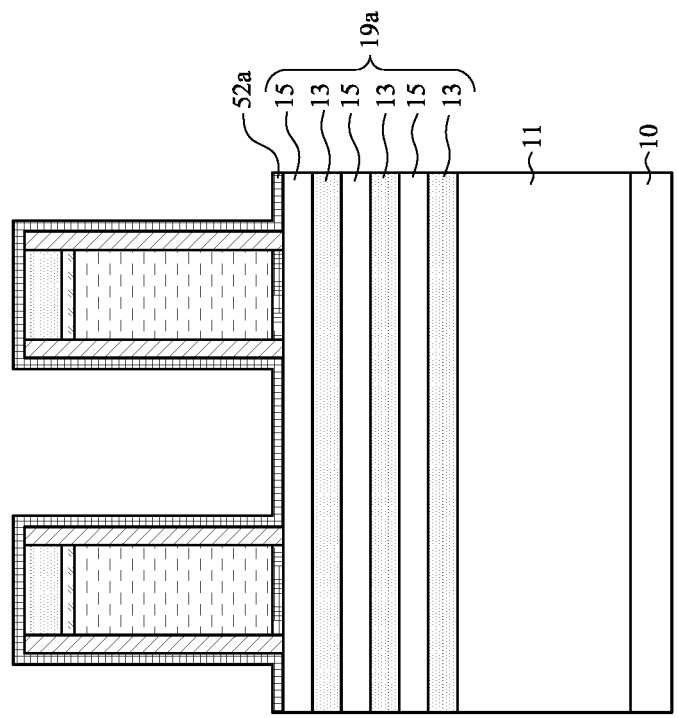
Figure 12A:
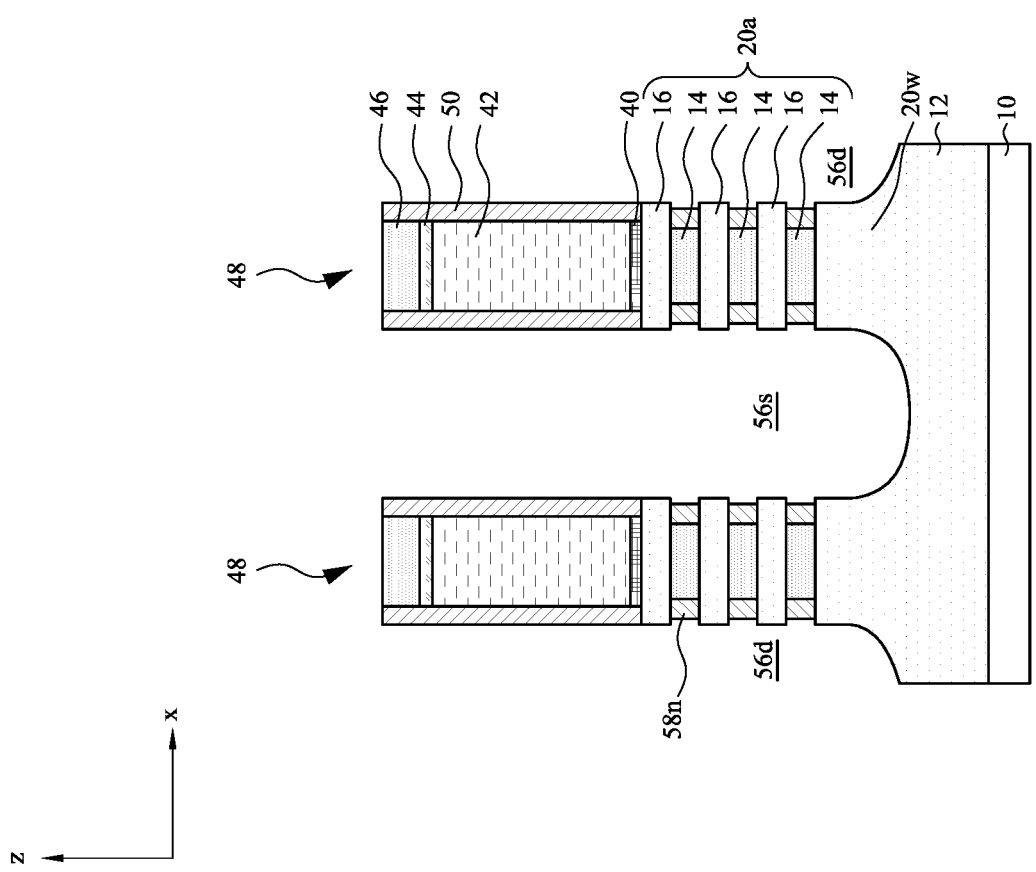

In operation 114, source/drain recesses 56d, 56s (collectively 56) are formed over the p-well 12, on which n-type devices are to be formed, as shown in FIG. 11A-11D. A sacrificial liner 52a and a photoresist layer 54a are formed and patterned to expose regions over the p-well 12 for processing. The sacrificial liner 52a may be a dielectric layer used to protect regions not being processed. In some embodiments, the sacrificial liner 52a includes silicon nitride. The semiconductor fin 20 on opposite sides of the sacrificial gate structure 48 and the cladding layer 30 on the semiconductor fin 20 are etched forming source/drain recesses 56d, 56s between the neighboring hybrid fins 36 on either side of the sacrificial gate structure 48 as shown in FIGS. 11A and 11C. In some embodiments, the source/drain recess 56d indicates the cavity where a drain feature is to be formed and the source/drain recess 56s indicates the cavity where a source feature is to be formed. It should be noted that source feature and drain feature can be used interchangeably.

The cladding layer 30, the first semiconductor layers 14 and the second semiconductor layers 16 in the semiconductor fin 20 are etched down on both sides of the sacrificial gate structure 48 using etching operations. In some embodiments, suitable dry etching and/or wet etching may be used to remove the first semiconductor layers 14, the second semiconductor layer 16, and the p-well 12, together or separately.

In some embodiments, all layers in the active portion 20a of the semiconductor fins 20 and part of the well portion 20w of the semiconductor fin 20 are removed to form the source/drain recesses 56s, 56d. The well portion 20w of the semiconductor fin 20 is partially etched so that the source/drain recesses 56s, 56d extend into the isolation layer 26, as shown in FIG. 11C. The source/drain recesses 56s, 56d are formed on opposite ends of the remaining well portion 20w and active portion 20a of the semiconductor fin 20 as shown in FIG. 11A. Source/drain features are to be formed in the source/drain recesses 56s, 56d, forming a n-type device with the semiconductor material in the remaining well portion 20w and active portion 20a of the semiconductor fin 20 as channel regions.

In some embodiments, the source/drain recesses 56s, 56d extend into the well portion 20w of the semiconductor fin 20. In some embodiments, a bottom surface 56b of the source/drain recess 56s, 56d has a concave profile, as shown in FIG. 11A. The bottom surface 56b of the source/drain recesses 56s, 56d is at a depth H1 in the well portion 20w of the semiconductor fin 20. The depth H1 allows the buffer layer to be formed in the source/drain recesses 56s, 56d and also allows a bottom surface of the source/drain feature to be formed to have a convex profile as discussed later. In some embodiments, the depth H1 is in a range between about 20 nm and about 30 nm. If the depth H1 is below 20 nm, the buffer layer to be formed may not be thick enough to function as an etch stop layer. If the depth H1 is greater than 30 nm, the dimension of the device may be increased without obvious additional advantages.

In operation 116, inner spacers 58n are formed as shown in FIGS. 12A-12D. Prior to forming the inner spacers 58n, the photoresist layer 54a may be removed exposing the patterned sacrificial liner 52a to protect regions over the p-well 12.

Exposed ends of the first semiconductor layers 14 and the cladding layers 30 are first etched to form spacer cavities for the inner spacers 58n. The first semiconductor layers 14 and cladding layer 30 exposed to the source/drain recesses 56s, 56d are first etched horizontally along the X direction to form cavities. In some embodiments, the first semiconductor layers 14 can be selectively etched by using a wet etchant such as, but not limited to, ammonium hydroxide ($NH_4OH$), tetramethylammonium hydroxide (TMAH), ethylenediamine pyrocatechol (EDP), or potassium hydroxide (KOH) solutions. In some embodiments, an etching thickness of the first semiconductor layer 14 and the cladding layer 30 is in a range between about 2 nm and about 10 nm along the X direction.

After forming the spacer cavities by etching the first semiconductor layers 14 and the cladding layer 30, the inner spacers 58n are formed in the spacer cavities by conformally deposit and then partially remove an insulating layer. The insulating layer can be formed by ALD or any other suitable method. The subsequent etch process removes most of the insulating layer except inside the cavities, resulting in the inner spacers 58n. In some embodiments, the second semiconductor layers 16 may extend from the inner spacers 58n. In some embodiments, the inner spacers 58n may include one of silicon nitride (SiN) and silicon oxide ($SiO_2$), SiONC, or a combination thereof. The inner spacers 58n have a thickness along the X direction in a range from about 4 nm to about 7 nm.

After the formation of the inner spacers 58n, the patterned sacrificial liner 52a is removed.

In operation 118, backside contact alignment feature 60n is formed by removing a portion of the well portion 20w in the semiconductor fin 20 and refilling the well portion 20w with a semiconductor material, as shown in FIGS. 13A-13D and FIGS. 14A-14D. The backside contact alignment feature 60n is selectively formed under the source/drain recess 56s where a source/drain feature formed therein is to be connected to a backside power rail.

Prior to forming the backside contact alignment feature 60n, a patterned photoresist layer 54b and patterned sacrificial liner 52b are formed to expose the source/drain recess 56s. The photoresist layer 54b may be similar to the photoresist layer 54a and the sacrificial liner 52b may be similar to the sacrificial liner 52a.

Figure 13B:
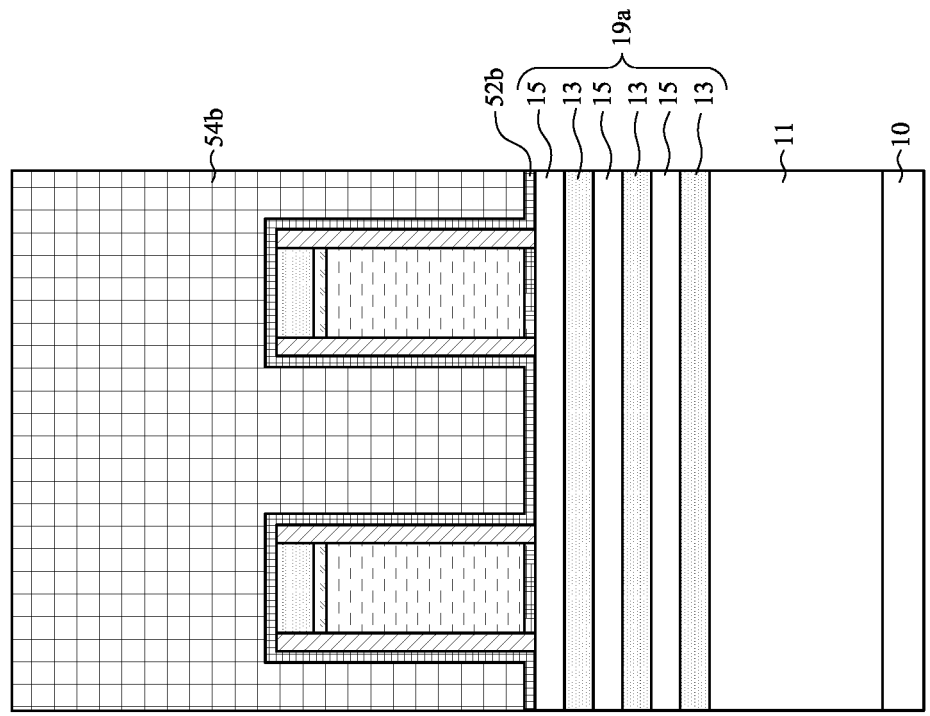
Figure 13A:
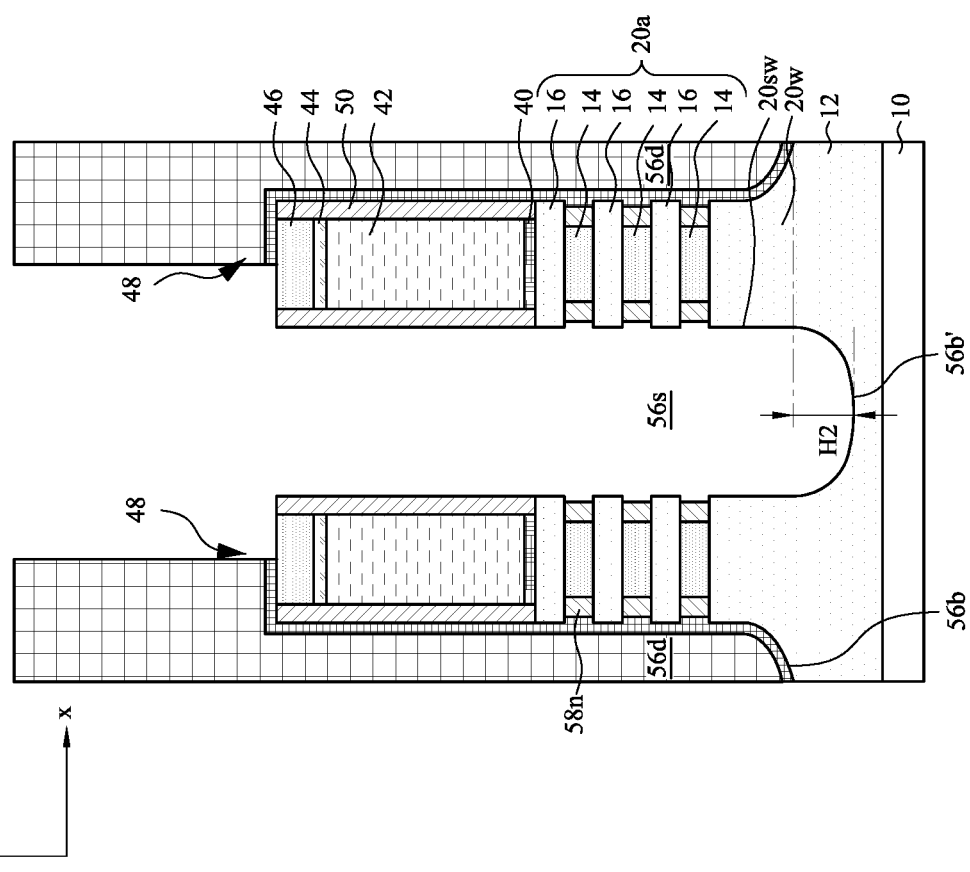
Figure 13D:
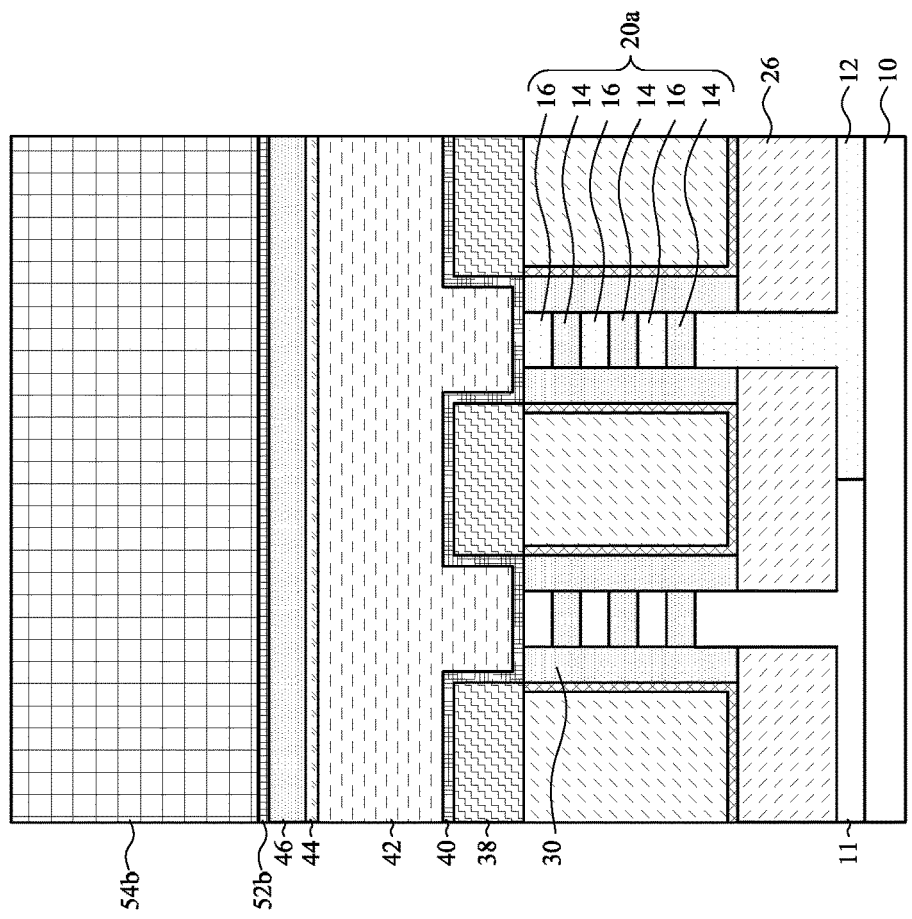
Figure 13C:
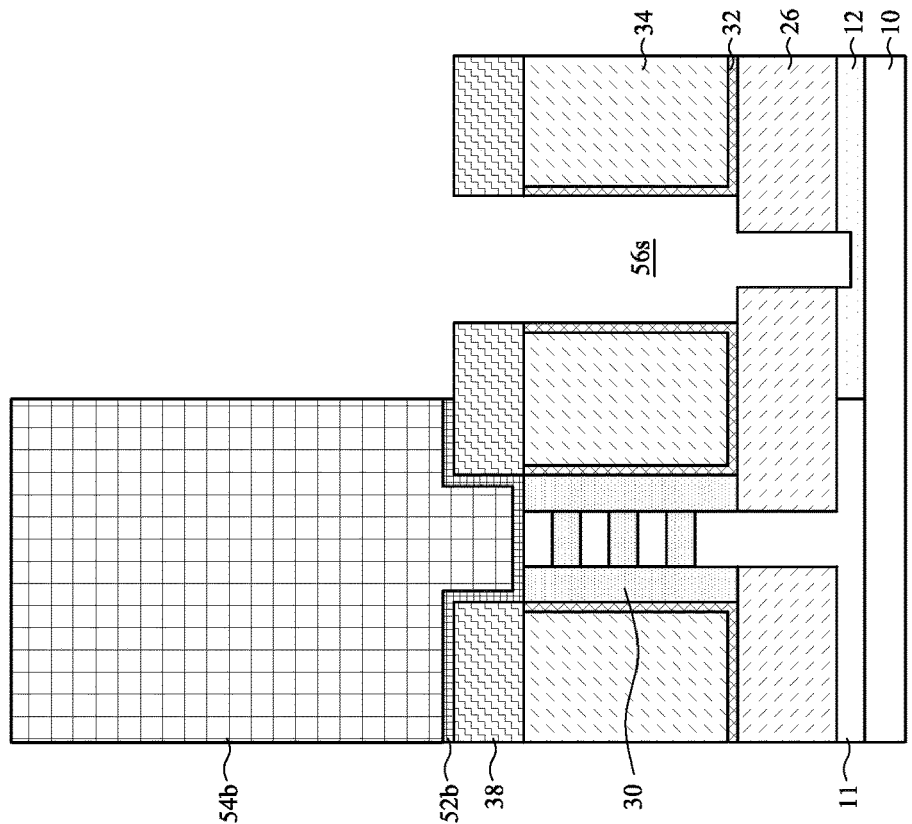

After formation of the patterned photoresist layer 54b and patterned sacrificial liner 52b, suitable dry etching and/or wet etching is performed to remove at least part of exposed well portion 20w of the semiconductor fin 20 to deepen the source/drain recess 56s, as shown in FIGS. 13A and 13C. In some embodiments, a bottom surface 56b' of the source/drain recess 56s has a concave profile, as shown in FIG. 13A. In some embodiments, the profile of the bottom surface 56b' of the source/drain recess 56s is substantially similar to that of the bottom surface 56b of the source/drain recess 56d.

After recessing the well portion 20w, the patterned photoresist layer 54b is removed to expose the patterned sacrificial liner 52b. The patterned sacrificial liner 52b functions as a hard mask during formation of the backside contact alignment feature 60n.

Figure 14B:
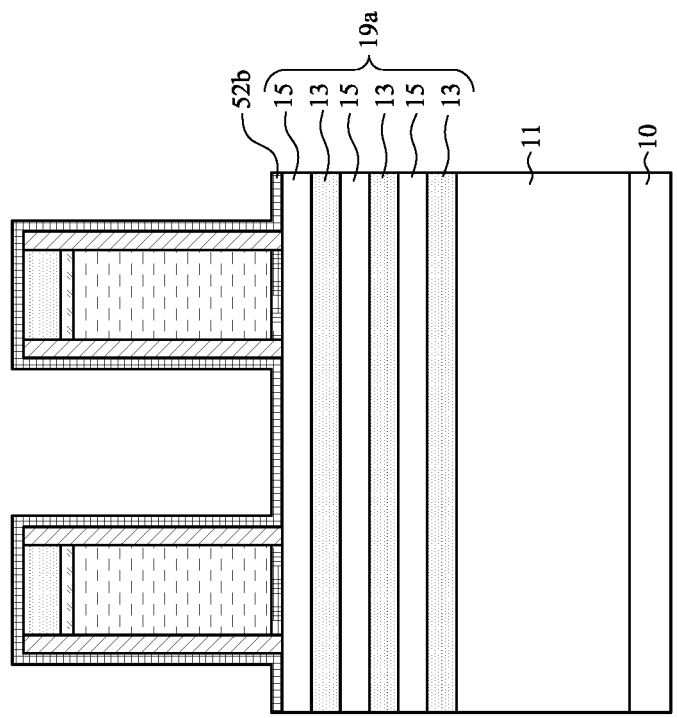
Figure 14A:
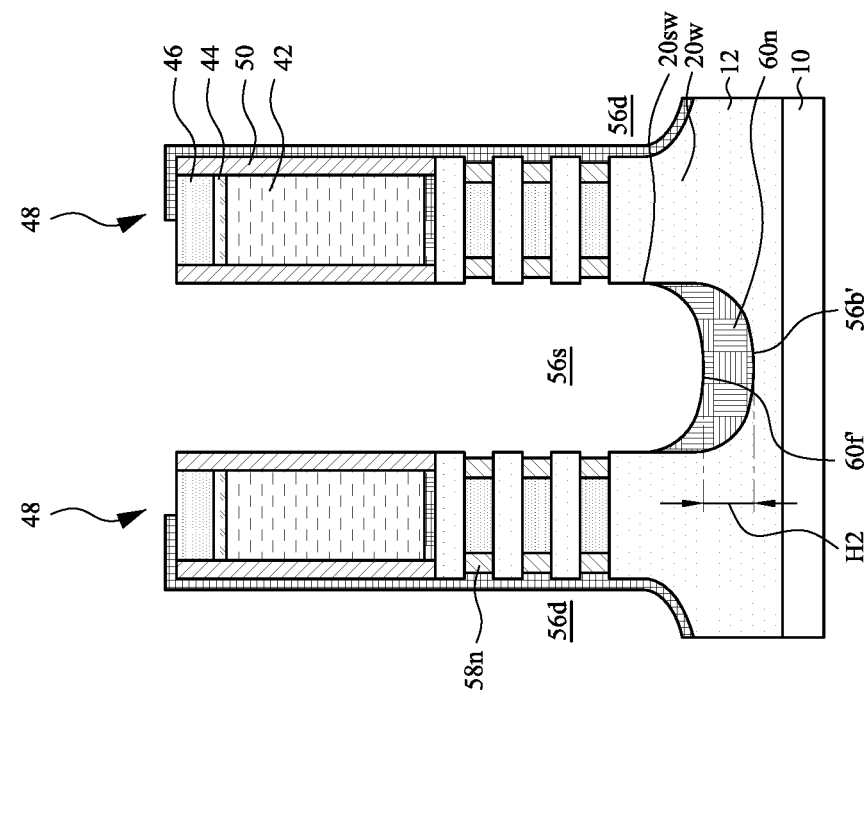
Figure 14D:
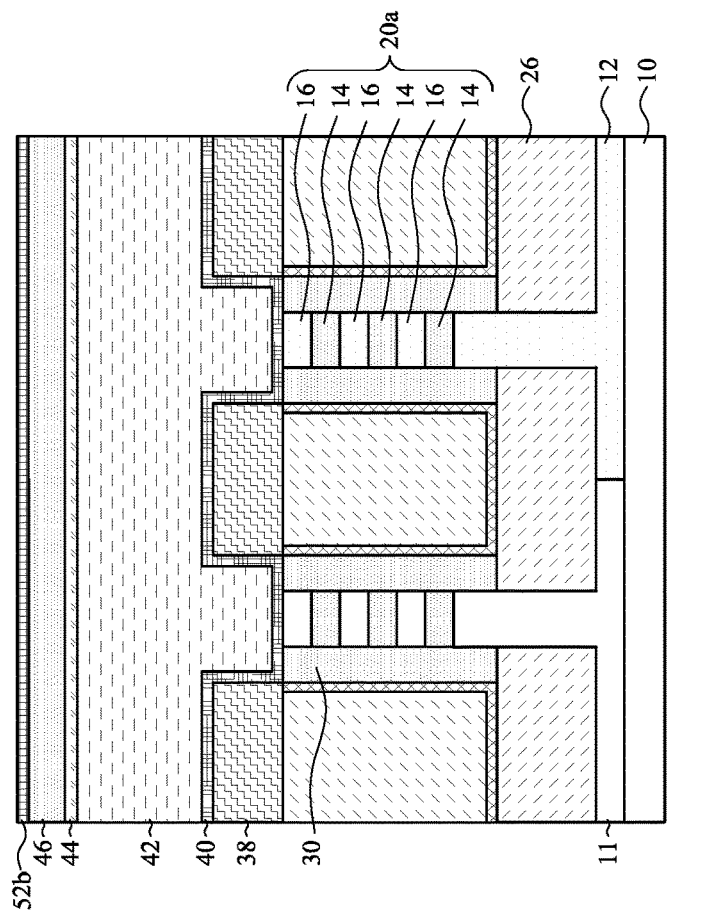
Figure 14C:
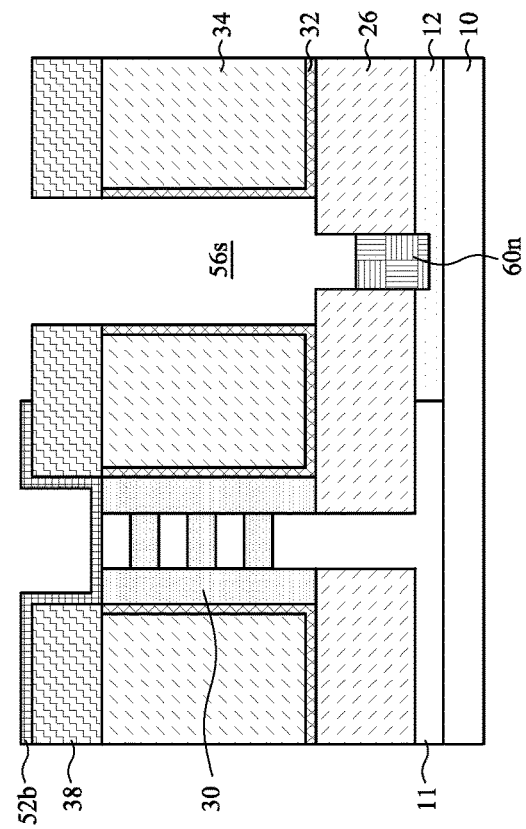

The backside contact alignment feature 60n may be formed by any suitable method, such as by CVD, CVD epitaxy, molecular beam epitaxy (MBE), or any suitable deposition technique. In some embodiments, the backside contact alignment feature 60n is formed by a bottom up deposition process. As shown in FIG. 14A, the backside contact alignment feature 60n grows in a bottom up fashion along semiconductor materials on sidewalls 20sw of the well portion 20w. A front surface 60f of the backside contact alignment feature 60n substantially maintains the profile of the bottom surface 56b' of the source/drain recess 56s. In some embodiments, each backside contact alignment feature 60n has a height "H2". In some embodiments, the height H2 is in a range between about 10 nm and about 30 nm. In some embodiments, the height H2 of the backside contact alignment feature 60n may be controlled by controlling deposition time.

During backside process, the material in the backside contact alignment feature 60n allows portions of the semiconductor fin 20 to be selectively removed. Additionally, the backside contact alignment feature 60n can be selectively removed without etching the dielectric materials in the isolation layer 26. Because the backside contact alignment feature 60n will be removed to form backside contact holes in the substrate 10 at a later stage, the backside contact alignment feature 60n is formed from a material to have etch selectivity relative to the material of the substrate 10, the material in the well portion 20w of the semiconductor fin 20 and the insulating material in the isolation layer 26.

The backside contact alignment feature 60n may be an undoped semiconductor material. In some embodiments, the backside contact alignment feature 60n may include SiGe, such as a single crystal SiGe material. In some embodiments, the backside contact alignment feature 60n is formed from SiGe having a germanium composition percentage between about 50% and 95%. Alternatively, the backside contact alignment feature 60n may include other materials such as Si, Ge, a compound semiconductor such as SiC, GeAs, GaP, InP, InAs, and/or InSb, an alloy semiconductor such as GaAsP, AlInAs, AlGaAs, InGaAs, GaInP, and/or GaInAsP, or combinations thereof.

After the formation of the backside contact alignment feature 60n, the patterned sacrificial liner 52b is removed.

In operation 120, an epitaxial buffer layer 62n is formed in the source/drain recesses 56s, 56d as shown in FIGS. 15A-15D. Prior to forming the backside contact alignment feature 60n, a patterned sacrificial liner 52c is formed to expose the source/drain recesses 56d, 56s. The sacrificial liner 52c may be similar to the sacrificial liner 52a.

The epitaxial buffer layer 62n may be formed by any suitable method, such as by CVD, CVD epitaxy, molecular beam epitaxy (MBE), or any suitable deposition technique. In some embodiments, the epitaxial buffer layer 62n is formed by a bottom up epitaxial deposition process. For example, the epitaxial buffer layer 62n grows in a bottom up fashion along semiconductor materials on the sidewalls 20sw of the well portion 20w until a front surface 62f reaches the bottom most of the inner spacer 58n, and the front surface 62f has a profile substantially similar to the front surface 60f of the backside contact alignment feature 60n or the bottom surface 56b' of the source/drain recess 56s. When the front surface 62f reaches the inner spacer 58n, the bottom up epitaxial deposition process changes as the inner spacer 58n is made of dielectric material. Further deposition mainly results from epitaxial growth of the semiconductor material on the front surface 62f and the profile of the front surface 62f may gradually change from concave to convex as deposition continues.

The thickness of the epitaxial buffer layer 62n and/or profile of the front surface 62f of the epitaxial buffer layer 62n can be controlled by controlling process time. In some embodiments, the front surface 62f of the epitaxial buffer layer 62n is a concave surface. As shown in FIG. 15A, the front surface 62f has a concave profile in the x-z plane. In the embodiment of FIG. 15A, the epitaxial buffer layer 62n is formed in bottom up in the source/drain recess 56s or 56d between two gate stacks 48. Because the front surface 62f is concave, edge regions of the epitaxial buffer layer 62n is at a level near the top of the well portion 20w along the z-direction while a center portion of the epitaxial buffer layer 62n drops below the top of the well portion 20w.

The epitaxial buffer layer 62n may have a thickness T1 near the center portion. In some embodiments, the thickness T1 is in a range between about 15 nm and about 25 nm. If the thickness T1 is below 15 nm, the epitaxial buffer layer 62n may not be thick enough to function as an etch stop layer. If the thickness T1 is greater than 25 nm, the dimension of the device may be increased without obvious additional advantages.

During removal of the material in the well portion 20w of the semiconductor fin 20 at backside processing, the material in the epitaxial buffer layer 62n services as an etch stop to protect the source/drain feature for n-type device to be formed on the butter layer 62n. In some embodiments, the epitaxial buffer layer 62n may include SiGe, such as a single crystal SiGe material. In some embodiments, the epitaxial buffer layer 62n is formed from SiGe having a germanium composition percentage between about 25% and 95%. Alternatively, the backside contact alignment feature 60n may include other materials such as Si, Ge, a compound semiconductor such as SiC, GeAs, GaP, InP, InAs, and/or InSb, an alloy semiconductor such as GaAsP, AlInAs, AlGaAs, InGaAs, GaInP, and/or GaInAsP, or combinations thereof.

In operation 122, a transitional epitaxial layer 64n and an epitaxial source/drain features 66n are formed. After formation of the epitaxial buffer layer 62n, the transitional epitaxial layer 64n is formed over the epitaxial buffer layer 62n. The transitional epitaxial layer 64n may be formed by any suitable method, such as by CVD, CVD epitaxy, molecular beam epitaxy (MBE), or any suitable deposition technique.

The transitional epitaxial layer 64n can serve to gradually change the lattice constant from that of the epitaxial buffer layer 62n to that of the source/drain features 66n. In some embodiments, the transitional epitaxial layer 64n may be a semiconductor material with a lattice structure similar to the semiconductor material configured to function as a source/drain feature for a n-type device. In some embodiments, the transitional epitaxial layer 64n may be a semiconductor material includes n-type dopants at a dopant concentration lower than a dopant concentration used in a source/drain feature. The transitional epitaxial layer 64n may include one or more layers of Si, SiA, SiP, SiC and SiCP. The transitional epitaxial layer 64n also include n-type dopants, such as phosphorus (P), arsenic (As), etc. In some embodiments, the transitional epitaxial layer 64n may be a Si layer includes phosphorus dopants. In some embodiments, the transitional epitaxial layer 64n includes a dopant concentration of between about 5E17 atoms/cm$^3$ and about 1E21 atoms/cm$^3$.

As shown in FIG. 15A, the transitional epitaxial layer 64n is a thin layer material formed over the epitaxial buffer layer 62n. The profile of the transitional epitaxial layer 64n is substantially similar to the front surface 62f of the epitaxial buffer layer 62n. In some embodiment, the transitional epitaxial layer 64n has a concave profile in the x-z plane. In the embodiment of FIG. 15A, edge regions of transitional epitaxial layer 64n contact the inner spacers 58n while a center portion of the transitional epitaxial layer 64n drops below the top of the well portion 20w. As discussed below, the concave profile of the transitional epitaxial layer 64n allows a bottom surface 66b of the source/drain feature 66n to be convex, thus providing a wider landing window for backside contact hole formation.

In some embodiments, the transitional epitaxial layer 64n may have a thickness in a range between about 2 nm and about 8 nm. If the thickness of the transitional epitaxial layer 64n is below 4 nm, the transitional epitaxial layer 64n may not be thick enough to function as lattice transitional layer between the epitaxial buffer layer 62n and the source/drain features 66n. If the thickness of epitaxial buffer layer 62n is greater than 8 nm, the dimension of the device may be increased without obvious additional advantages.

Figure 15D:
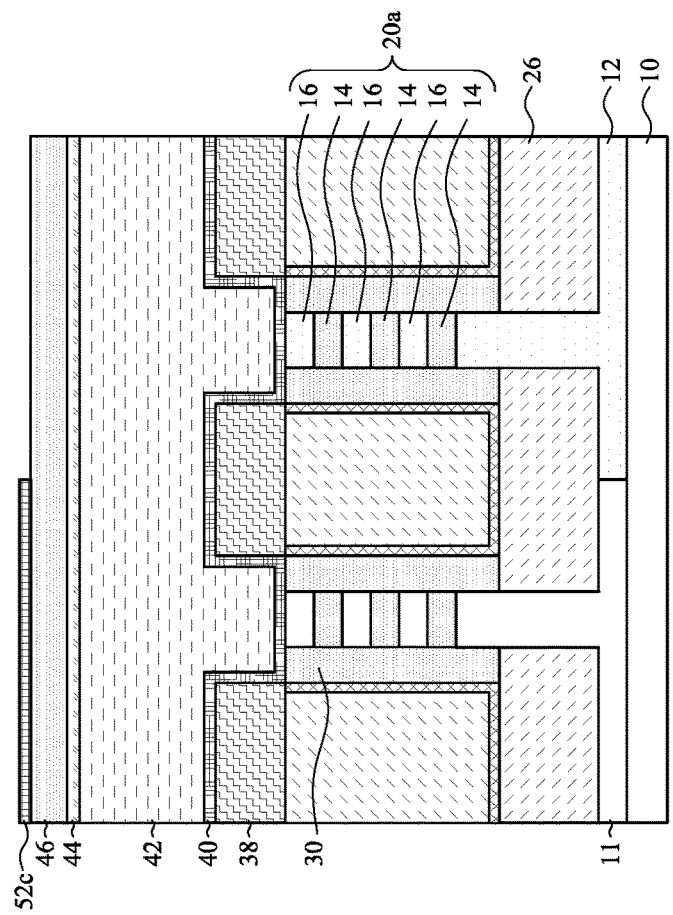
Figure 15C:
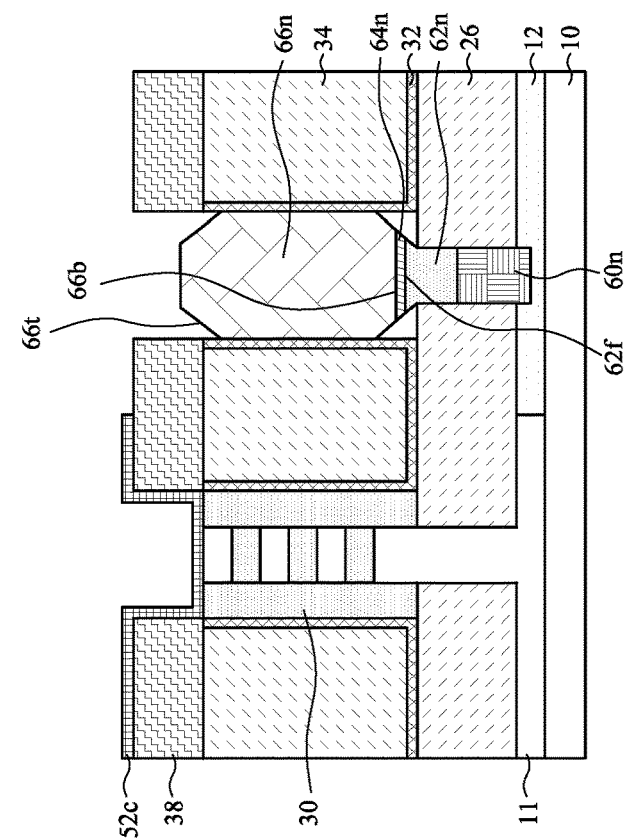

After formation of the transitional epitaxial layer 64n, the epitaxial source/drain features 66n for n-type devices are formed in the source/drain recesses 56s, 56d, as shown in FIGS. 15A and 15C. The epitaxial source/drain features 66n are formed over the transitional epitaxial layers 64n within the source/drain recesses 56s, 56d. The epitaxial source/drain features 66n may include one or more layers of Si, SiP, SiC and SiCP. The epitaxial source/drain features 66n also include n-type dopants, such as phosphorus (P), arsenic (As), etc. In some embodiments, the epitaxial source/drain features 66n may be a Si layer includes phosphorus dopants. The dopant concentration in the epitaxial source/drain features 66n is higher than that of the transitional epitaxial layers 64n. In some embodiments, the epitaxial source/drain features 66n includes a dopant concentration of between about 5E18 atoms/cm$^3$ and about 3E21 atoms/cm$^3$.

A bottom surface 66b of the epitaxial source/drain features 66n matches the profile of the transitional epitaxial layers 64n. In the embodiment shown in FIGS. 15A and 15C, the bottom surface 66b of the epitaxial source/drain features 66n has a convex profile. A top surface 66t of the epitaxial source/drain features 66n may be shaped according to the natural facets of the epitaxially formed semiconductor material. Sidewalls 66sw of the epitaxial source/drain features 66n are in contact with the inner spacers 58n and the second semiconductor layers 16.

After formation of the epitaxial source/drain features 66n, the sacrificial liner 52c may be removed so that p-type device region can be processed.

Figure 16D:
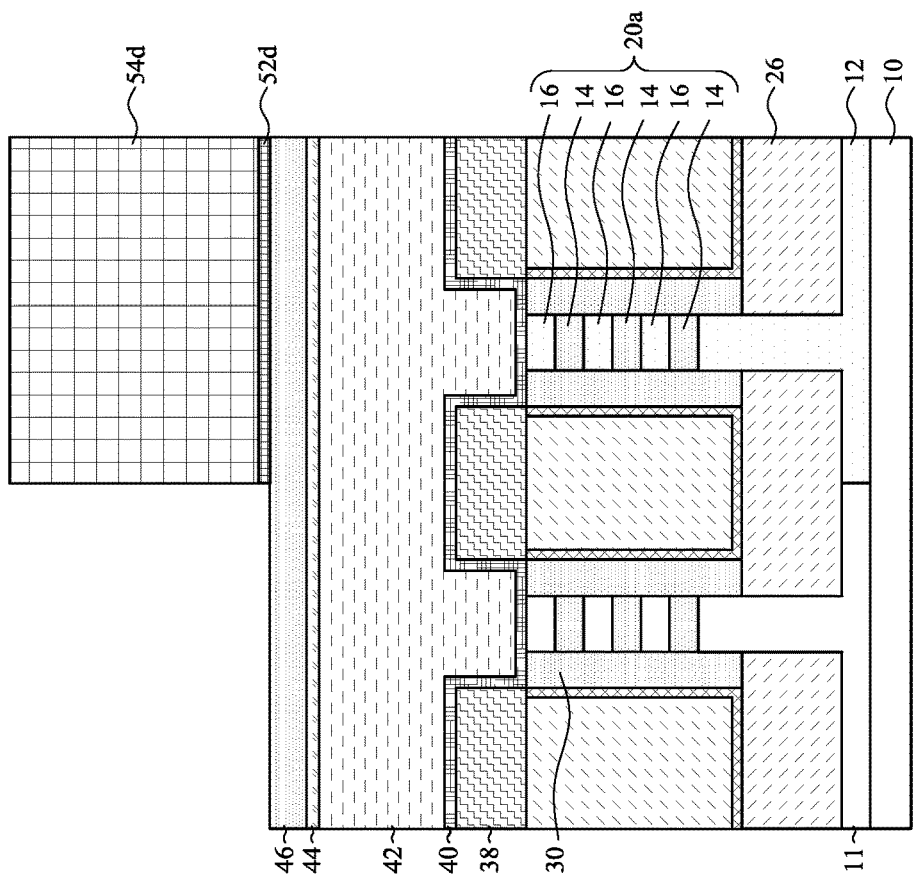
Figure 16C:
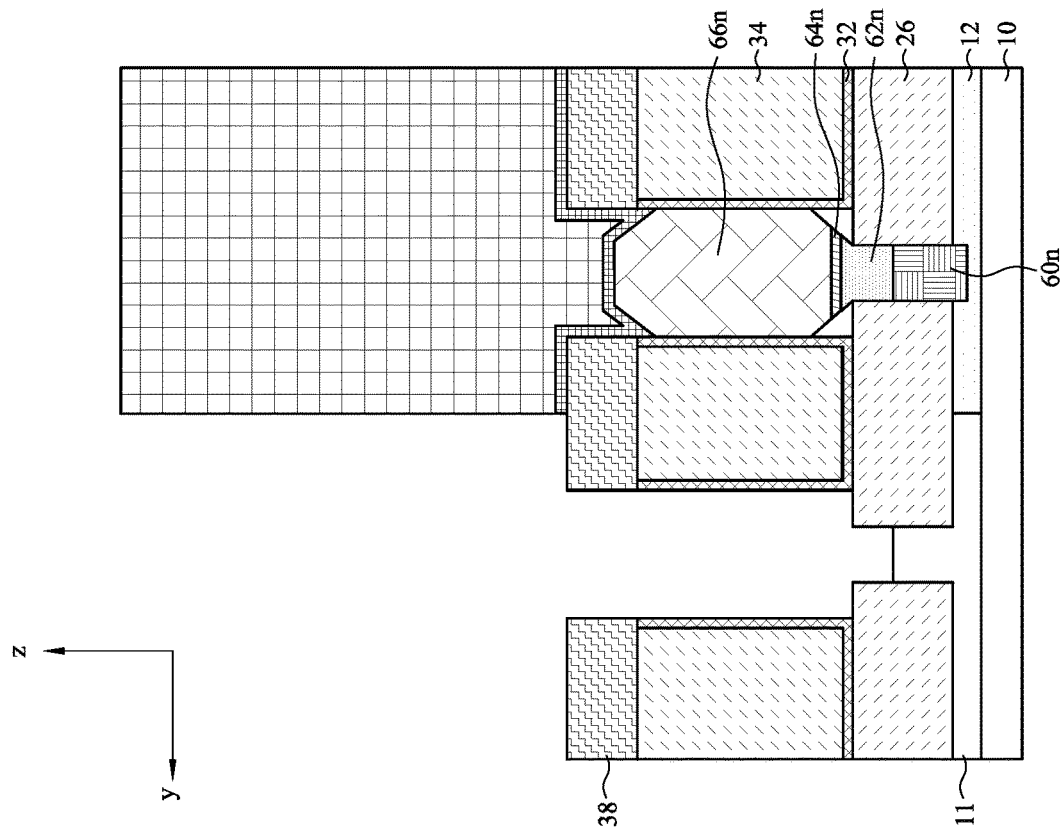
Figure 17D:
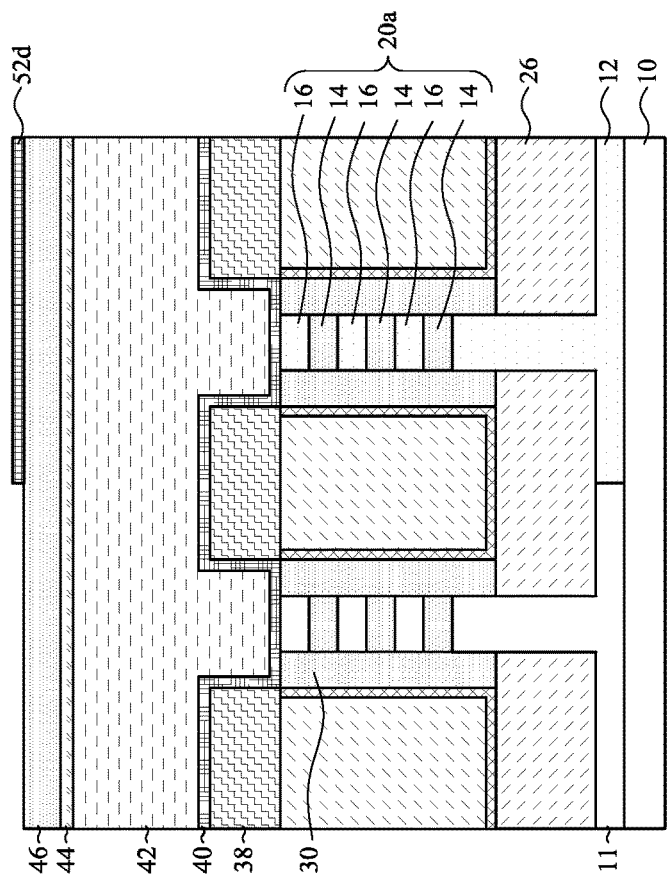
Figure 17C:
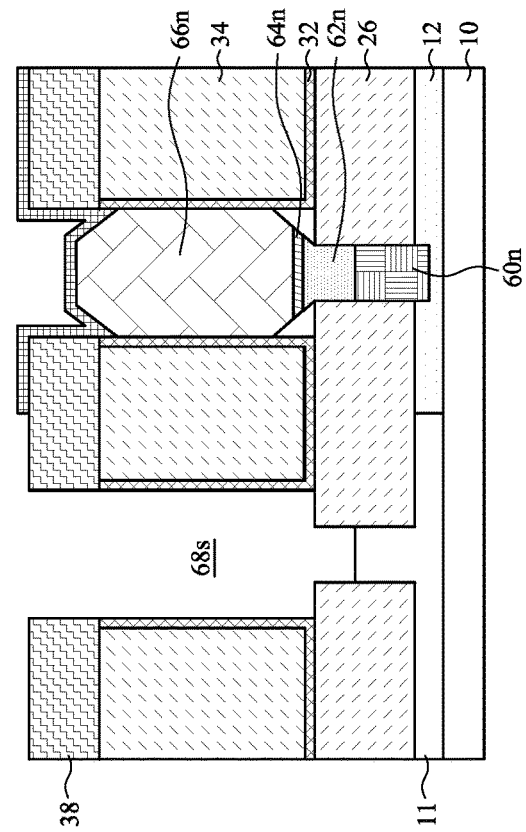

In operation 124, source/drain recesses 68d, 68s (collectively 68) are formed over the n-well 11, on which p-type devices are to be formed, as shown in FIG. 16A-16D. A sacrificial liner 52d and a photoresist layer 54d are formed and patterned to expose regions over the n-well 11 for processing. The photoresist layer 54d may be similar to the photoresist layer 54a and the sacrificial liner 52d may be similar to the sacrificial liner 52a in operation 114. The semiconductor fin 19 on opposite sides of the sacrificial gate structure 48 and the cladding layer 30 on the semiconductor fin 19 are etched forming source/drain recesses 68d, 68s between the neighboring hybrid fins 36 on either side of the sacrificial gate structure 48 as shown in FIGS. 16B and 16D. In some embodiments, the source/drain recesses 68d indicates the cavity where a drain feature is to be formed and the source/drain recesses 68s indicates the cavity where a source feature is to be formed. It should be noted that source feature and drain feature can be used interchangeably.

The cladding layer 30, the third semiconductor layers 13 and the fourth semiconductor layers 15 in the semiconductor fin 19 are etched down on both sides of the sacrificial gate structure 48 using etching operations. In some embodiments, suitable dry etching and/or wet etching may be used to remove the third semiconductor layers 13, the fourth semiconductor layer 15, and the n-well 11, together or separately.

In some embodiments, all layers in the active portion 19a of the semiconductor fins 19 and part of the well portion 19w of the semiconductor fin 19 are removed to form the source/drain recesses 68s, 68d. The well portion 19w of the semiconductor fin 19 is partially etched so that the source/drain recesses 68s, 68d extend into the isolation layer 26, as shown in FIG. 16B. The source/drain recesses 68s, 68d are formed on opposite ends of the remaining well portion 19w and active portion 19a of the semiconductor fin 19 as shown in FIG. 16B. Source/drain features are to be formed in the source/drain recesses 68s, 68d, forming a p-type device with the semiconductor material in the remaining well portion 19w and active portion 19a of the semiconductor fin 19 as channel regions.

In some embodiments, the source/drain recesses 68s, 68d extend into the well portion 19w of the semiconductor fin 19. In some embodiments, a bottom surface 68b of the source/drain recess 68s, 68d has a concave profile, as shown in FIG. 16B. The bottom surface 68b of the source/drain recesses 68s, 68d is at a depth H3 in the well portion 18w of the semiconductor fin 19. The depth H3 allows the buffer layer to be formed in the source/drain recesses 68s, 68d and also allows a bottom surface of the source/drain feature to be formed to have a convex profile as discussed later. In some embodiments, the depth H3 is in a range between about 20 nm and about 30 nm. If the depth H3 is below 20 nm, the buffer layer to be formed may not be thick enough to function as an etch stop layer. If the depth H3 is greater than 30 nm, the dimension of the device may be increased without obvious additional advantages.

In operation 126, inner spacers 58p are formed as shown in FIGS. 17A-17D. Prior to forming the inner spacers 58p, the photoresist layer 54d may be removed exposing the patterned sacrificial liner 52d to protect regions over the n-well 11.

Exposed ends of the third semiconductor layers 13 and the cladding layers 30 are first etched to form spacer cavities for the inner spacers 58p. The third semiconductor layers 13 and cladding layer 30 exposed to the source/drain recesses 68s, 68d are first etched horizontally along the X direction to form cavities. In some embodiments, the third semiconductor layers 13 can be selectively etched by using a wet etchant such as, but not limited to, ammonium hydroxide (NH₄OH), tetramethylammonium hydroxide (TMAH), ethylenediamine pyrocatechol (EDP), or potassium hydroxide (KOH) solutions. In some embodiments, an etching thickness of the third semiconductor layer 13 and the cladding layer 30 is in a range between about 2 nm and about 10 nm along the X direction.

After forming the spacer cavities by etching the third semiconductor layers 13 and the cladding layer 30, the inner spacers 58p are formed in the spacer cavities by conformally deposit and then partially remove an insulating layer. The insulating layer can be formed by ALD or any other suitable method. The subsequent etch process removes most of the insulating layer except inside the cavities, resulting in the inner spacers 58p. In some embodiments, the fourth semiconductor layers 15 may extend from the inner spacers 58p. In some embodiments, the inner spacers 58p may include one of silicon nitride (SiN) and silicon oxide (SiO₂), SiONC, or a combination thereof. The inner spacers 58p have a thickness along the X direction in a range from about 4 nm to about 7 nm.

After the formation of the inner spacers 58p, the patterned sacrificial liner 52d is removed.

In operation 128, backside contact alignment feature 60p is formed by removing a portion of the well portion 19w in the semiconductor fin 19 and refilling the well portion 19w with a semiconductor material, as shown in FIGS. 18A-18D and FIGS. 19A-19D. The backside contact alignment feature 60p is selectively formed under the source/drain recess 68s where a source/drain feature formed therein is to be connected to a backside power rail.

Prior to forming the backside contact alignment feature 60p, a patterned photoresist layer 54e and patterned sacrificial liner 52e are formed to expose the source/drain recess 68s. The photoresist layer 54e may be similar to the photoresist layer 54a and the sacrificial liner 52e may be similar to the sacrificial liner 52a.

Figure 18B:
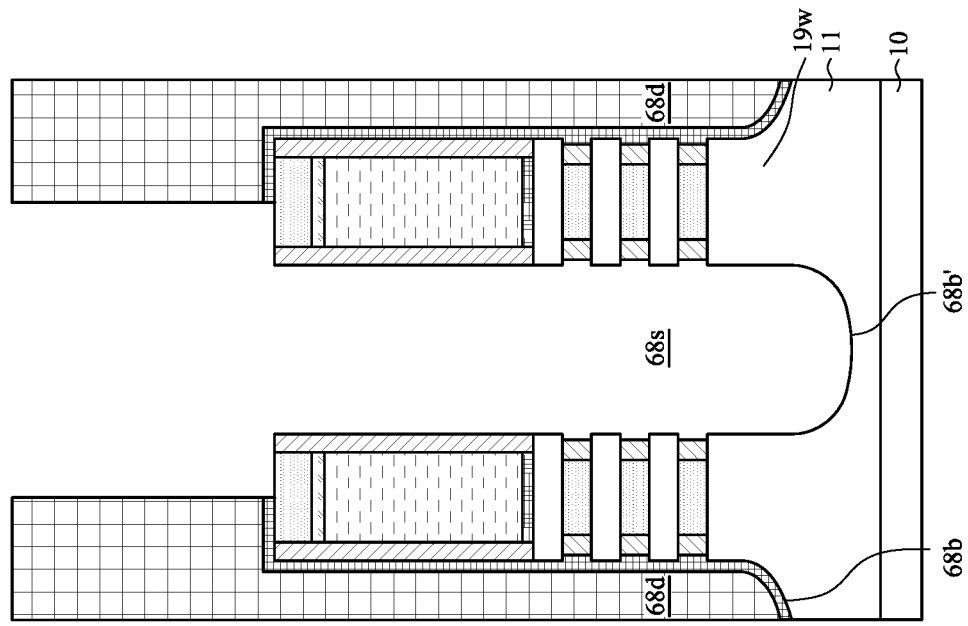
Figure 18A:
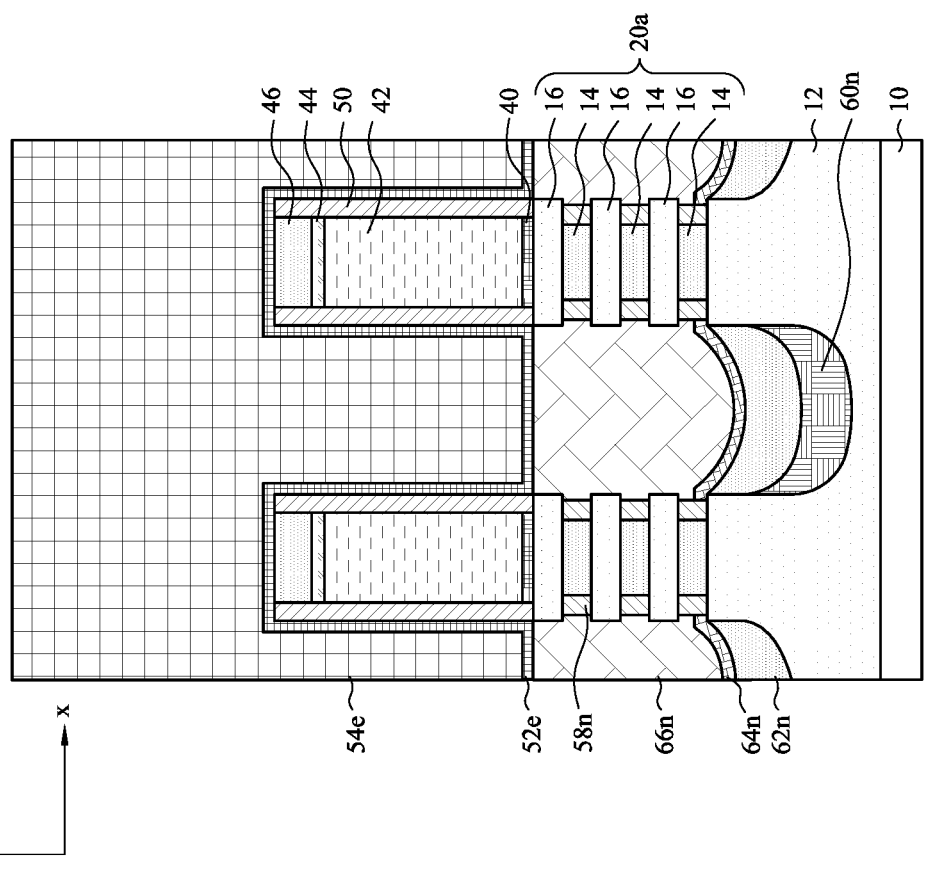
Figure 18D:
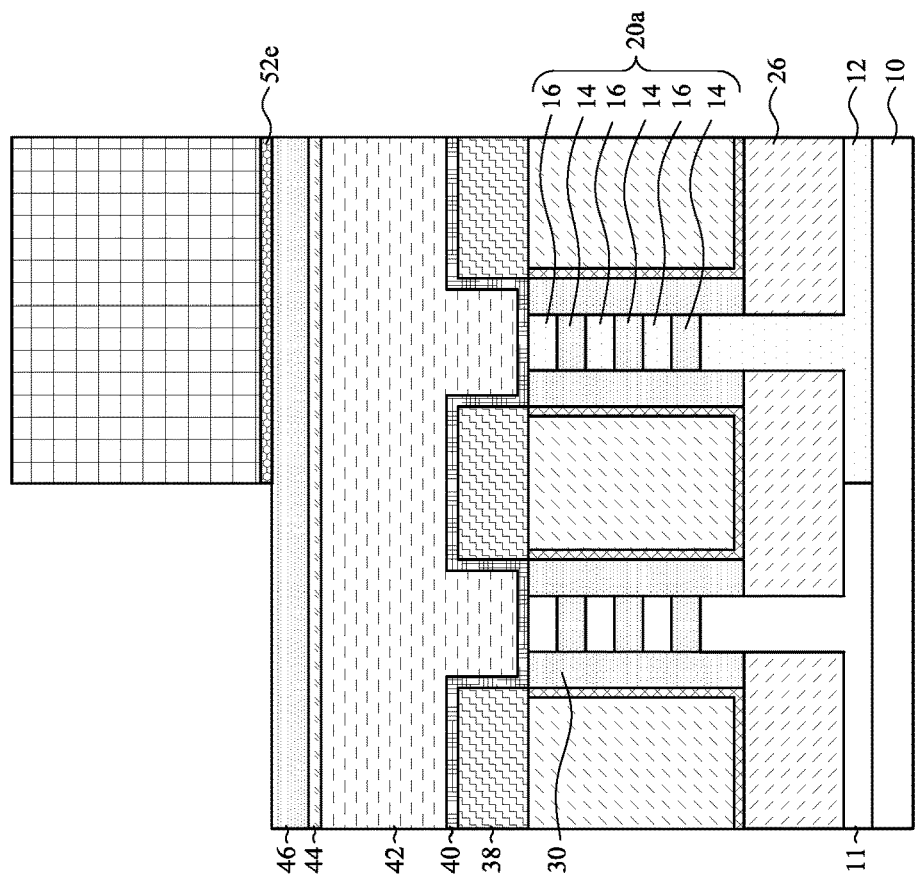
Figure 18C:
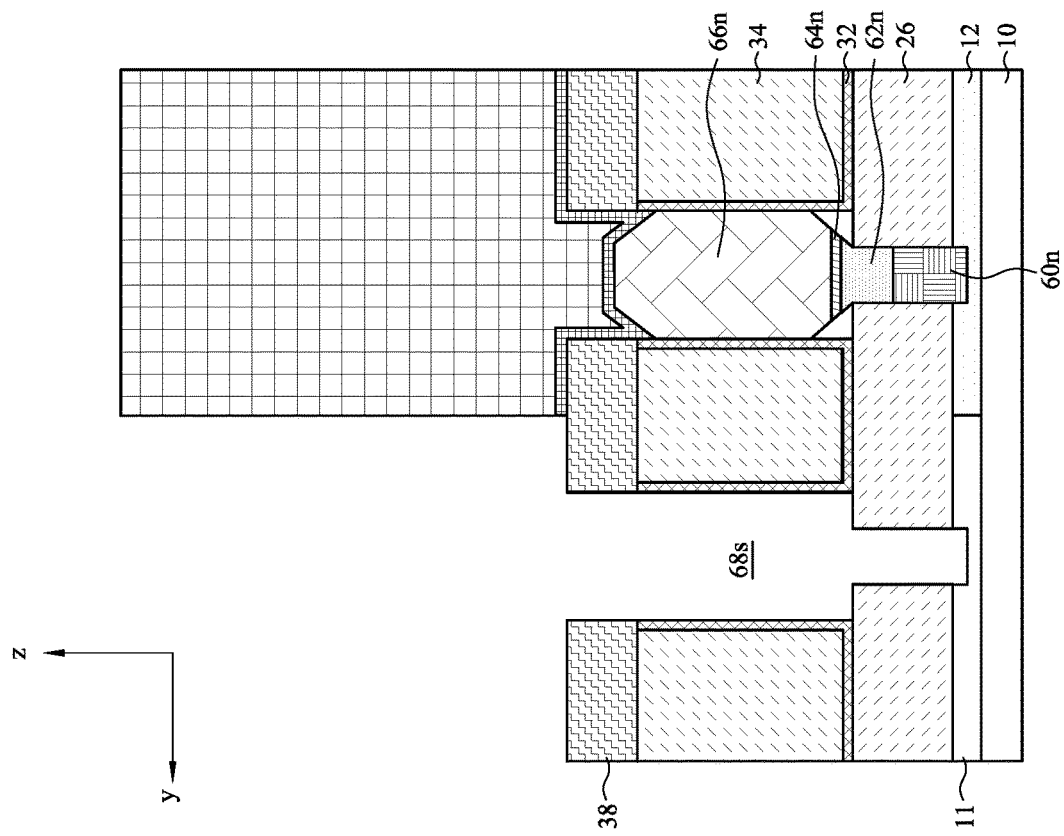

After formation of the patterned photoresist layer 54e and patterned sacrificial liner 52e, suitable dry etching and/or wet etching is performed to remove at least part of exposed well portion 19w of the semiconductor fin 19 to deepen the source/drain recess 68s, as shown in FIGS. 18B and 18D. In some embodiments, a bottom surface 68b' of the source/drain recess 68s has a concave profile, as shown in FIG. 18D. In some embodiments, the profile of the bottom surface 68b' of the source/drain recess 68s is substantially similar to that of the bottom surface 68b of the source/drain recess 58d.

After recessing the well portion 19w, the patterned photoresist layer 54e is removed to expose the patterned sacrificial liner 52e. The patterned sacrificial liner 52e functions as a hard mask during formation of the backside contact alignment feature 60p.

Figure 19B:
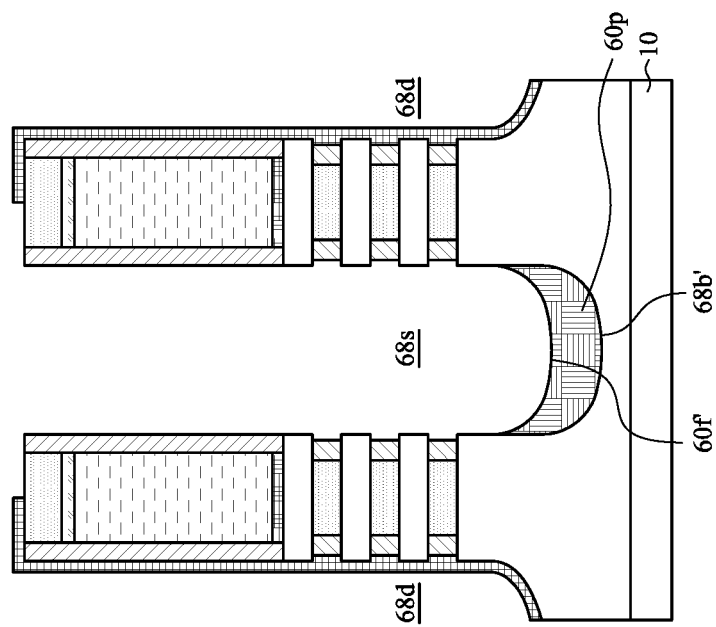
Figure 19A:
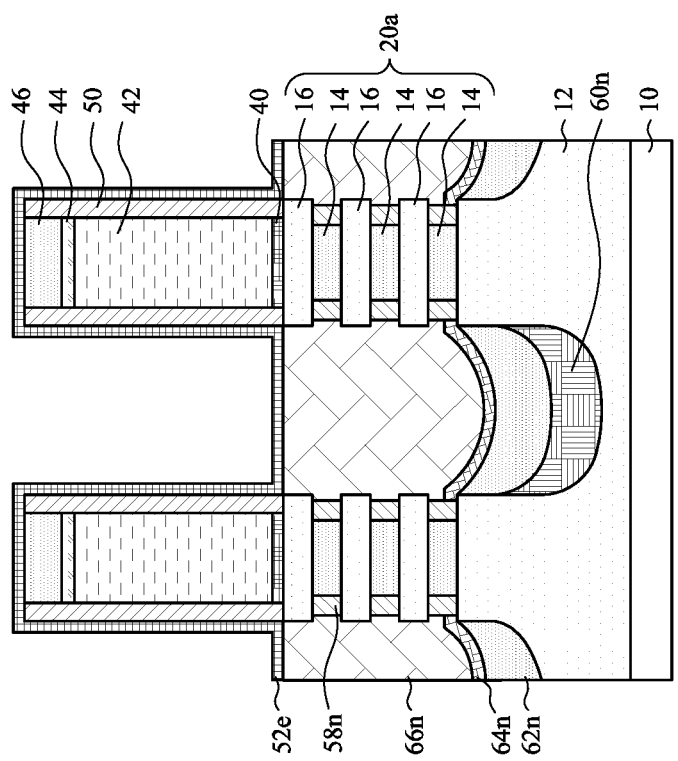
Figure 19D:
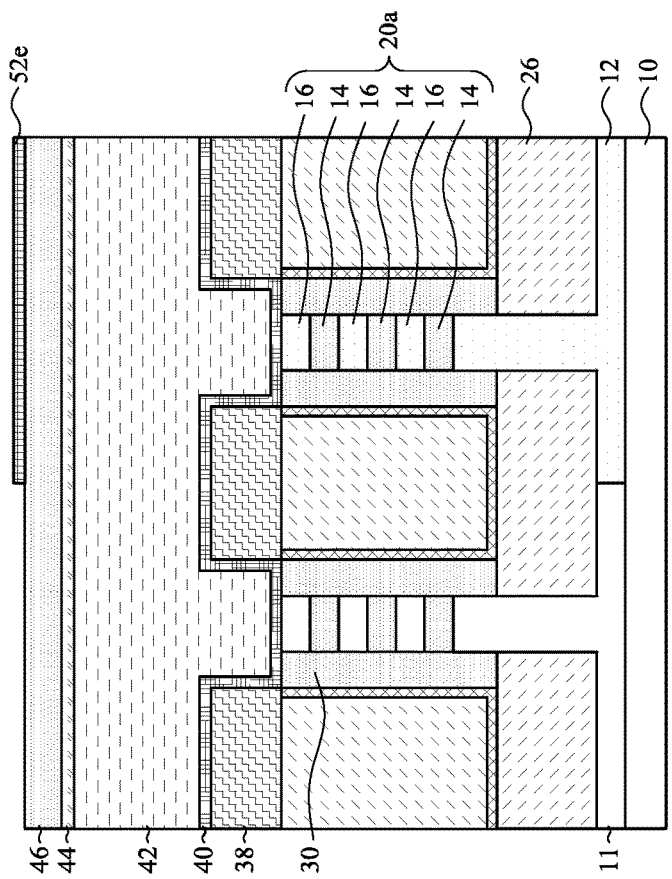
Figure 19C:
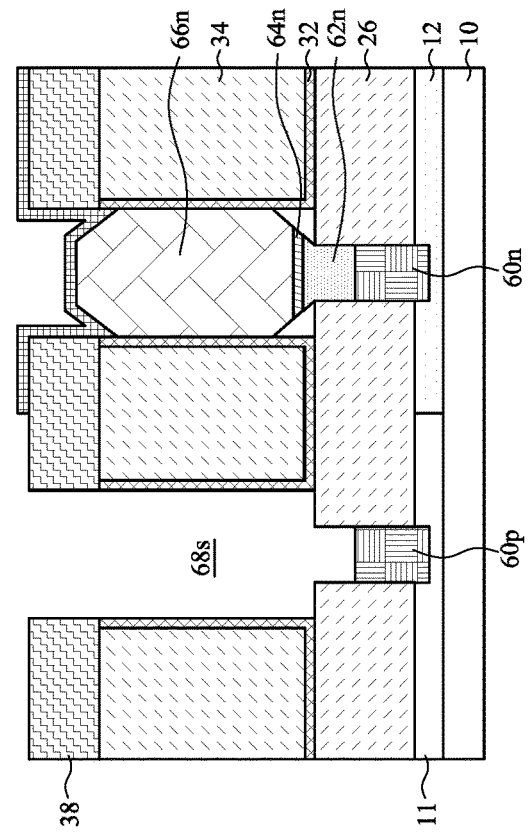

The backside contact alignment feature 60p may be formed by any suitable method, such as by CVD, CVD epitaxy, molecular beam epitaxy (MBE), or any suitable deposition technique. In some embodiments, the backside contact alignment feature 60p is formed by a bottom up deposition process. As shown in FIG. 19B, the backside contact alignment feature 60p grows in a bottom up fashion along semiconductor materials on sidewalls 19sw of the well portion 19w. A front surface 60f of the backside contact alignment feature 60p substantially maintains the profile of the bottom surface 68b' of the source/drain recess 68s. In some embodiments, each backside contact alignment feature 60p has the same height H2 as the backside contact alignment feature 60n.

During backside process, the material in the backside contact alignment feature 60p allows portions of the semiconductor fin 19 to be selectively removed. Additionally, the backside contact alignment feature 60p can be selectively removed without etching the dielectric materials in the isolation layer 26. Because the backside contact alignment feature 60p will be removed to form backside contact holes in the substrate 10 at a later stage, the backside contact alignment feature 60p is formed from a material to have etch selectivity relative to the material of the substrate 10, the material in the well portion 19w of the semiconductor fin 19 and the insulating material in the isolation layer 26. The backside contact alignment feature 60p may be an undoped semiconductor material. In some embodiments, the backside contact alignment feature 60p may include SiGe, such as a single crystal SiGe material. In some embodiments, the backside contact alignment feature 60p and the backside contact alignment feature 60n are formed from the same material. After the formation of the backside contact alignment feature 60p, the patterned sacrificial liner 52e is removed.

In operation 130, an epitaxial buffer layer 62p and epitaxial source/drain features 66p are formed in the source/drain recesses 68s, 68d as shown in FIGS. 20A-20D. Prior to forming the backside contact alignment feature 60p, a patterned sacrificial liner 52f is formed to expose the source/drain recesses 68d, 68s. The sacrificial liner 52f may be similar to the sacrificial liner 52a.

The epitaxial buffer layer 62p may be formed by any suitable method, such as by CVD, CVD epitaxy, molecular beam epitaxy (MBE), or any suitable deposition technique. In some embodiments, the epitaxial buffer layer 62p is formed by a bottom up epitaxial deposition process. For example, the epitaxial buffer layer 62p grows in a bottom up fashion along semiconductor materials on the sidewalls 19sw of the well portion 19w until a front surface 62f reaches the bottom most of the inner spacer 58p, and the front surface 62f has a profile substantially similar to the front surface 60f of the backside contact alignment feature 60n or the bottom surface 68b' of the source/drain recess 68s. When the front surface 62f reaches the inner spacer 58p, the bottom up epitaxial deposition process changes as the inner spacer 58p is made of dielectric material. Further deposition mainly results from epitaxial growth of the semiconductor material on the front surface 62f and the profile of the front surface 62f may gradually change from concave to convex as deposition continues.

Figure 20B:
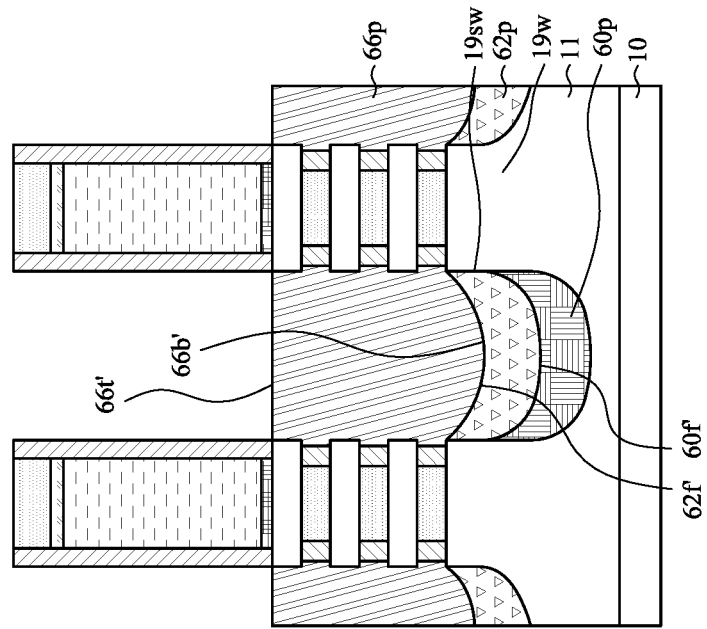
Figure 20A:
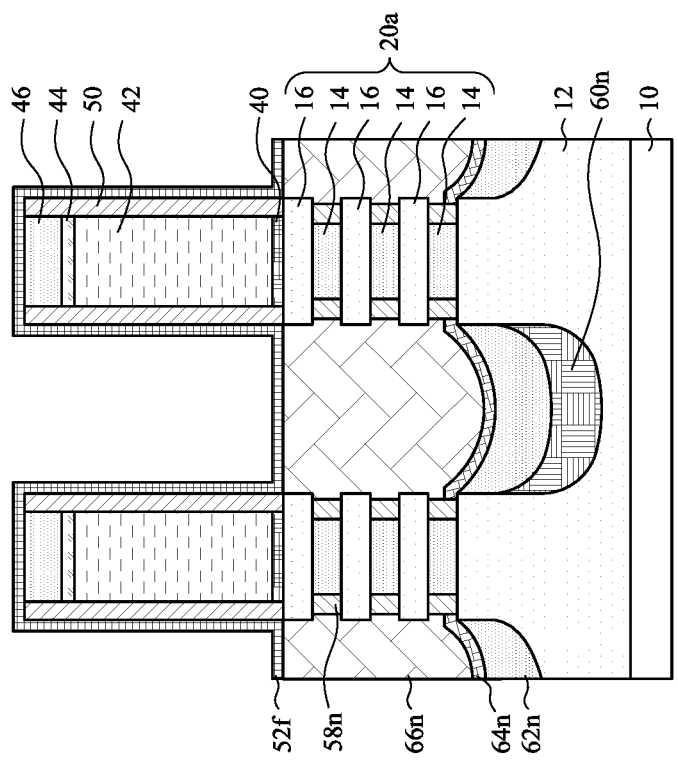

The thickness of the epitaxial buffer layer 62p and/or profile of the front surface 62f of the epitaxial buffer layer 62p can be controlled by controlling process time. In some embodiments, the front surface 62f of the epitaxial buffer layer 62p is a concave surface. As shown in FIG. 20B, the front surface 62f has a concave profile in the x-z plane. In the embodiment of FIG. 20B, the epitaxial buffer layer 62p is formed in bottom up in the source/drain recess 68s or 68d between two gate stacks 48. Because the front surface 62f is concave, edge regions of the epitaxial buffer layer 62p is at a level near the top of the well portion 19w along the z-direction while a center portion of the epitaxial buffer layer 62p drops below the top of the well portion 19w.

In some embodiments, the shape and dimension of the epitaxial buffer layer 62p may be similar to the shape and dimension of the epitaxial buffer layer 62n. In some embodiments, the thickness of the epitaxial buffer layer 62p near the center portion is in a range between about 15 nm and about 25 nm. If the thickness is below 15 nm, the epitaxial buffer layer 62p may not be thick enough to function as an etch stop layer. If the thickness is greater than 25 nm, the dimension of the device may be increased without obvious additional advantages.

During removal of the material in the well portion 19w of the semiconductor fin 19 at backside processing, the material in the epitaxial buffer layer 62p services as an etch stop to protect the source/drain feature for p-type device to be formed on the butter layer 62n. The epitaxial buffer layer 62p also serve to gradually change the lattice constant from that of the well portion 19w or that of the backside contact alignment feature 60p to that of the source/drain features 66p. In some embodiments, the epitaxial buffer layer 62p may be a semiconductor material with a lattice structure similar to the semiconductor material configured to function as a source/drain feature for a p-type device. In some embodiments, the transitional epitaxial layer 64p may be a semiconductor material includes p-type dopants at a dopant concentration lower than a dopant concentration used in a source/drain feature. In some embodiments, the epitaxial buffer layer 62p may be a semiconductor material includes p-type dopants at a dopant concentration lower than a dopant concentration in the source/drain feature 66p. The epitaxial buffer layer 62p may include one or more layers of Si, SiGe, Ge with p-type dopants, such as boron (B), for a p-type device, such as pFET. In some embodiments, the epitaxial buffer layer 62p may be SiGeB material, wherein boron is a dopant. In some embodiments, the epitaxial buffer layer 62p is a SiGeB layer with a boron concentration of between about 5E17 atoms/cm$^3$ and about 1E18 atoms/cm$^3$.

Figure 20D:
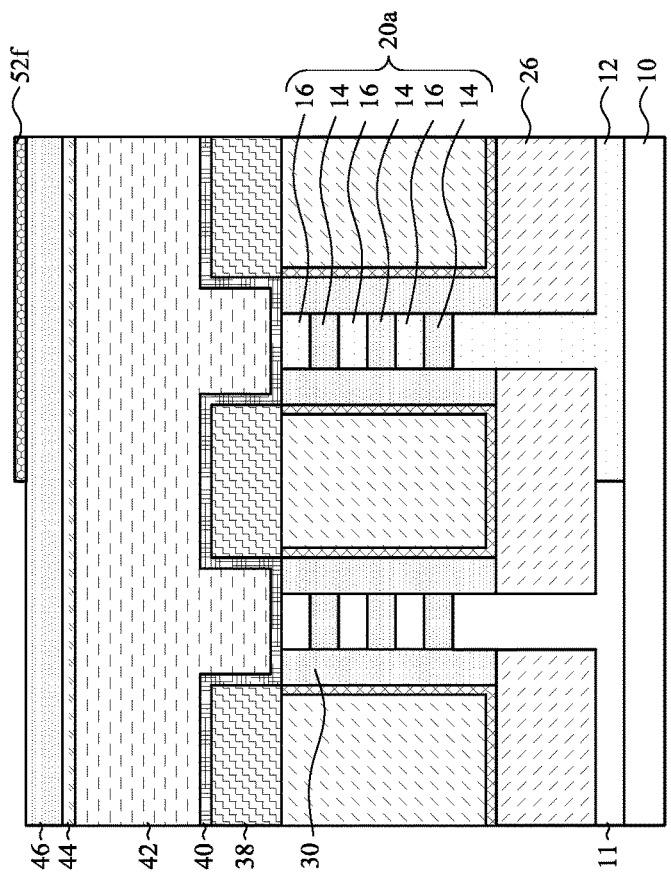
Figure 20C:
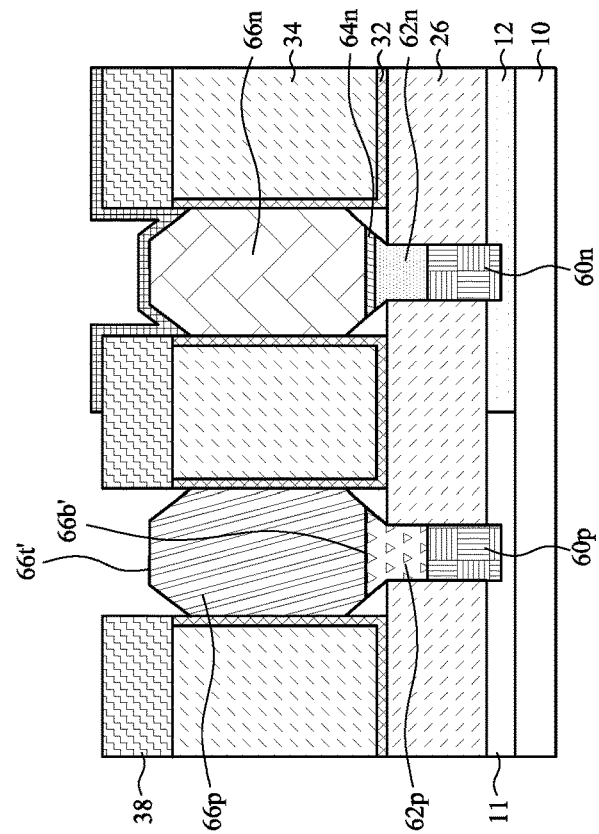
Figure 21B:
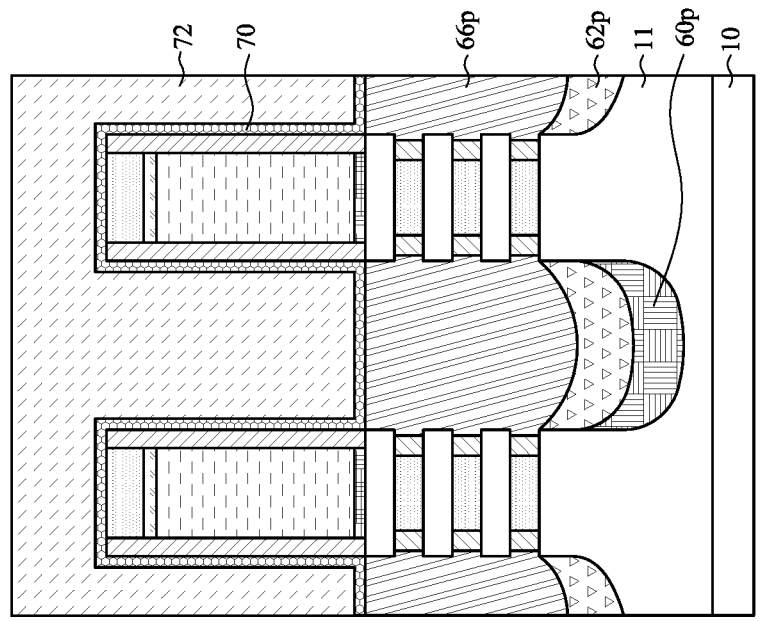
Figure 21A:
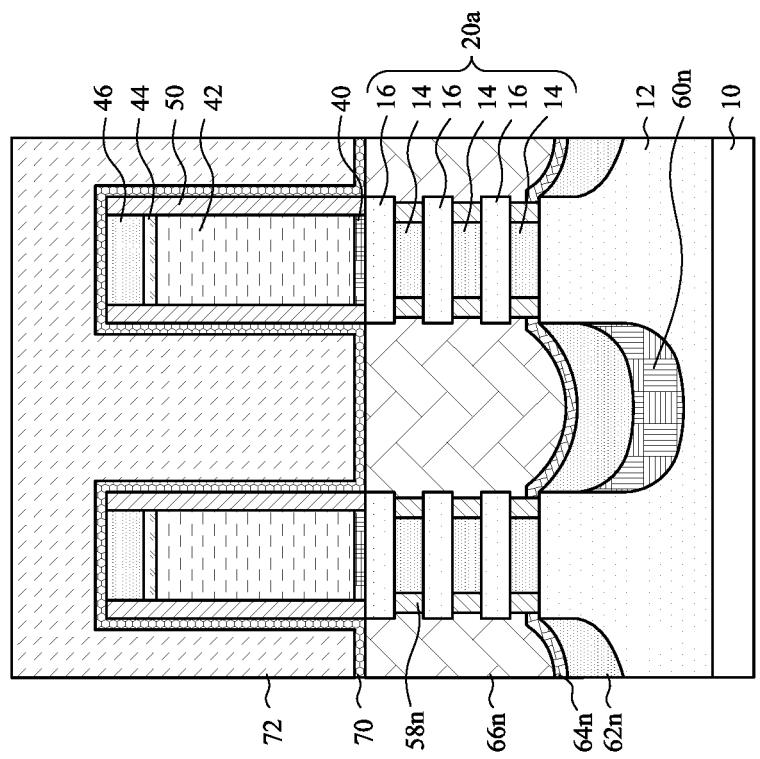
Figure 22B:
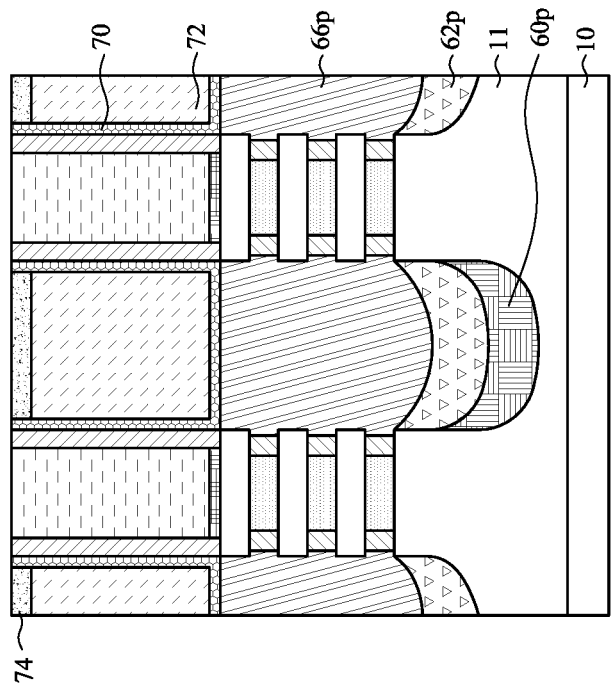
Figure 22A:
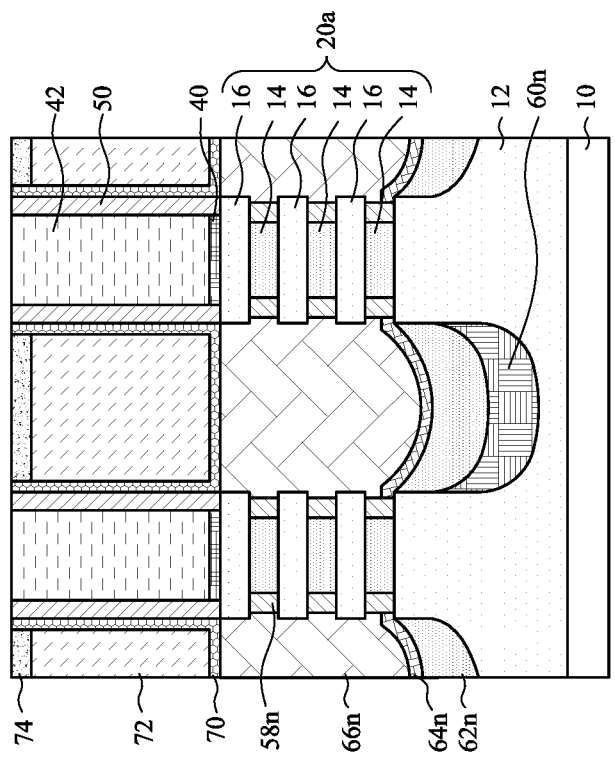
Figure 22D:
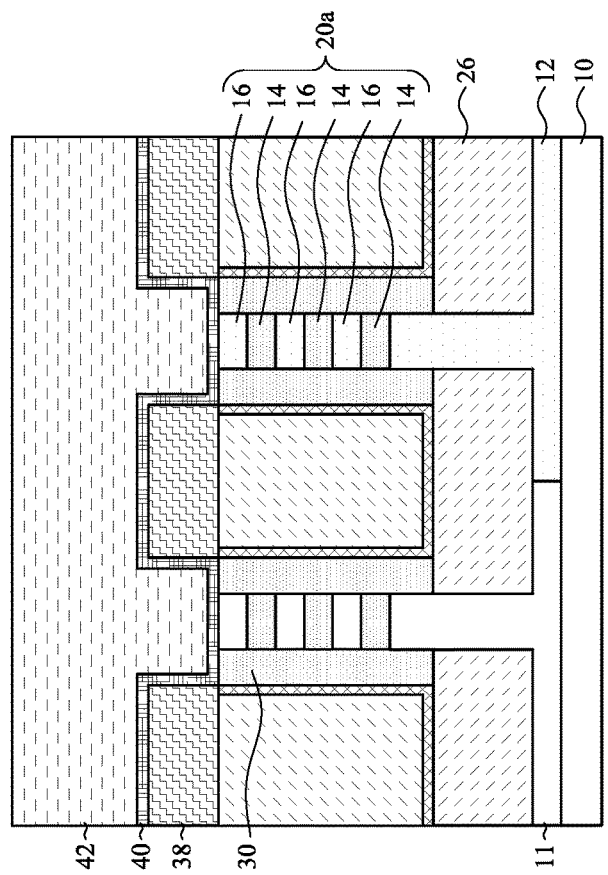
Figure 22C:
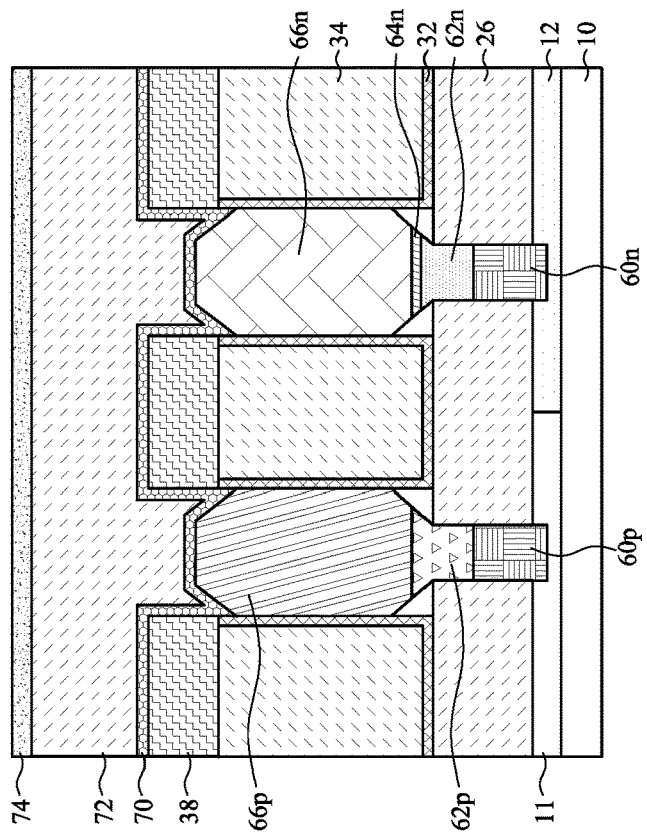
Figure 23B:
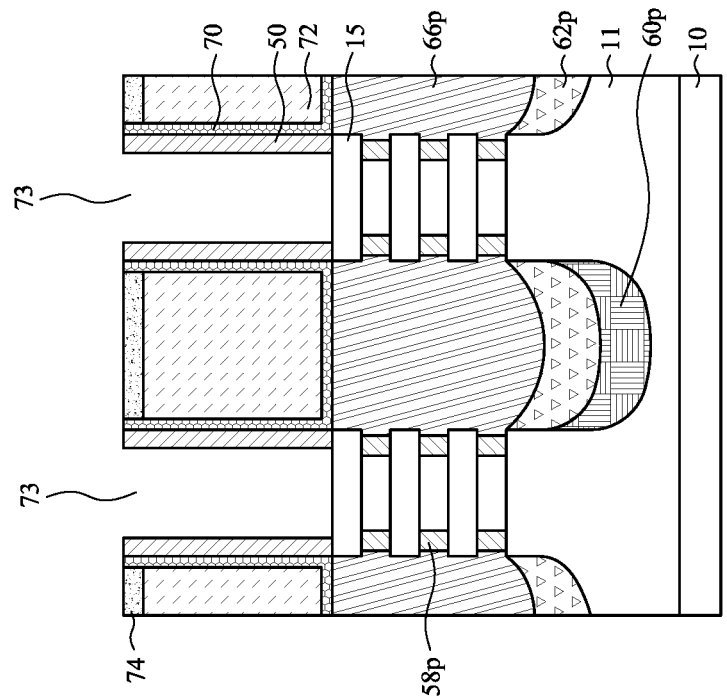
Figure 23A:
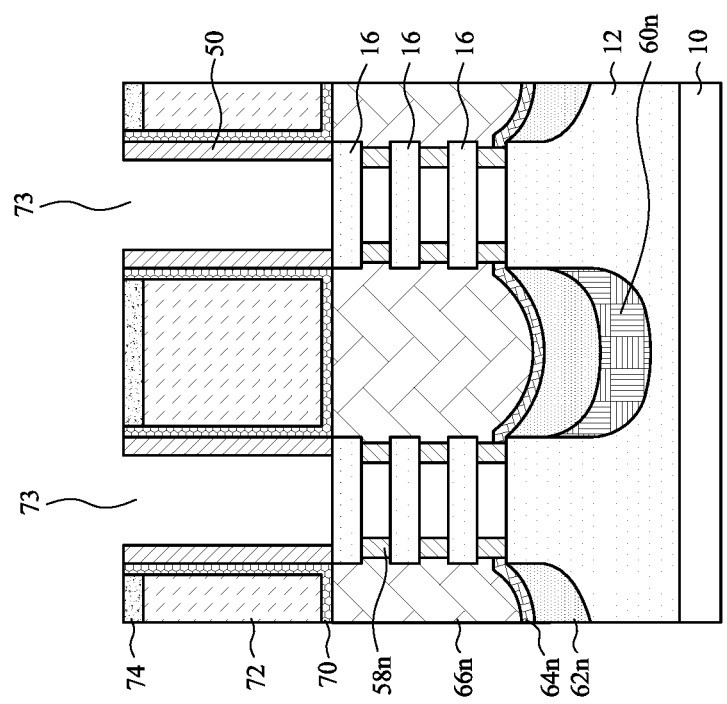
Figure 23C:
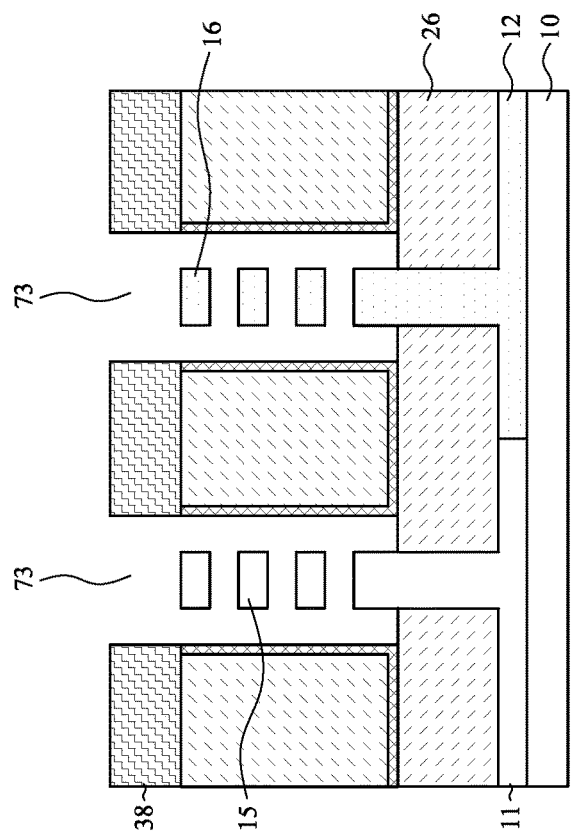
Figure 23D:
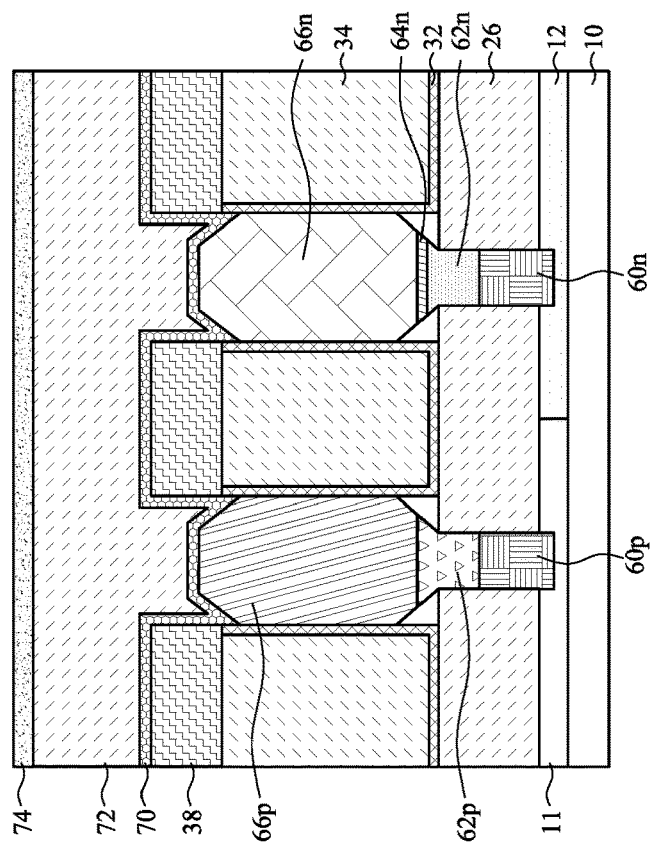

After formation of the epitaxial buffer layer 62p, the epitaxial source/drain features 66p for p-type devices are formed in the source/drain recesses 68s, 58d, as shown in FIGS. 20B and 20D. The epitaxial source/drain features 66p are formed over the epitaxial buffer layer 62p within the source/drain recesses 68s, 68d. The epitaxial source/drain features 66p may include one or more layers of Si, SiGe, Ge with p-type dopants, such as boron (B), for a p-type device, such as pFET. In some embodiments, the epitaxial source/drain features 66p may be SiGeB material, wherein boron is a dopant. In some embodiments, the epitaxial source/drain features 66p is a SiGeB layer with a boron concentration of between about 5E18 atoms/cm$^3$ and about 1E21 atoms/cm$^3$.

A bottom surface 66b' of the epitaxial source/drain features 66p matches the profile of the front surface 62f of the epitaxial buffer layer 62p. In the embodiment shown in FIGS. 20B and 20D, the bottom surface 66b' of the epitaxial source/drain features 66p has a convex profile. A top surface 66t' of the epitaxial source/drain features 66p may be shaped according to the natural facets of the epitaxially formed semiconductor material.

After formation of the epitaxial source/drain features 66p, the sacrificial liner 52f may be removed for subsequent processing. It should be noted that the processing sequence of the n-type epitaxial source/drain features 66n and p-type epitaxial source/drain features 66p can be switched.

In operation 132, a contact etch stop layer (CESL) 70 and an interlayer dielectric (ILD) layer 72 are formed over the exposed surfaces as shown in FIGS. 21A-21D and 22A-22D. The CESL 70 is formed on the epitaxial source/drain features 66n, 66p, the sidewall spacers 50, and the high-k dielectric features 38. In some embodiments, the CESL 70 has a thickness in a range between about 4 nm and about 7 nm. The CESL 70 may include $Si_3N_4$, SiON, SiCN or any other suitable material, and may be formed by CVD, PVD, or ALD.

The interlayer dielectric (ILD) layer 72 is formed over the contract etch stop layer (CESL) 70. The materials for the ILD layer 72 include compounds comprising Si, O, C, and/or H, such as silicon oxide, SiCOH and SiOC. Organic materials, such as polymers, may be used for the ILD layer 72. The ILD layer 72 protects the epitaxial source/drain features 66n, 66p during the removal of the sacrificial gate structures 48.

A planarization operation, such as CMP, is performed to expose the sacrificial gate electrode layer 42 for subsequent removal of the sacrificial gate structures 48 as shown in FIG. 22A-22D. The planarization process removes portions of the ILD layer 72 and the CESL 70, the hard mask layer 46 and the pad layer 44 to expose to the sacrificial gate electrode layer 42. In some embodiments, the ILD layer 72 is recessed to a level below the top of the sacrificial gate electrode layer 42, and a cap layer 74 is formed on the recessed ILD layer 72. The cap layer 74 may be a nitrogen-containing layer, such as a SiCN layer. The cap layer 74 is used to protect the ILD layer 72 during replacement gate processes.

In operation 134, the sacrificial gate dielectric layer 40 and the sacrificial gate electrode layer 42 are removed as shown in FIGS. 23A-23D. The sacrificial gate electrode layer 42 can be removed using plasma dry etching and/or wet etching. When the sacrificial gate electrode layer 42 is polysilicon, a wet etchant such as a Tetramethylammonium hydroxide (TMAH) solution can be used to selectively remove the sacrificial gate electrode layer 42 without removing the dielectric materials of the cap layer 74 and the CESL 70.

After removal of the sacrificial gate electrode layer 42, the sacrificial gate dielectric layer 40 is exposed. An etch process may be performed to selectively remove the sacrificial gate dielectric layer 40 exposing the high-k dielectric features 38, and the top layer of the second semiconductor layers 16 and the fourth semiconductor layers 15. A suitable etch process is then performed to selective remove the cladding layers 30. The cladding layer 30 can be removed using plasma dry etching and/or wet etching.

After removal of the cladding layers 30, the first semiconductor layers 14 and the third semiconductor layers 13 are exposed and subsequently removed resulting in gate cavities 73 having nanosheets of the second semiconductor layers 16 and the fourth semiconductor layers 15. Replacement gate structures are to be formed in the gate cavities 73. In some embodiments, the first semiconductor layers 14 and the third semiconductor layers 13 can be removed during the same etch process for removal of the cladding layers 30. In other embodiments, the first semiconductor layers 14 and the third semiconductor layers 13 can be selectively removed using a wet etchant such as, but not limited to, ammonium hydroxide (NH$_4$OH), tetramethylammonium hydroxide (TMAH), ethylenediamine pyrocatechol (EDP), or potassium hydroxide (KOH) solution.

In operation 136, gate dielectric layers 76n, 76p, and gate electrode layer 78 are formed in the gate cavities 73 as shown in FIGS. 24A-24D. The gate dielectric layer 76 (76n, 76p) and the gate electrode layer 78 may be referred to as a replacement gate structure. The gate dielectric layers 76n, 76p are formed on exposed surfaces in the gate cavities 73. The gate dielectric layers 76n, 76p may have different composition and dimensions. In some embodiments, the gate dielectric layers 76n and 76p include different materials and are formed separately using patterned mask layers and different deposition recipes.

The gate dielectric layer 76p is formed on exposed surfaces of each nanosheet of the fourth semiconductor layer 15, exposed surfaces of the inner spacer 58p, exposed surfaces of the sidewall spacer 50, and exposed surfaces of the epitaxial source/drain feature 66p. The gate dielectric layer 76p may include one or more layers of a dielectric material, such as silicon oxide, silicon nitride, or high-k dielectric material, other suitable dielectric material, and/or combinations thereof. Examples of high-k dielectric material include HfO$_2$, HfSiO, HfSiON, HfTaO, HfTiO, HfZrO, zirconium oxide, aluminum oxide, titanium oxide, hafnium dioxide-alumina (HfO$_2$—Al$_2$O$_3$) alloy, other suitable high-k dielectric materials, and/or combinations thereof.

The gate dielectric layer 76n is formed on exposed surfaces of each nanosheet of the second semiconductor layer 16, exposed surfaces of the inner spacer 58n, exposed surfaces of the sidewall spacer 50, and exposed surfaces of the epitaxial feature 66n. The gate dielectric layer 76n may include one or more layers of a dielectric material, such as silicon oxide, silicon nitride, or high-k dielectric material, other suitable dielectric material, and/or combinations thereof. Examples of high-k dielectric material include HfO$_2$, HfSiO, HfSiON, HfTaO, HfTiO, HfZrO, zirconium oxide, aluminum oxide, titanium oxide, hafnium dioxide-alumina (HfO$_2$—Al$_2$O$_3$) alloy, other suitable high-k dielectric materials, and/or combinations thereof.

The gate dielectric layers 76n, 76p may be formed by CVD, ALD or any suitable method. In one embodiment, the gate layers 76n, 76p are formed using a highly conformal deposition process such as ALD in order to ensure the formation of the gate dielectric layers 76n, 76p having a uniform thickness around each of the semiconductor layers 15, 16. In some embodiments, the thickness of the gate dielectric layers 76n, 76p is in a range between about 1 nm and about 6 nm. In some embodiments, an interfacial layer (not shown) is formed between the semiconductor layers 15, 16 and the gate dielectric layers 76n, 76p, respectively.

The gate electrode layer 78 is formed on the gate dielectric layers 76n, 76p to fill the gate cavities 73. The gate electrode layer 78 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. In some embodiments, the gate electrode layer 78 may be formed by CVD, ALD, electroplating, or other suitable method. After the formation of the gate electrode layer 78, a planarization process, such as a CMP process, is performed to remove excess deposition of the gate electrode material and expose the top surface of the ILD layer 72.

Figure 25C:
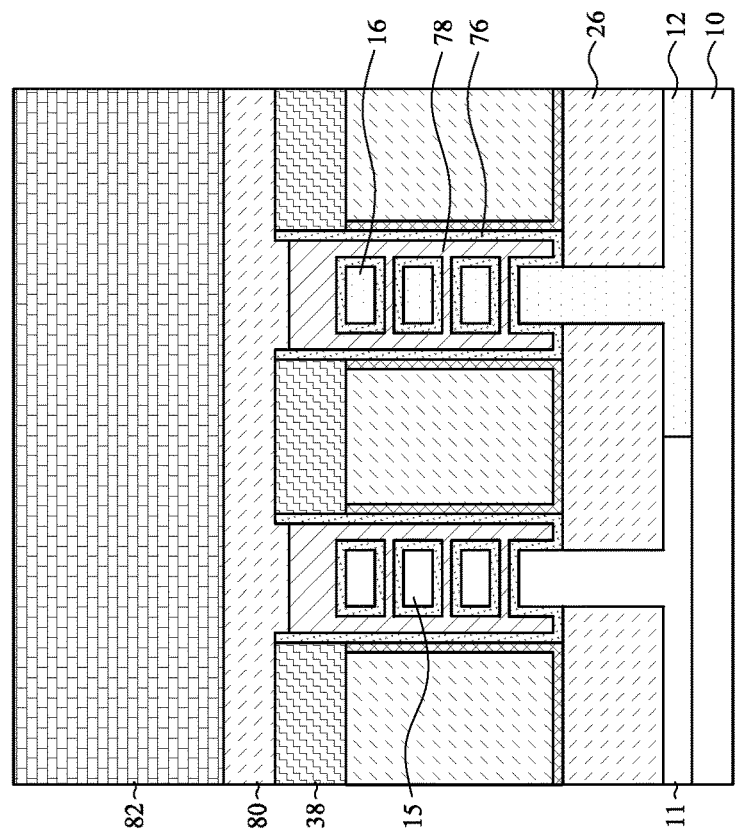
Figure 25D:
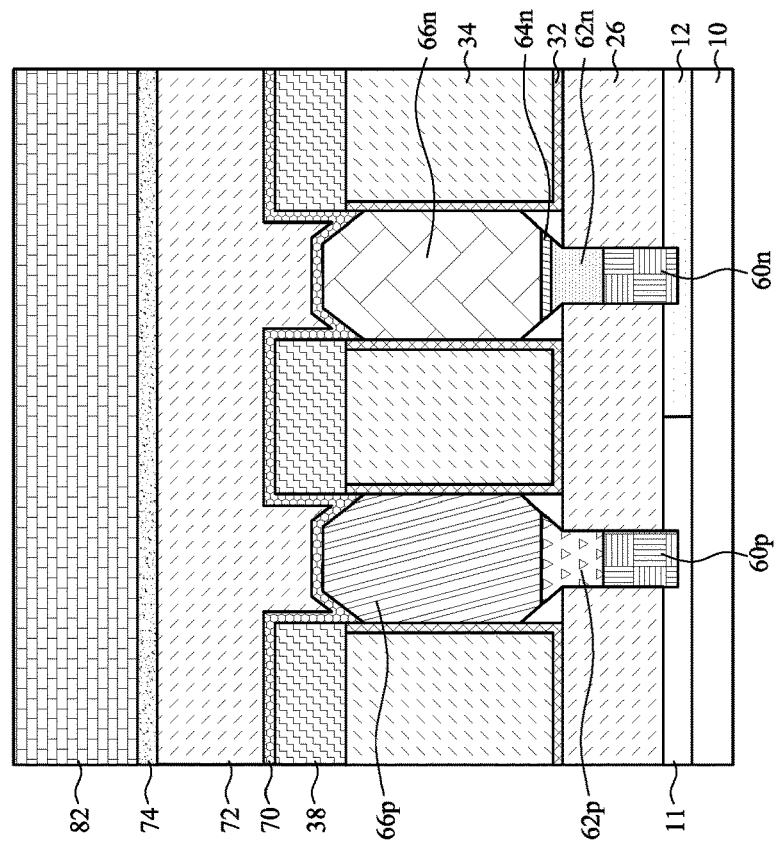
Figure 26B:
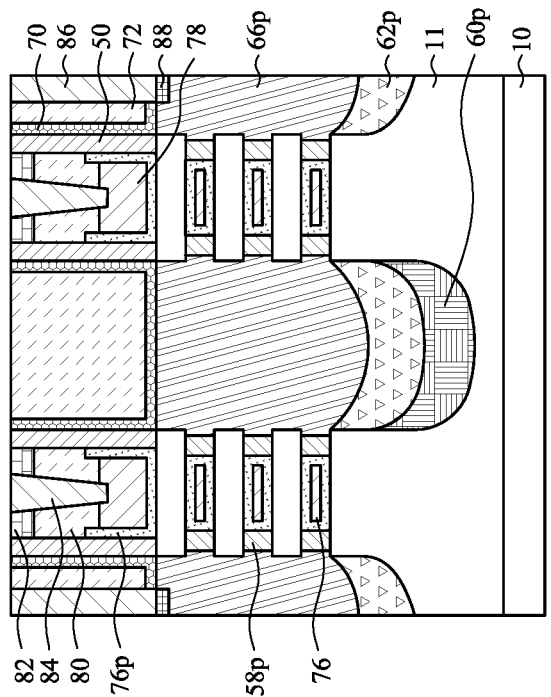
Figure 26A:
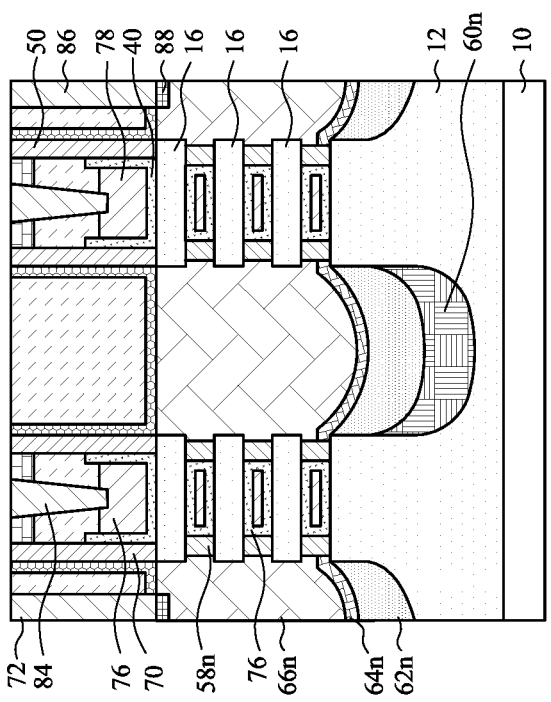
Figure 26D:
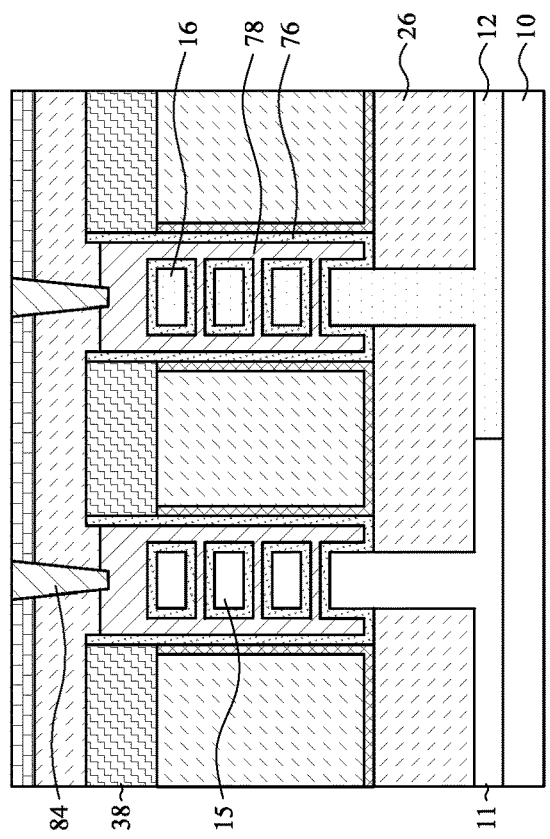
Figure 26C:
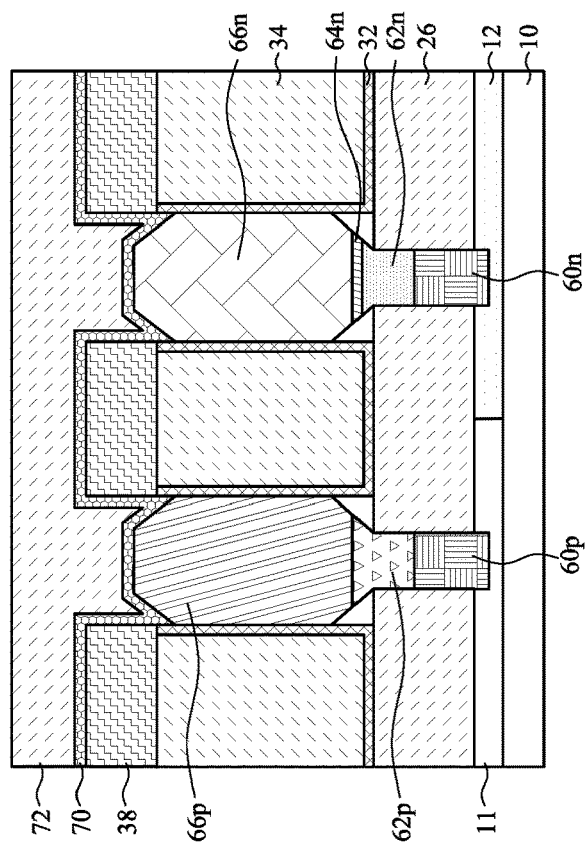
Figure 27B:
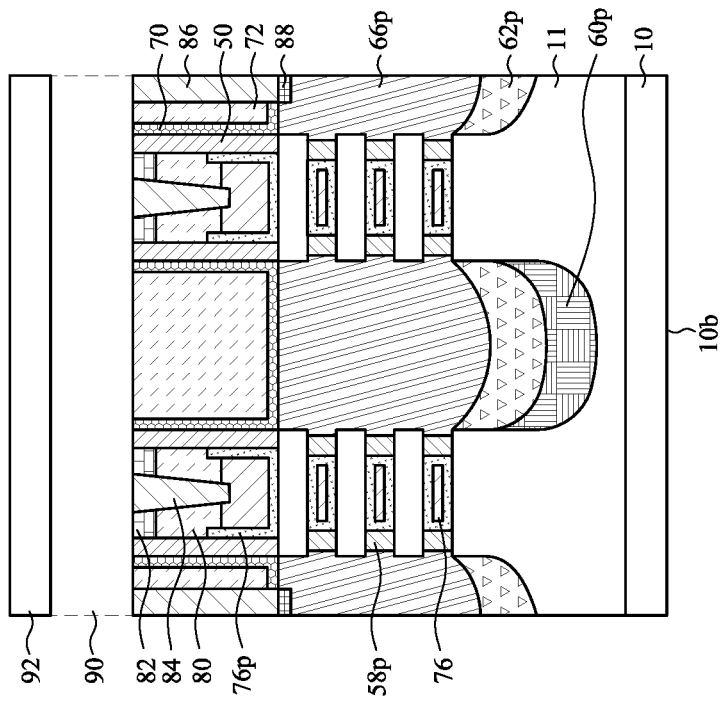
Figure 27A:
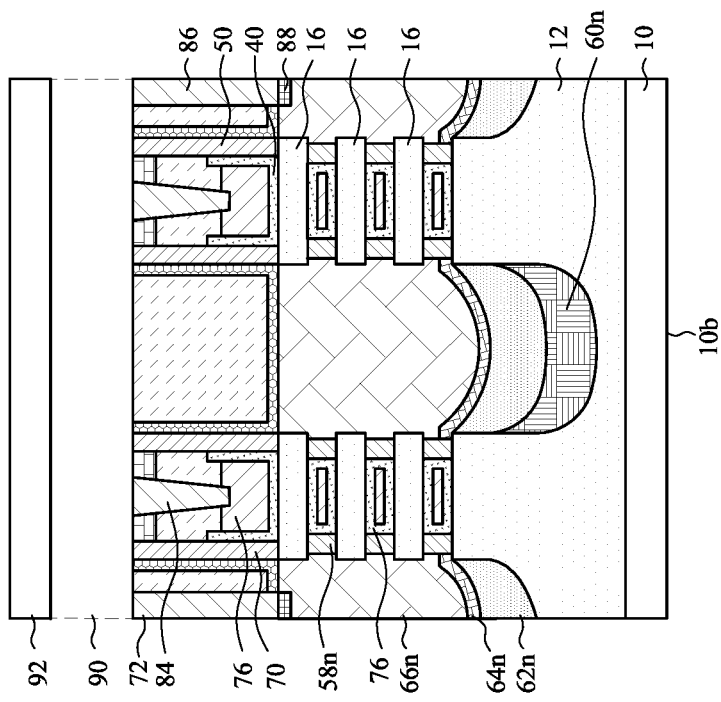
Figure 27D:
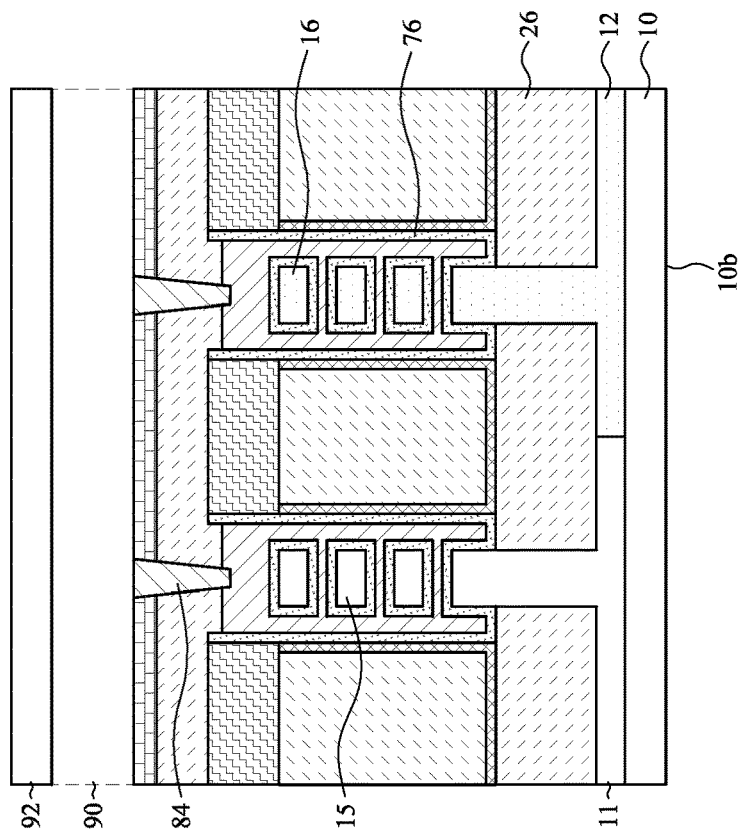
Figure 27C:
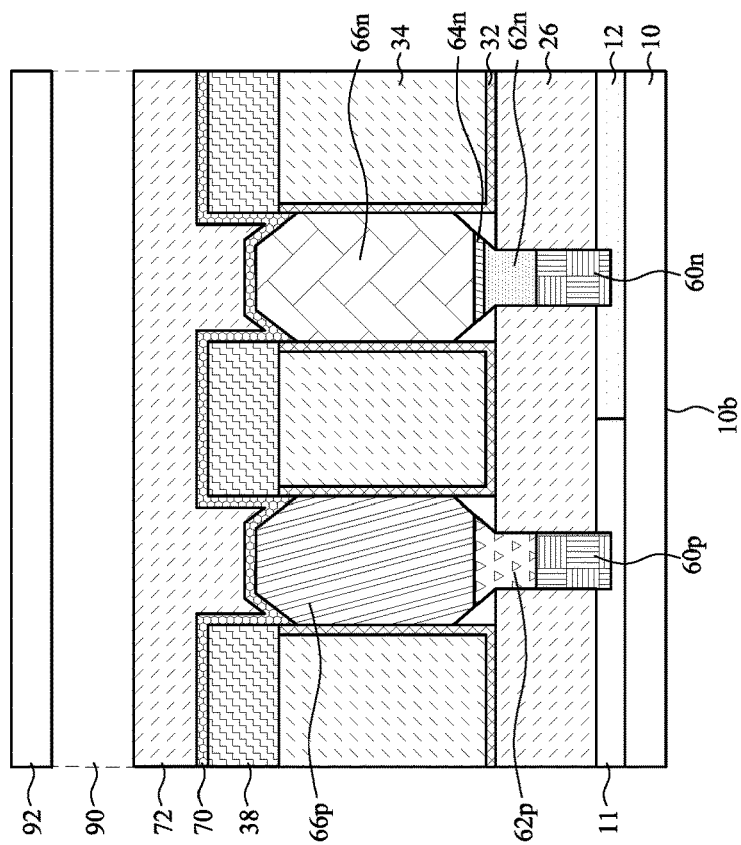
Figure 28B:
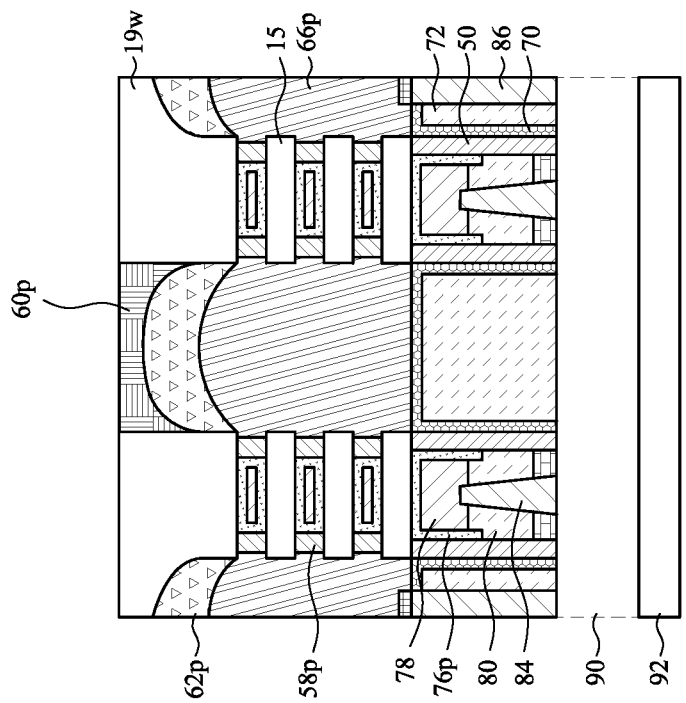
Figure 28A:
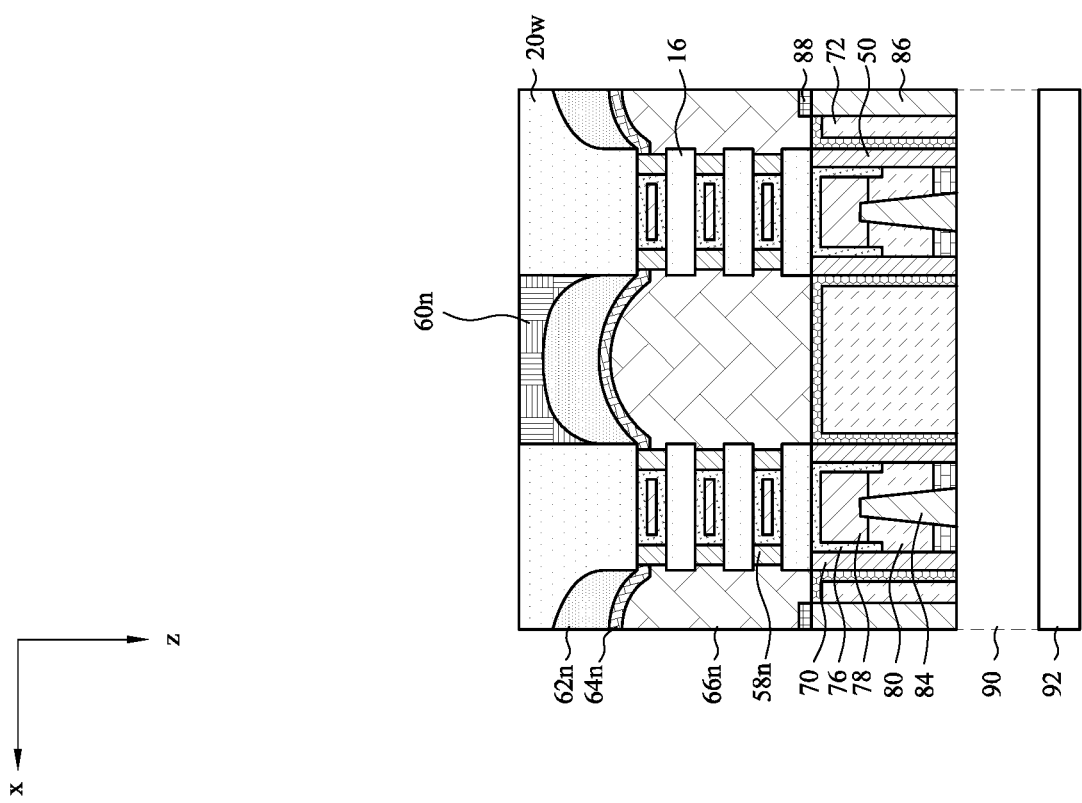
Figure 28D:
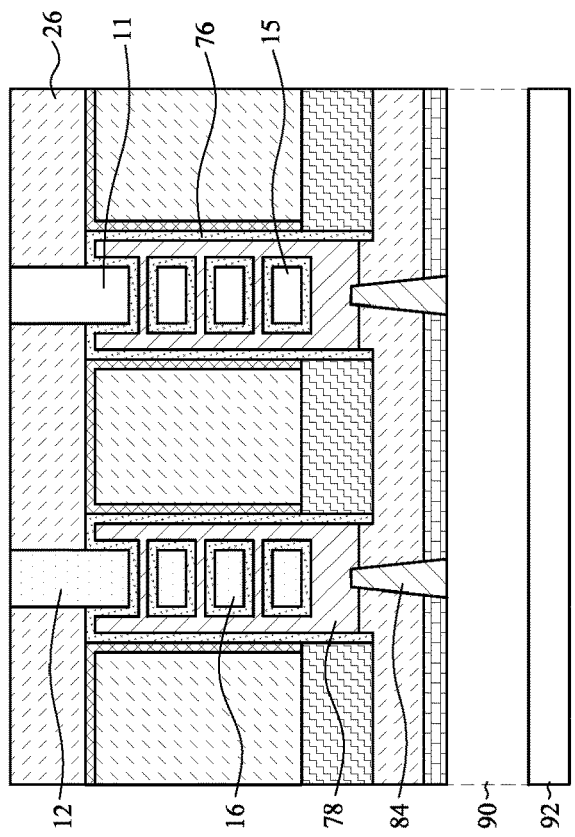
Figure 28C:
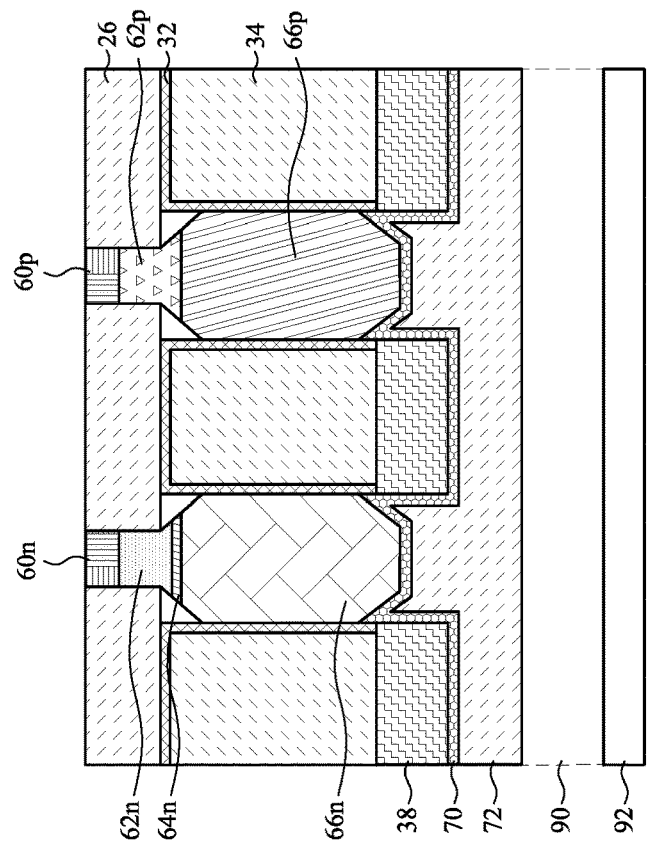
Figure 28E:
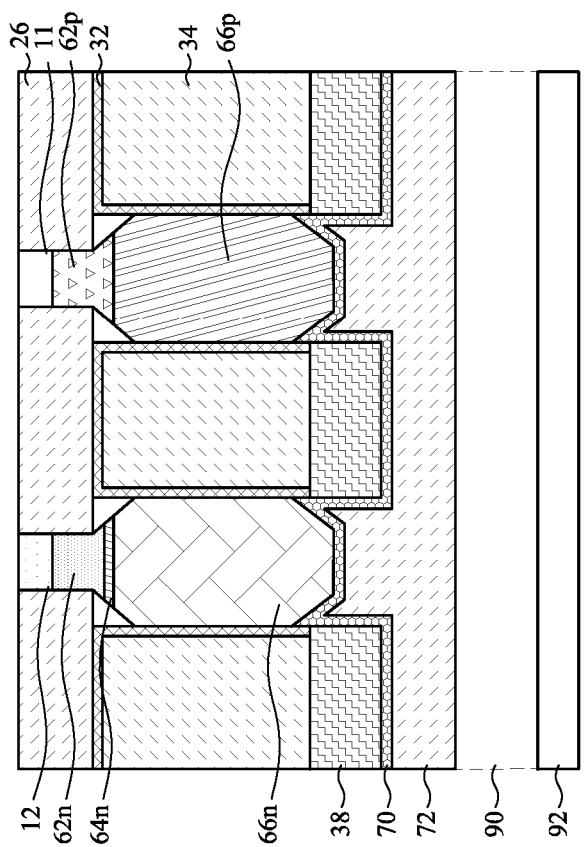

In operation 138, gate contacts 84 and front side source/drain contacts 86 are formed as shown in FIGS. 25A-25D and 26A-26D. In FIGS. 25A-25D, a self-aligned contact layer 80 and a hard mask layer 82 are formed over the gate electrode layer 78. After the CMP process in operation 136, the gate electrode layer 78 are recessed. In some embodiments, the gate electrode layer 78 is recessed to a level below a top surface the high-k dielectric features 38 as shown in FIG. 25D. The high-k dielectric features 38 divide the gate electrode layer 78 into segments connected to different transistors. The gate electrode layer 78 may be recessed using any suitable process, such as a dry etch, a wet etch, or a combination thereof. In some embodiments, the recess process may be a selective dry etch process that does not substantially affect the cap layer 74, the sidewall spacer 50, and the gate dielectric layers 76n, 76p.

After recess of the gate electrode layer 78, the self-aligned contact layer 80 is formed over the gate dielectric layers 76n, 76p, and the gate electrode layer 78 between the sidewall spacers 50. The self-aligned contact layer 80 may be formed by a blanket deposition process, followed by a CMP process to the level of the sidewall spacers 50 to remove excessive materials over the sidewall spacers 50, then selectively recessed to form trenches between the sidewall spacers 50 and above the self-aligned contact layer 80. The self-aligned contact layer 80 may be a dielectric material having an etch selectively relative to the sidewall spacers 50. In some embodiments, the self-aligned contact layer 80 includes silicon nitride. The self-aligned contact layer 80 can be used to define self-aligned contact region and thus referred to as SAC structures or a SAC layer.

The hard mask layer 82 is then formed over the self-aligned contact layer 80. The hard mask layer 82 includes dielectric material such as, Si, SiO, SiN, AlO, or combinations thereof. The hard mask layer 82 may include a material which is different from the sidewall spacers 50, the CESL 70, the ILD layer 72, and/or the cap layer 74 to achieve etching selectivity during etching processes performed later. As shown in FIGS. 25A and 25B, the self-aligned contact layer 80 is in contact with the gate electrode layer 78, the gate dielectric layer 76n, 76p, and the hard mask layer 82 and between the sidewall spacers 50.

After formation of the hard mark layer 80, a planarization process is performed to polish back the hard mask layer 82 until the sidewall spacers 50, the CESL 70, and the ILD layer 72 are exposed. Contact hole may be formed by any suitable process in the hard mask layer 82 and the self-aligned contact layer 80. Subsequently, a conductive material layer fills in the contact holes to form the gate contacts 84 as shown in FIGS. 26A-26D.

Similarly, contact holes may be formed through the ILD layer 72 and the CESL 70 and subsequently filled with a conductive material to form the front side source/drain contacts 86. Suitable photolithographic and etching techniques are used to form the contact holes through various layers. After the formation of the contact holes, a silicide layer 88 is selectively formed over an exposed top surface of the epitaxial source/drain features 66n, 66p exposed by the contact holes. The silicide layer 88 conductively couples the epitaxial source/drain features 66n, 66p to the subsequently formed interconnect structures. The silicide layer 88 may be formed by depositing a metal source layer to cover exposed surfaces including the exposed surfaces of the epitaxial source/drain features 66n, 66p and performing a rapid thermal annealing process. In some embodiments, the metal source layer includes a metal layer selected from W, Co, Ni, Ti, Mo, and Ta, or a metal nitride layer selected from tungsten nitride, cobalt nitride, nickel nitride, titanium nitride, molybdenum nitride, and tantalum nitride. After the formation of the metal source layer, a rapid thermal anneal process is performed, for example, a rapid anneal a rapid anneal at a temperature between about 700° C. and about 900° C. During the rapid anneal process, the portion of the metal source layer over the epitaxial source/drain features 66n, 66p reacts with silicon in the epitaxial source/drain features 66n, 66p to form the silicide layer 88. Unreacted portion of the metal source layer is then removed. In some embodiments, the silicide layer 88 includes one or more of WSi, CoSi, NiSi, TiSi, MoSi, and TaSi. In some embodiments, the silicide layer 88 has a thickness in a range between about 3 nm and 10 nm.

After formation of the silicide layer 88, a conductive material is deposited to fill contact holes and form the gate contacts 84 and the front side source/drain contacts 86. In some embodiments, the conductive material layer for the gate contact may be formed by CVD, PVD, plating, ALD, or other suitable technique. In some embodiments, the conductive material for the gate contacts 84 and front side source/drain contacts 86 includes TiN, TaN, Ta, Ti, Hf, Zr, Ni, W, Co, Cu, Ag, Al, Zn, Ca, Au, Mg, Mo, Cr, or the like. Subsequently, a CMP process is performed to remove a portion of the conductive material layer above a top surface of the hard mask layer 82.

In operation 138, a front side interconnect structure 90 is formed over on the second ILD layer 72 and the hard mask layer 82 as shown in FIGS. 27A-27D. The front side interconnect structure 90 includes multiple dielectric layers having metal lines and vias (not shown) formed therein. The metal lines and vias in the front side interconnect structure 90 may be formed of copper or copper alloys, and may be formed using one or more damascene processes. The front side interconnect structure 90 may include multiple sets of inter-layer dielectric (ILD) layers and inter-metal dielectrics (IMDs) layers.

In some embodiments, the front side interconnect structure 90 includes metal lines and vias for connecting signal lines only, but not connecting to power rails or connections to power rails. In other embodiments, the front side interconnect structure 90 includes a portion of power rails. Power rails indicate conductive lines connecting between the epitaxial source/drain features 66n, 66p and a power source, such as VDD, and VSS (GND).

After the formation of the front side interconnect structure 90, a carrier wafer 92 is temporarily bonded to a top side of the front side interconnect structure 90. The carrier wafer 92 serves to provide mechanical support for the front side interconnect structure 90 and devices formed on the substrate 10.

In operation 142, after the carrier wafer 92 is bond to the substrate 10, the carrier wafer 92 along with the substrate 10 is flipped over so that the backside of the substrate 10 (i.e., a back surface 10b) is facing up for backside processing.

In operation 144, after flipping over, a backside grinding is performed to expose the isolation layer 26, the well portions 19w, 20w of the semiconductor fins 19, 20, and the backside contact alignment features 60n, 60p, as shown in FIGS. 28A-28E.

In operation 146, a relatively fast etching process is performed to partially remove materials of the n-well 11 and p-well 12 exposed after grinding, as shown in FIGS. 29A-29E. In some embodiments, the exposed n-well 11 and p-well 12 is partially removed using an etch process having an etch selectivity for the material of n-well 11 and p-well 12 over the materials of the backside contact alignment features 60n, 60p, and the isolation layer 26. In some embodiments, the exposed n-well 11 and p-well 12 be partially selectively etched using a dry etching method or a wet etching using tetramethylammonium hydroxide (TMAH).

Figure 29B:
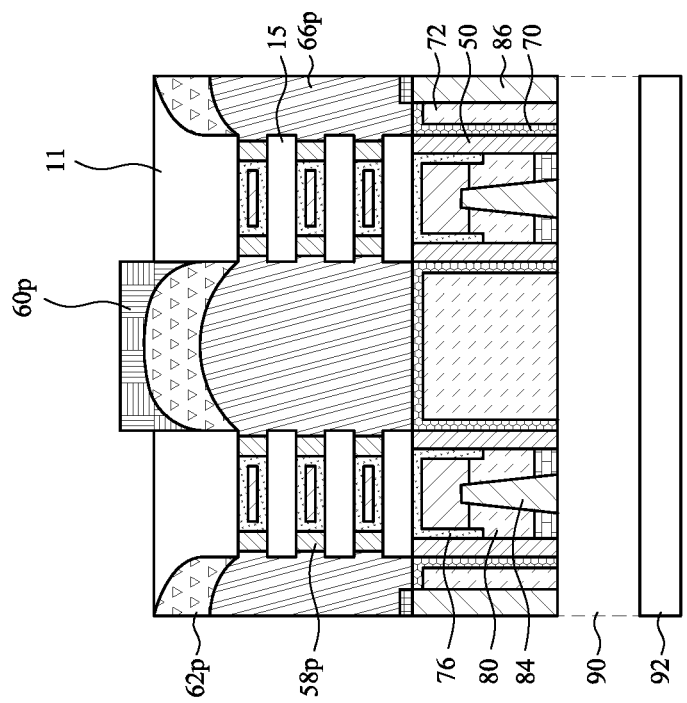
Figure 29A:
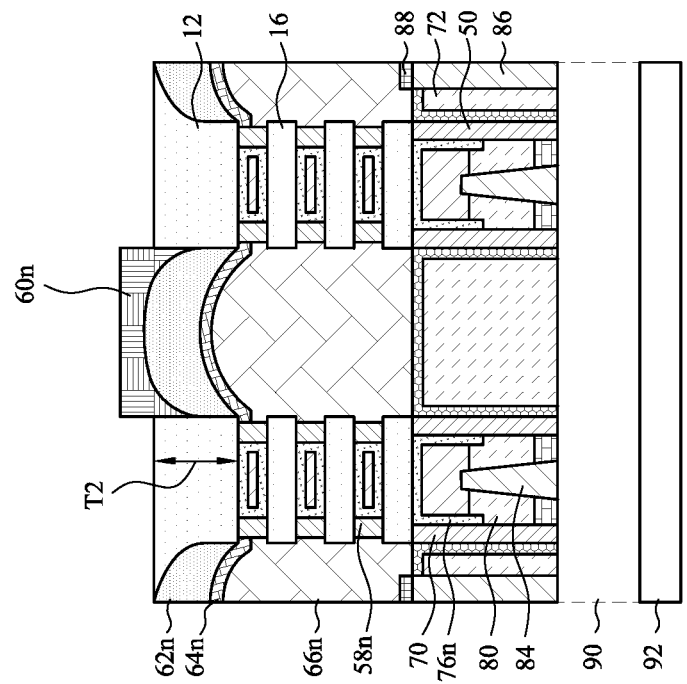
Figure 29D:
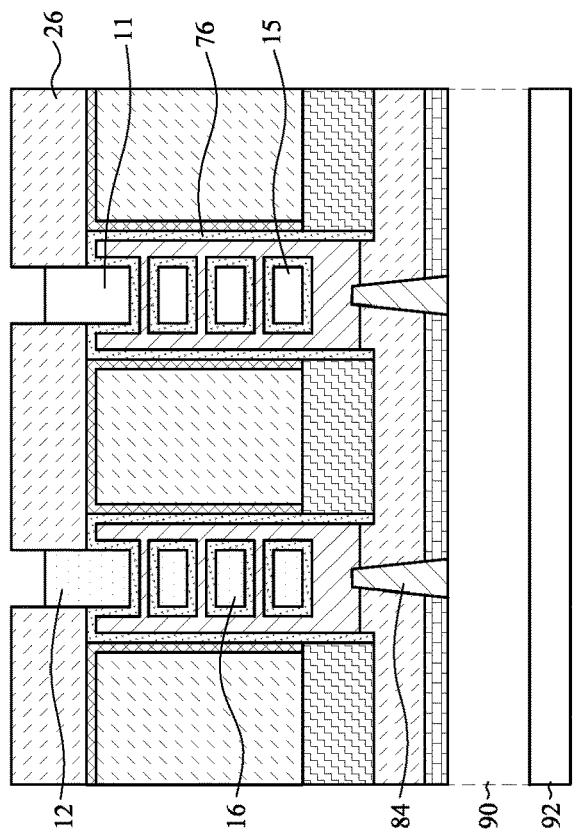
Figure 29C:
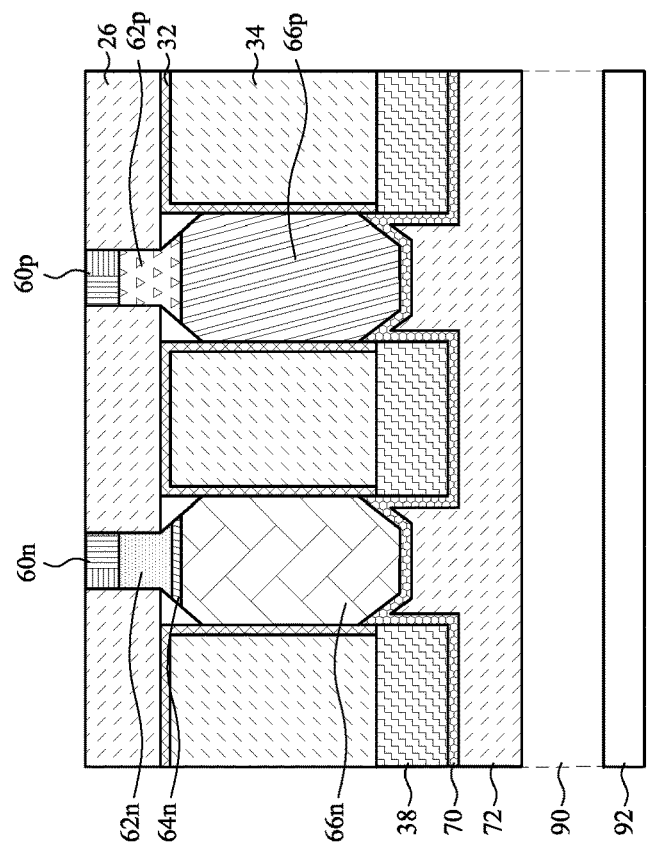
Figure 29E:
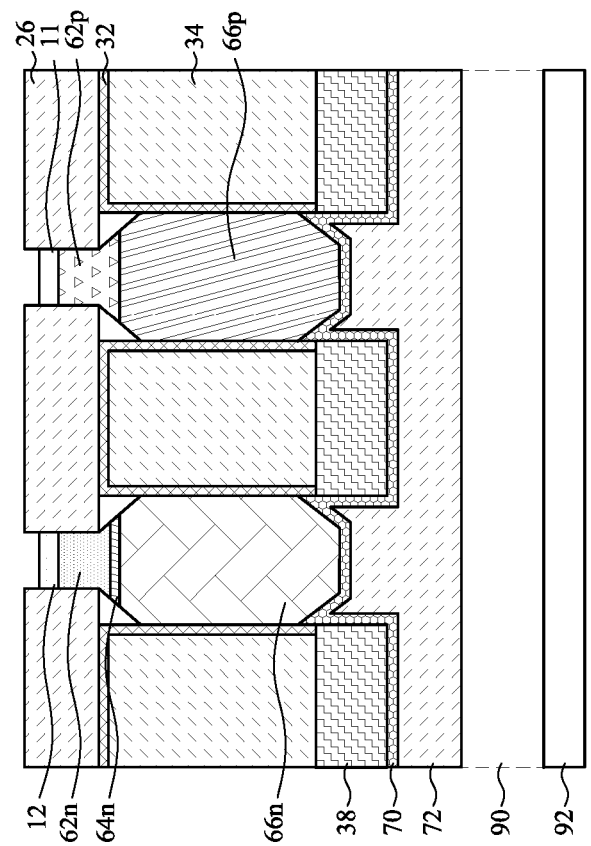

In some embodiments, as shown in FIGS. 29A and 29B, the exposed n-well 11 and p-well 12 are partially removed such that the backside contact alignment features 60n, 60p protrude over the n-well 11 and p-well 12 while the epitaxial buffer layer 62n, 62p remain embedded in the n-well 11 and p-well 12. In some embodiments, a thickness T2 of the n-well 11 and p-well 12 remain when operation 146 is completed. The thickness T2 is a value large enough to generate a corner protector in the subsequent slow etching process. In some embodiments, the thickness T2 is in a range between about 10 nm and 20 nm. The end point of etching process in operation 146 may be controlled by controlling duration of the etching process.

In operation 148, a relatively slow etching process is performed to partially remove materials of the n-well 11 and p-well 12 exposed after the relatively fast etching, as shown in FIGS. 30A-30F. In some embodiments, the exposed n-well 11 and p-well 12 is partially removed using an etch process having an etch selectivity for the material of n-well 11 and p-well 12 over the materials of the backside contact alignment features 60n, 60p, the epitaxial buffer layer 62n, 62p, and the isolation layer 26. In some embodiments, the exposed n-well 11 and p-well 12 be partially selectively etched using a wet etching using an etchant including ammonium hydroxide (NI-140H).

Figure 30B:
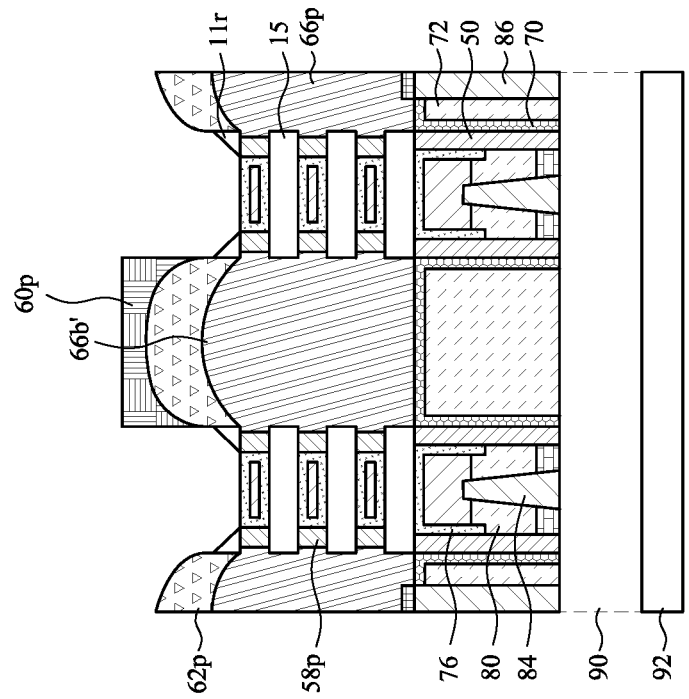
Figure 30A:
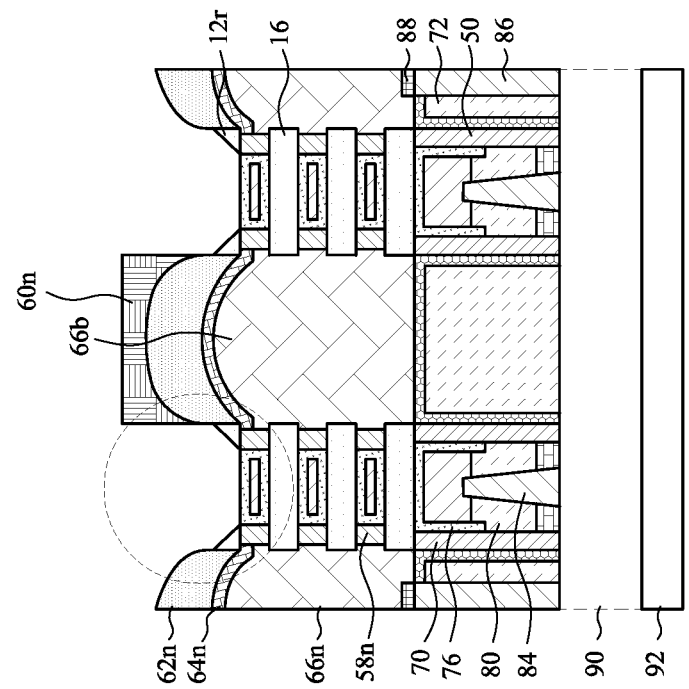
Figure 30D:
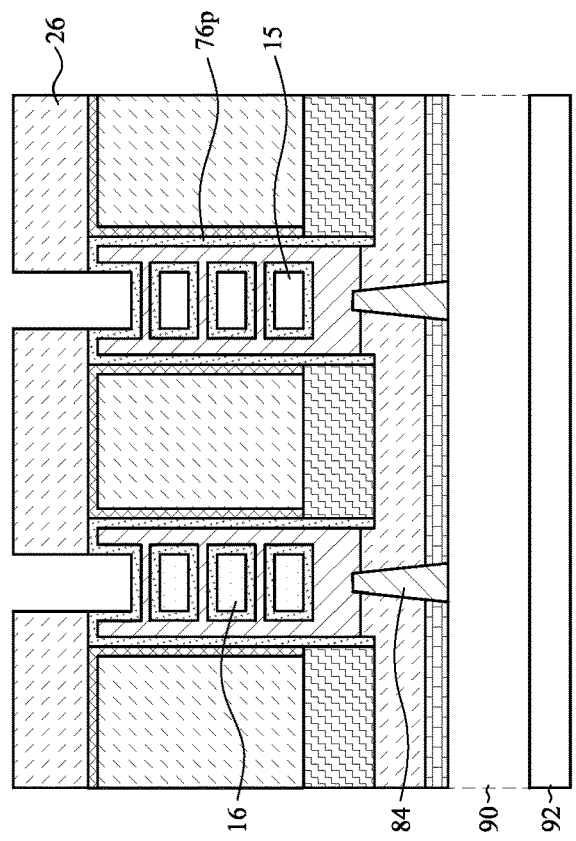
Figure 30C:
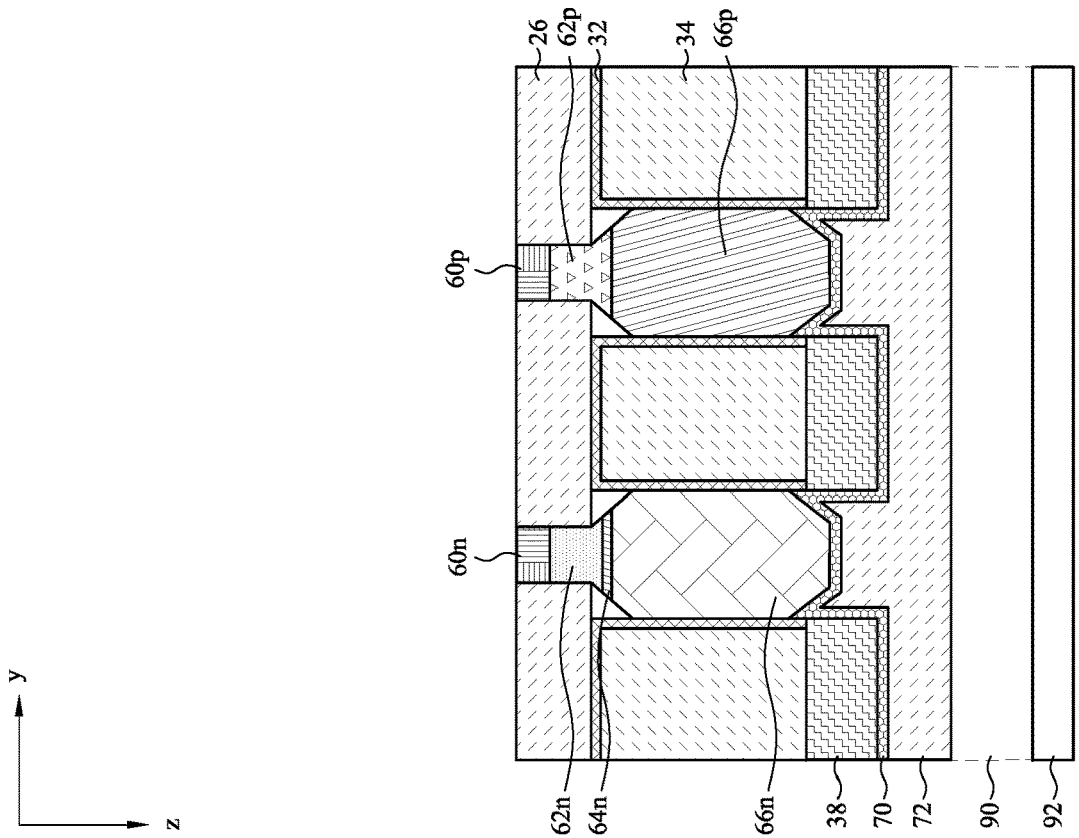
Figure 30F:
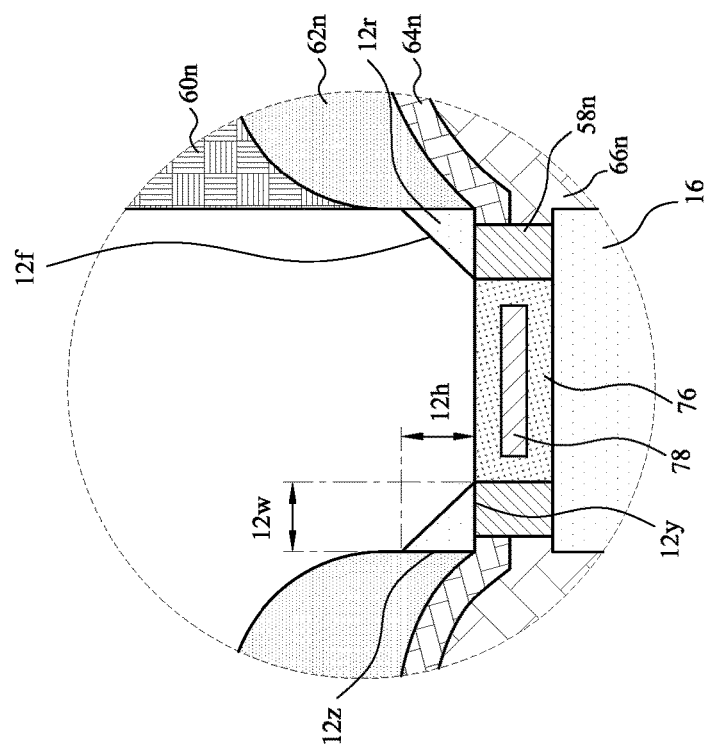
Figure 30E:
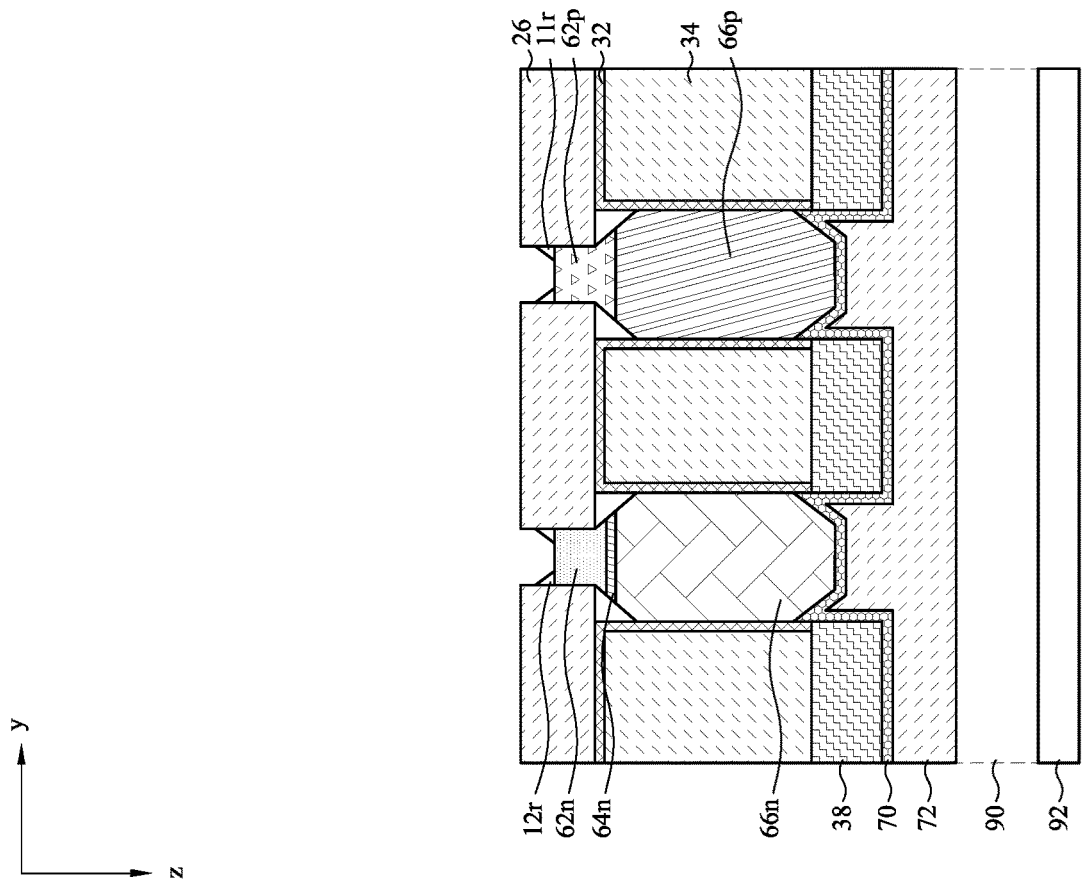
Figure 31B:
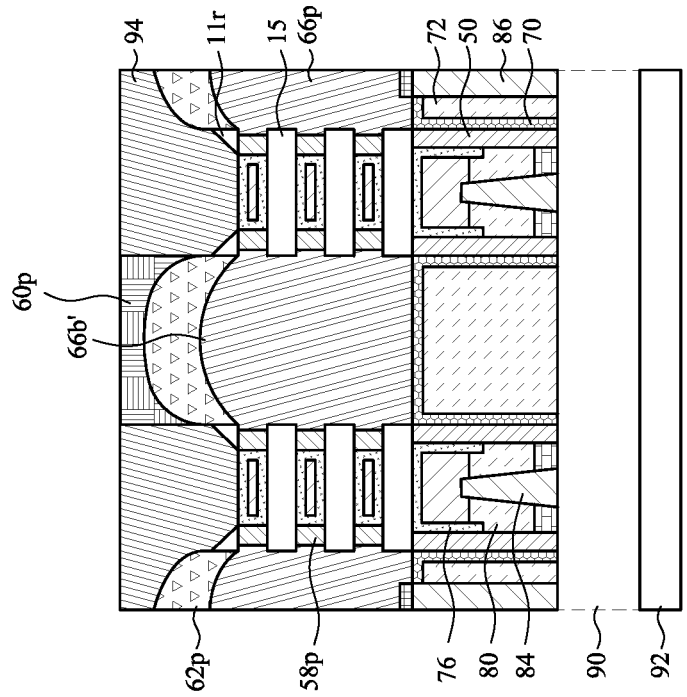
Figure 31A:
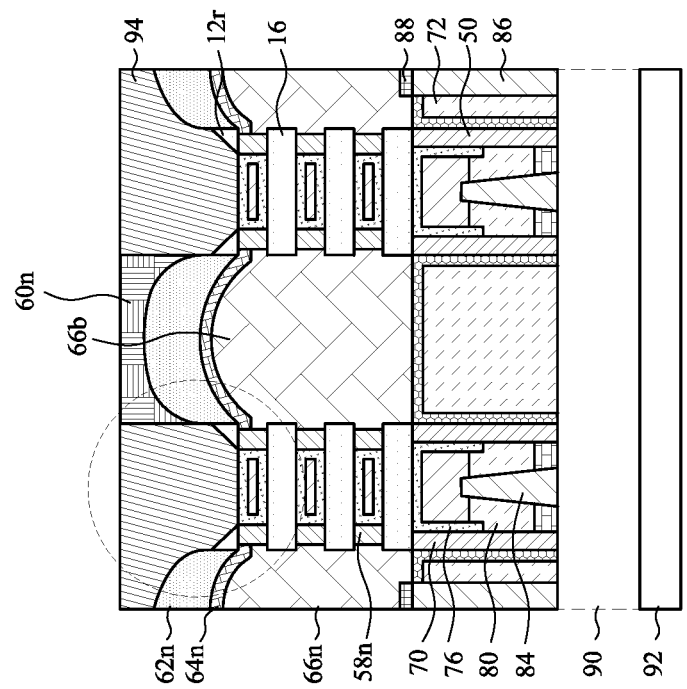
Figure 31C:
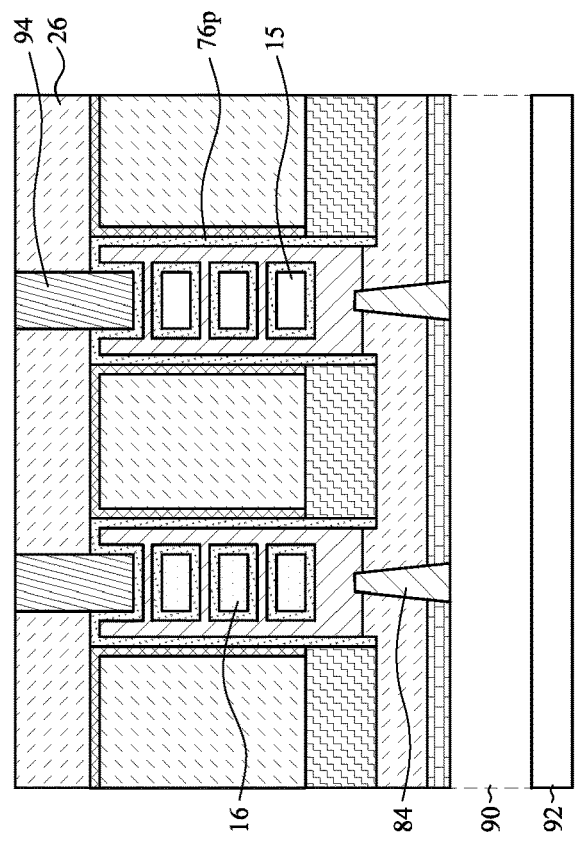
Figure 31D:
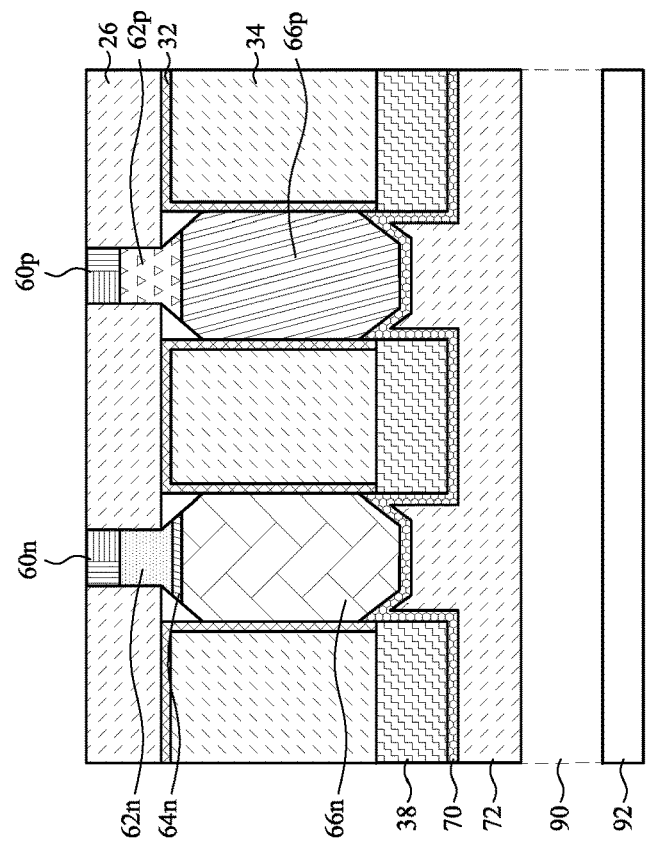
Figure 31F:
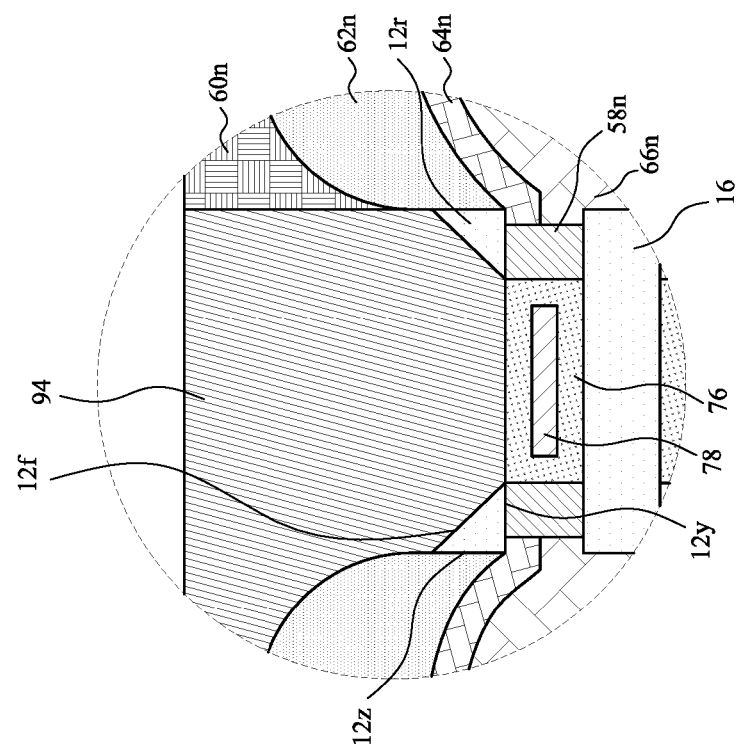
Figure 31E:
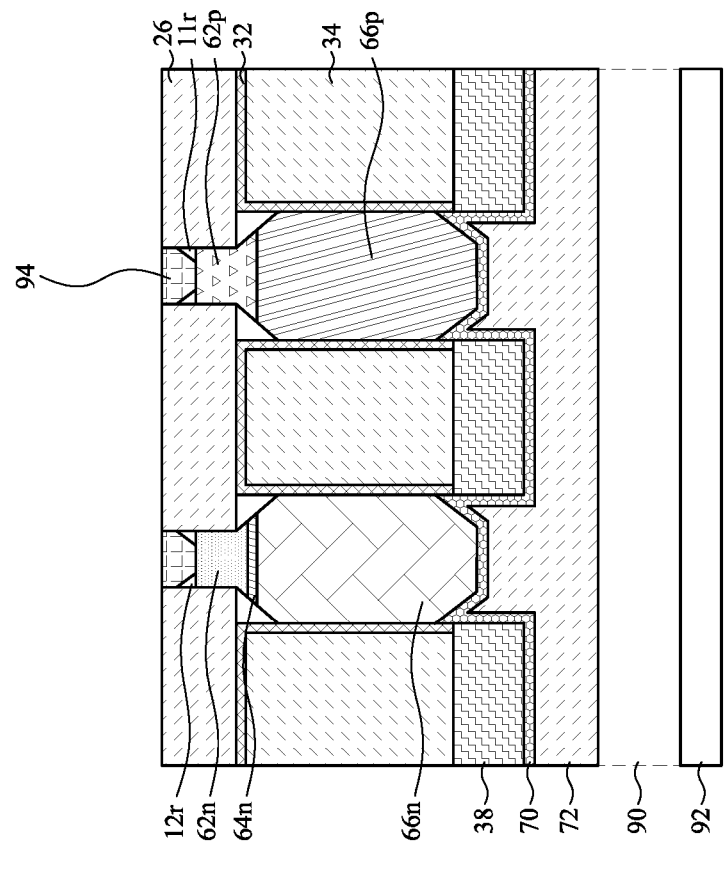
Figure 32B:
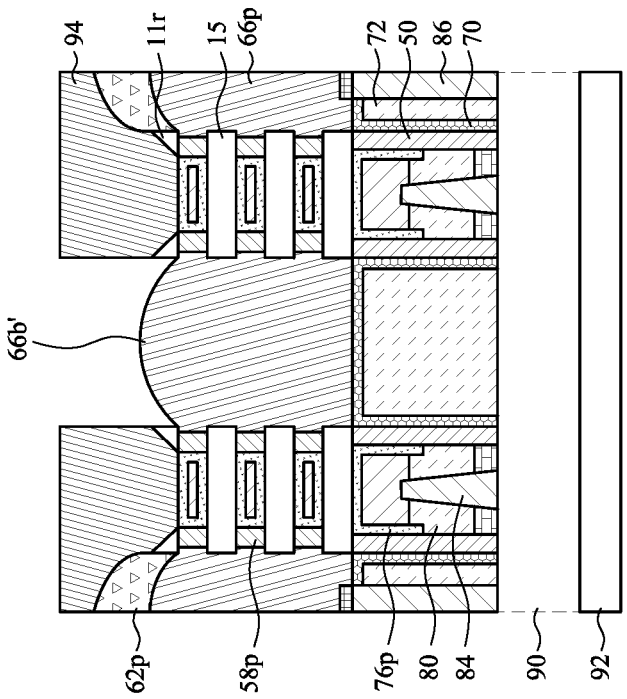
Figure 32A:
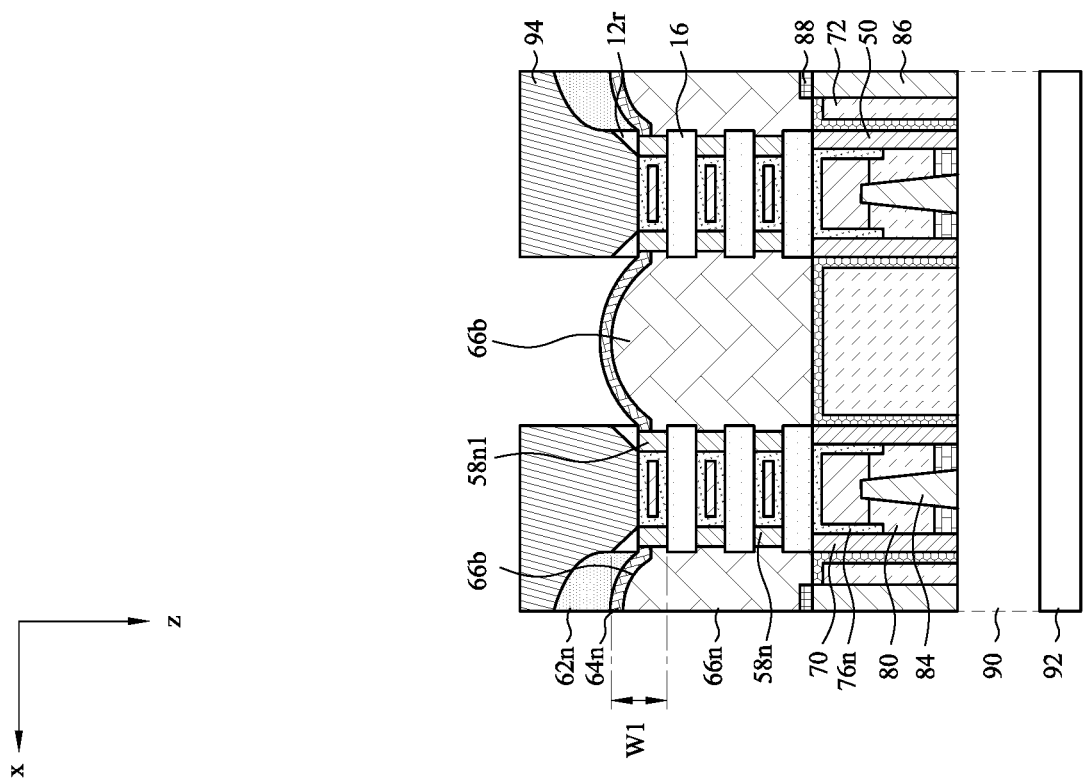
Figure 32C:
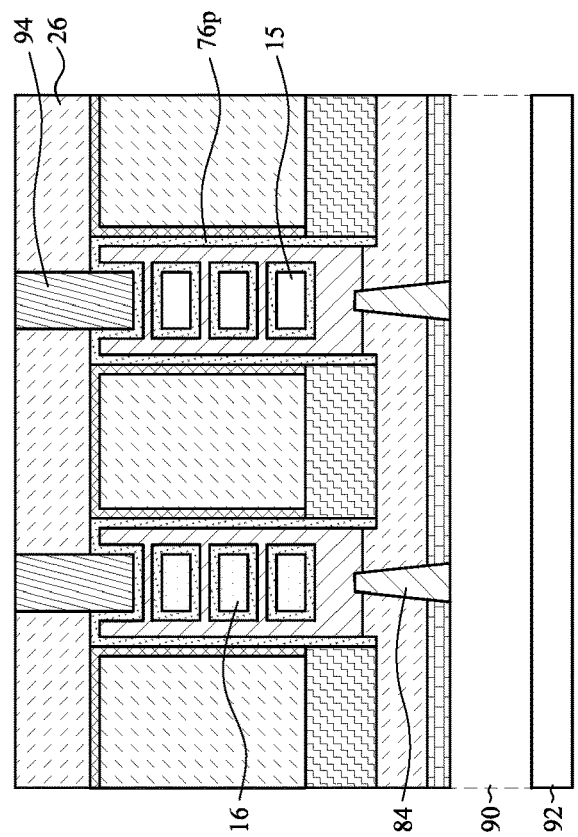
Figure 32D:
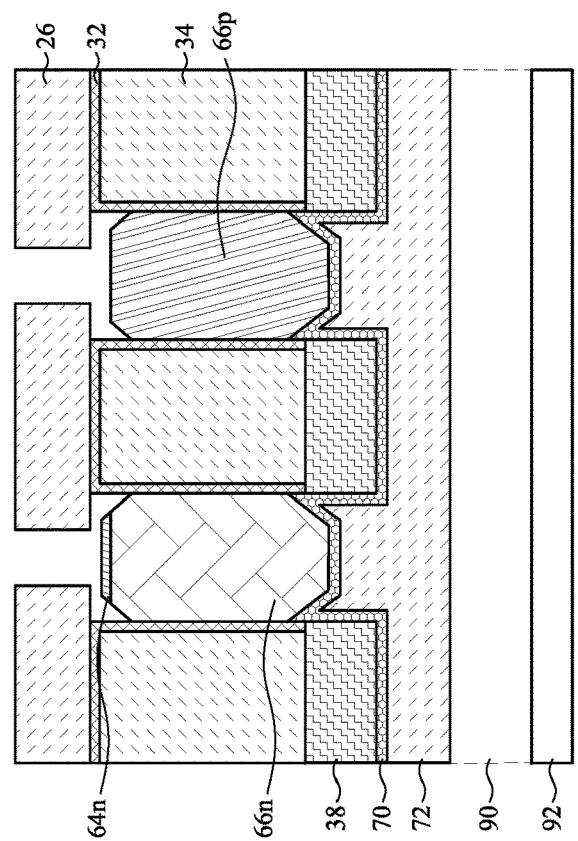

When the etching process in operation 148 is completed, the n-well 11 and p-well 12 are mostly removed except for corners 11r, 12r as shown in FIGS. 30A, 30B, and 30E. The corners 11r, 12r are semiconductor features from the materials of the n-well 11 and p-well 12. During operation 148, the corners 11r, 12r prevent etchant from reaching the epitaxial source/drain features 66n, 66p and/or the transitional epitaxial layers 64n. The protective function of the corners 12r is particularly significant to the epitaxial source/drain features 66n because the epitaxial source/drain features 66n, which is doped silicone, has a low etch selectivity relative to the p-well 12 and n-well 11 materials.

FIG. 30F, a schematic partial enlarged view of FIG. 30A, illustrates the corners 12r according to one embodiments of the present disclosure. As shown in FIG. 30F, the corners 12r has a substantially triangular cross section in the y-z plane. Each corner 12r may include a first surface 12z in contact with the epitaxial buffer layer 62n, a second surface 12y in contact with the inner spacer 58n and the gate dielectric layer 76n, and a third surface 12f connecting the first surface 12z and the second surface 12y. In some embodiments, the third surface 12f is a natural facet of the crystalline silicon of the p-well 12. In some embodiments, the first surface 12z or the second surface 12y may be in contact with the transitional epitaxial layer 64n depending the location of the transitional epitaxial layer. In some embodiment, the third surface 12f is the [111] facet of the crystalline. The third surface 12f is a generated as a result of the etching process of the crystalline material of the p-well 12. The first surface 12z of each corner 12r has a length 12h, the second surface 12*y* of each corner 12*r* has a length 12*w*. In some embodiments, the length 12*h* is in a range between 5 nm and 10 nm, and the length 12*w* is in a range between 5 nm and 10 nm. If the length 12*h* or 12*w* is less than 5 nm, the corner 12*r* may not provide enough protection to the epitaxial source/drain feature 66*n*. If the length 12*h* or 12*w* is more than 10 nm, the corners 12*r* may scarify performance of the device without additional improvement of etch protection. The end point of etching process in operation 148 may be controlled by controlling duration of the etching process to obtain desired dimension of the corners 12*r*.

The corners 11*r*, 12*r* ensure that the epitaxial source/drain features 66*n*, 66*p* is isolated from the etching solution, thus remaining intact in operation 148 even if the back surface 66*b*, 66*b*' of the epitaxial source/drain features 66*n*, 66*p* are convex in shape.

The location and dimension of the corners 11*r* are similar to those of the corners 12*r*. Typically the epitaxial source/drain features 66*p* and the transitional epitaxial layer 64*p* have etch selectivity over the n-well 11 and p-well 12, the corners 11*r* nevertheless can provide some protections to the epitaxial source/drain features 66*p* and the transitional epitaxial layer 64*p* during backside processing.

In some embodiments, the operation 146 may be optional, and the p-well 12 and n-well 11 may be etched using the relative slow etching method of operation 148 to obtain the corners 11*r*, 12*r*.

In operation 150, In operation 154, a refill dielectric layer 94 is formed in cavities vacated by the p-well 12 and n-well 11, as shown in FIGS. 31A-31F. The refill dielectric layer 94 is deposited over the corners 11*r*, 12*r*, the exposed gate dielectric layers 76*n*, 76*p*, the epitaxial buffer layers 62*n*, 62*p*, and the backside contact alignment feature 60*n*, 60*p*. After the formation of the refill dielectric layer 94, a planarization process, such as CMP, is performed to expose the backside contact alignment feature 60*n*, 60*p*.

In some embodiments, the refill dielectric layer 94 includes a silicon oxide, a material convertible to a silicon oxide, a silicate glass (USG), an alkoxysilane compound (e.g., tetraethoxysilane (TEOS), tetramethoxysilane (TMOS), thermal oxide, or any suitable dielectric material, or any combination thereof, and can be formed by FCVD, a spin-on coating process, or any suitable deposition technique.

In operation 152, one or more etch process is performed to remove the backside contact alignment features 60*n*, 60*p* and the epitaxial buffer layers 62*n*, 62*p* as shown in FIG. 32A-32D. The backside contact alignment features 60*n*, 60*p* and the epitaxial buffer layers 62*n*, 62*p* may be removed by any suitable etch process to expose the epitaxial source/drain features 66*p* and the transitional epitaxial layer 64*n*. In some embodiments, the backside contact alignment features 60*n*, 60*p* and the epitaxial buffer layers 62*n*, 62*p* are removed by a dry etch method, for example, by an isotropic etch methods. In some embodiments, the transitional epitaxial layer 48 is removed by a dry etching process using fluorine-based etchant, such as $CF_4$, $NF_3$, $SF_6$.

In operation 154, the epitaxial source/drain features 66*n*, 66*p* are recessed to form contact hole 93 for forming backside contacts, as shown in FIGS. 33A-33D. In some embodiments, the epitaxial source/drain feature 66*n*, 66*p* may be recessed by the same etch process used to remove backside contact alignment features 60*n*, 60*p* and the epitaxial buffer layers 62*n*, 62*p* in operation 152. In other embodiments, the epitaxial source/drain features 66*n*, 66*p* may be recessed by a suitable and different etch process.

Figure 33B:
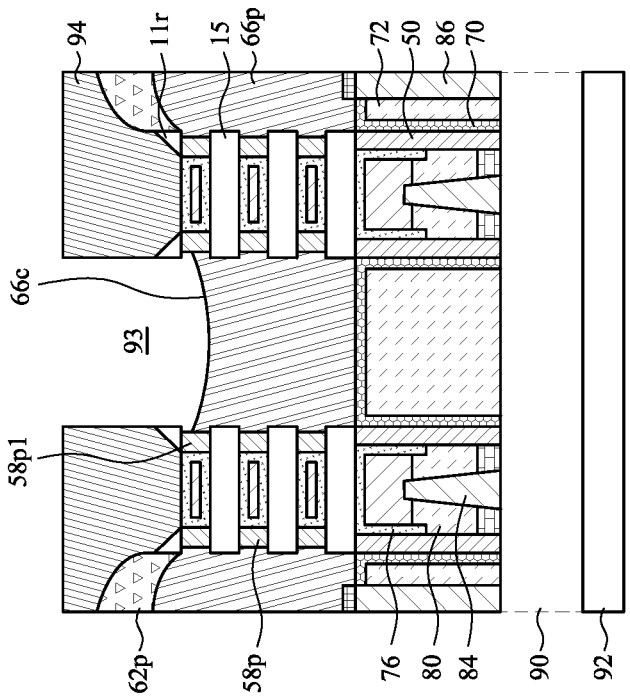
Figure 33A:
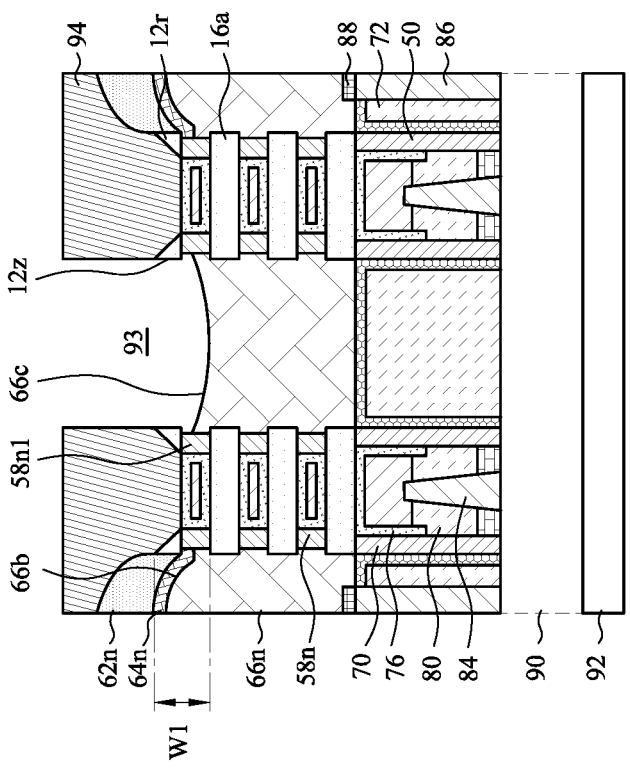

The objection of the recess process is to form a contact surface 66*c* is formed in the epitaxial source/drain feature 66*n*, 66*p* to establish electrical connection with a conductive feature to be formed. To establish a quality contact, it is desirable to have the contact surface 66*c* ends above a bottom nanosheet 16*a*, or in contact with a first inner spacer segment 58*n*1, 58*p*1 from the backside. Referring back to FIGS. 32A, 32B, in order to form the contact surface 66*c* in the desired locations, the recess process needs to end within a process window W1 along the z direction. In embodiments of the present disclosure, the back surface 66*b*, 66*b*' of the epitaxial source/drain features 66*n*, 66 are convex in shape, thus, resulting in increased the process window W1. The contact surface 66*c* may have various shapes, such as a planar profile, a concave profile, or a convex profile. In the embodiments of FIGS. 33A, 33B, the contact surface 66*c* is a concave in shape.

As shown in FIGS. 33A, 33B, after operation 154, the corners 12*r*, 11*r* are exposed to the contact holes 93. Particularly, the first surfaces 12*z* of the corner 12*r* is exposed to the contact hole 93. In some embodiments, the corners 12*r*, 11*r* may be partially or completely removed during operation 154.

Figure 34B:
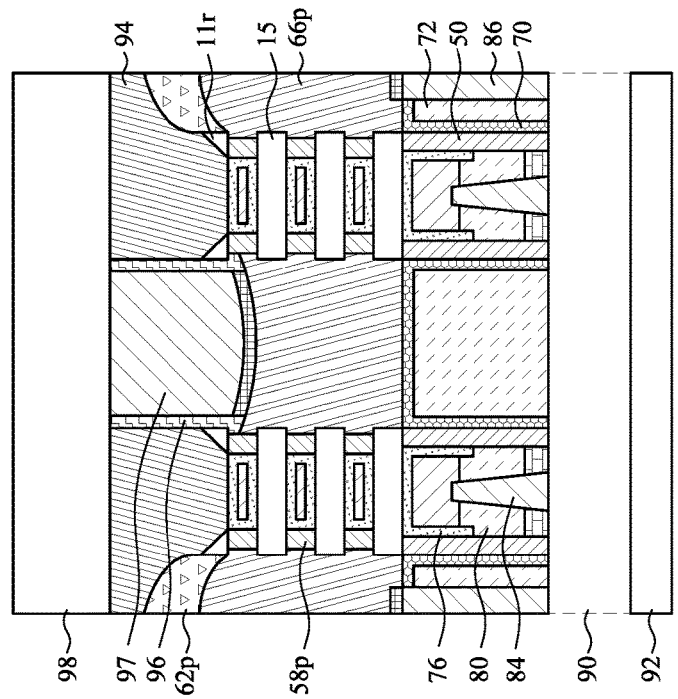
Figure 34A:
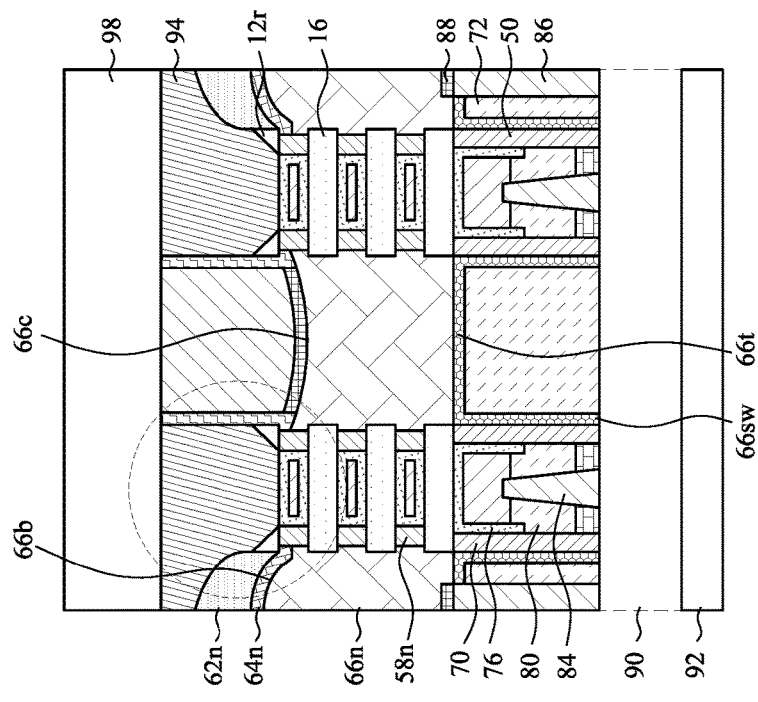
Figure 34F:
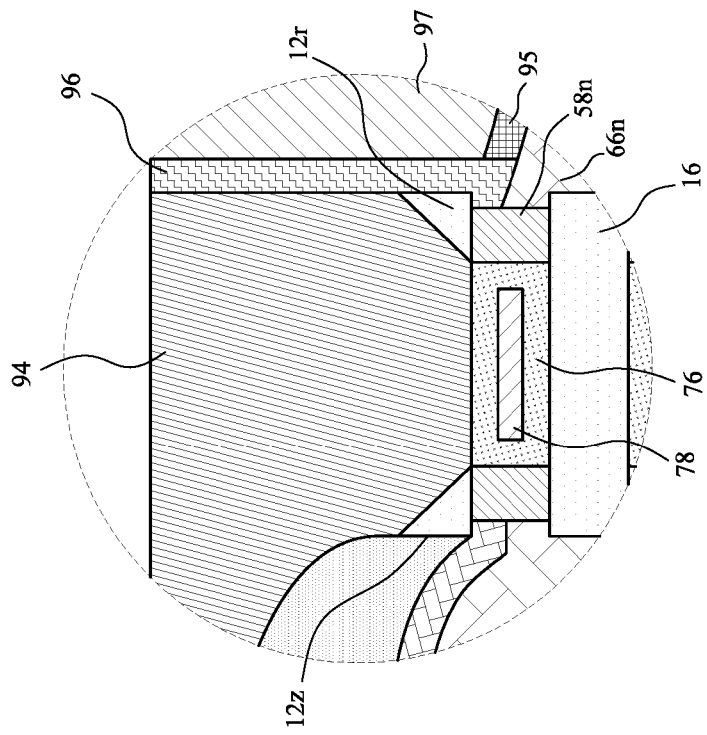
Figure 34E:
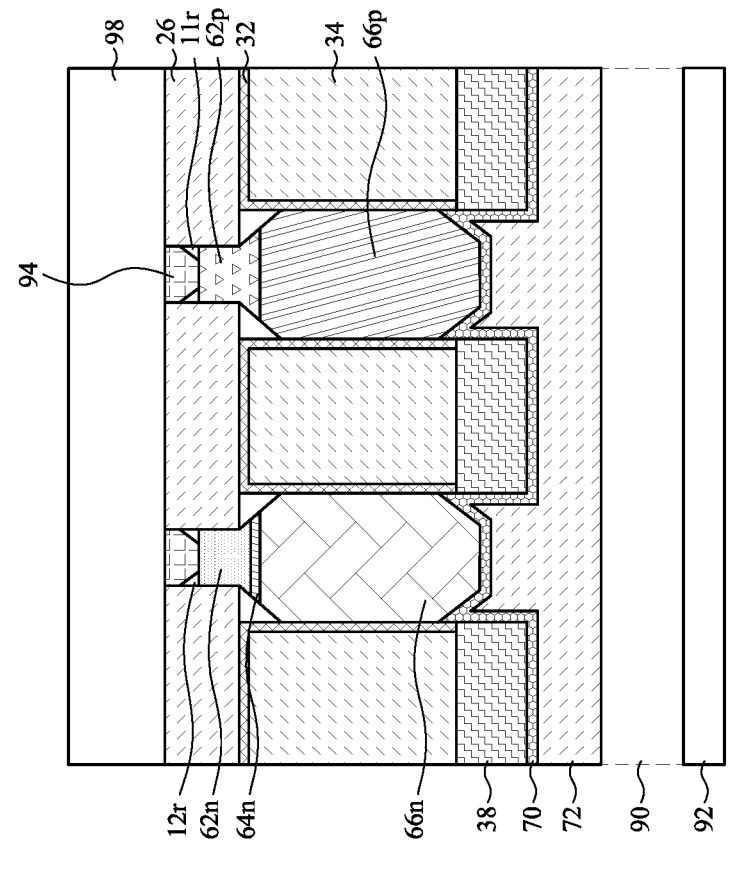

In operation 156, backside source/drain contacts 97 are formed in the contact holes 93, as shown in FIGS. 34A-34F. In some embodiments, an insolation liner 96 may be first formed on sidewalls of the contact holes 93. The insolation liner 96 may be formed by a conformation deposition followed by an anisotropic etch to remove the insolation liner from horizontal surfaces. As shown in FIG. 34F, the first surface 12*z* of the corner 12*r* is in contact with the insolation liner 96. The insolation liner 96 may include a dielectric material, such as silicon oxide or silicon nitride. The insolation liner 96 reduces source/drain leakage and A/C penalty in the device.

In some embodiments, a silicide layer 95 is formed on the contact surface 66*c* of the epitaxial source/drain features 66*n*, 66*p*. The silicide layer 95 may include one or more of WSi, CoSi, NiSi, TiSi, MoSi, and TaSi. In some embodiments, the silicide layer 95 has a thickness in a range between about 4 nm and 10 nm, for example between 5 nm and 6 nm.

After formation of the silicide layer 95, the backside source/drain contact 97 is formed by filling a conductive material over the silicide layer 95 in the contact hole 93. The conductive material may be one or more of Co, W, Mo, Ru, Al, or compounds thereof. In some embodiments, the conductive material is filled in the contact holes by CVD, ALD, electro-plating, or other suitable method. In some embodiments, a planarization process, such as CMP, may be performed after filling the contact holes to form the backside source/drain contacts 97.

In operation 158, a backside interconnect structure 98 is formed to provide connection to the backside source/drain contacts 97, as shown in FIGS. 34A-34F. In some embodiments, the backside source/drain contacts 96 are configured to connect the epitaxial source/drain feature 66*n*, 66*p* to power rails, such as a positive voltage rail (VDD) and a ground rail (GND) through the backside interconnect structure 98. In some embodiments, the backside interconnect structure 98 may include power rails or be part of a power rail.

Various embodiments or examples described herein offer multiple advantages over the state-of-art technology. According to embodiments of the present disclosure, during semiconductor material removal in a backside contact formation, corner portions of a semiconductor fin are kept on the device. The corner portions of the semiconductor fin protect source/drain regions from etchant. The corner portions allow the source/drain features to be formed with a convex profile on the backside. The convex profile increases volume of the source/drain features, thus, improving device performance. The convex profile also increases processing window of backside contact recess formation.

It will be understood that not all advantages have been necessarily discussed herein, no particular advantage is required for all embodiments or examples, and other embodiments or examples may offer different advantages.

Some embodiments of the present provide a semiconductor device. The semiconductor device includes a gate dielectric layer, a first source/drain feature, a first inner spacer formed between the gate dielectric layer and the first source/drain feature, a conductive feature in connection with the first source/drain feature, and a semiconductor feature, wherein the semiconductor feature has a substantially triangular cross section with a first surface along the conductive feature, a second surface connected to the first surface and in contact with the first inner spacer, and a third surface connecting the first surface and the second surface.

Some embodiments of the present disclosure provide a semiconductor device. The semiconductor device includes a first source/drain feature, wherein the first source/drain feature has a first surface, a second surface, and a sidewall connecting the first surface and second surface, and the second surface is a concave surface, a second source/drain feature, wherein the second source/drain feature has a first surface, a second surface, and a sidewall connecting the first surface and second surface, the second surface is a convex surface, and the first and second source/drain features comprise a n-type dopant at a first concentration, one or more semiconductor channels connecting to the sidewalls of the first and second source/drain features, a gate dielectric layer formed around each of the one or more semiconductor channels, a gate electrode layer formed over the gate dielectric layer, and a source/drain contact formed on the second surface of the first source/drain feature.

Some embodiments of the present disclosure provide a method for forming a semiconductor device. The method includes forming a semiconductor fin on a first side of a substrate, forming a sacrificial gate structure over the semiconductor fin, etching the semiconductor fin to form a first source/drain recess and a second source/drain recess, wherein the first and second source/drain recesses are on opposite sides of the sacrificial gate structure, further etching the semiconductor fin exposed in the first source/drain recess to form an alignment recess, forming a backside contact alignment feature in the alignment recess, forming first and second epitaxial features in the first and second source/drain recesses respectively, etching the semiconductor fin from a second side of the substrate, wherein the second side is opposite to the first side of the substrate, corner portions of the semiconductor fin remain after etching, and the corner portions of the semiconductor fin is in contact with the first and second epitaxial features, and depositing a dielectric material over the corner portions of the semiconductor fin.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method for forming a semiconductor device, comprising:
    forming a semiconductor fin on a first side of a substrate;
    forming a sacrificial gate structure over the semiconductor fin;
    etching the semiconductor fin to form a first source/drain recess and a second source/drain recess, wherein the first and second source/drain recesses are on opposite sides of the sacrificial gate structure;
    further etching the semiconductor fin exposed in the first source/drain recess to form an alignment recess;
    forming a backside contact alignment feature in the alignment recess;
    forming first and second epitaxial features in the first and second source/drain recesses respectively;
    etching the semiconductor fin from a second side of the substrate, wherein the second side is opposite to the first side of the substrate, corner portions of the semiconductor fin remain after etching, and the corner portions of the semiconductor fin is in contact with the first and second epitaxial features; and
    depositing a dielectric material over the corner portions of the semiconductor fin.

2. The method of claim 1, wherein the first and second epitaxial feature comprises SiGe.

3. The method of claim 2, further comprising forming first and second source/drain features over the first and second epitaxial features in the first and second source/drain recess respectively.

4. The method of claim 3, further comprising:
    removing the backside contact alignment feature to expose the first epitaxial feature;
    removing the first epitaxial feature to expose the first source/drain feature; and
    removing a portion of the first source/drain feature to form a concave surface on the first source/drain feature.

5. The method of claim 1, wherein etching the semiconductor fin from the second side includes:
    etching the semiconductor fin with a first etchant without exposing the first and second epitaxial features; and
    etching the semiconductor fin with a second etchant to expose the first and second epitaxial features.

6. The method of claim 3, wherein forming the first and second epitaxial features comprises forming the first and second epitaxial features with a convex top surface.

7. The method of claim 1, wherein forming backside contact alignment feature is performed by a bottom up deposition process.

8. The method of claim 7, wherein the backside contact alignment feature comprises a SiGe material having a germanium composition percentage between about 50% and 95%.

9. The method of claim 1, further comprising:
    prior to forming a semiconductor fin, forming a semiconductor stack over the substrate, wherein the semiconductor stack comprises two or more first semiconductor layers alternating with two or more second semiconductor layers.

10. The method of claim 9, further comprising:
    removing the two or more first semiconductor layers form the semiconductor fin; and forming a gate structure around the two or more second semiconductor layers.

11. A method for forming a semiconductor device, comprising:
forming a semiconductor fin on a substrate, wherein the semiconductor fin includes a well portion formed from the substrate, two or more first semiconductor layer, and two or more second semiconductor layers alternating the two or more first semiconductor layers;
etching back a portion of the semiconductor fin to form a source/drain recess;
forming first inner spacers on the two or more second semiconductor layers exposed to the source/drain recess;
forming a first source/drain feature in the source/drain recess;
removing the two or more second semiconductor layers;
depositing a gate dielectric layer on the two or more first semiconductor layers;
partially removing the well portion of the semiconductor fin to form a semiconductor feature in contact with the gate dielectric layer; and
forming a conductive feature in connection with the first source/drain feature, wherein the semiconductor feature has a substantially triangular cross section with a first surface along the conductive feature, a second surface connected to the first surface and in contact with the gate dielectric layer, and a third surface connecting the first surface and the second surface.

12. The method of claim 11,
wherein the second surface of the semiconductor feature is in contact with one of the first inner spacers.

13. The method of claim 12, further comprising depositing an insolation liner over the first surface of the semiconductor feature.

14. The method of claim 12, wherein the conductive feature is formed over a first surface of the first source/drain feature, and the first source/drain feature is a concave surface.

15. The method of claim 14, further comprising:
forming a second source/drain feature, wherein the two or more first semiconductor layers are in connection with the first and second source/drain features, and a first surface of the second source/drain feature is a convex surface.

16. The method of claim 12, further comprising:
forming a backside contact alignment feature in the source/drain recess prior to forming the first source/drain feature.

17. The method of claim 16, wherein partially removing the well portion of the semiconductor fin comprises:

etching the well portion with a first etchant without exposing the backside contact alignment feature; and
etching the well portion with a second etchant to expose the backside contact alignment feature.

18. A method, comprising:
processing from a front side of a substrate to form:
a first source/drain feature, wherein the first source/drain feature has a first surface, a second surface, and a sidewall connecting the first surface and second surface, and the second surface is a convex surface;
a second source/drain feature, wherein the second source/drain feature has a first surface, a second surface, and a sidewall connecting the first surface and second surface, the second surface is a convex surface, and the first and second source/drain features comprise a n-type dopant at a first concentration;
one or more semiconductor channels connecting to the sidewalls of the first and second source/drain features;
a gate dielectric layer formed around each of the one or more semiconductor channels; and
a gate electrode layer formed over the gate dielectric layer;
processing from a back side of the substrate to form:
a first semiconductor corner adjacent the second surface of the first source/drain feature;
a second semiconductor corner adjacent the second surface of the second source/drain feature, wherein the first and second semiconductor corners are formed by etching back the substrate from the back side of the substrate;
a dielectric fill material formed over the first and second semiconductor corners, and the gate dielectric layer; and
a source/drain contact formed on a concaved surface of the first source/drain feature, wherein the concaved surface is formed by etching back the second surface of the first source/drain feature.

19. The method of claim 18, further comprising:
forming a first inner spacer between the first source/drain feature and the gate dielectric layer, wherein the first semiconductor corner is in contact with the first inner spacer; and
forming a second inner spacer between the second source/drain feature and the gate dielectric layer, wherein the second semiconductor corner is in contact with the second inner spacer.

20. The method of claim 18, wherein the dielectric fill material contacts the first semiconductor corner at a [111] facet of a crystalline.

* * * * *